US006936484B2

(12) United States Patent
Kanechika et al.

(10) Patent No.: US 6,936,484 B2
(45) Date of Patent: Aug. 30, 2005

(54) METHOD OF MANUFACTURING SEMICONDUCTOR DEVICE AND SEMICONDUCTOR DEVICE

(75) Inventors: Masakazu Kanechika, Aichi (JP); Kenji Nakashima, Aichi (JP); Yasuichi Mitsushima, Aichi (JP); Tetsu Kachi, Aichi (JP)

(73) Assignee: Kabushiki Kaisha Toyota Chuo Kenkyusho, Aichi-gun (JP)

( * ) Notice: Subject to any disclaimer, the term of this patent is extended or adjusted under 35 U.S.C. 154(b) by 0 days.

(21) Appl. No.: 10/618,085

(22) Filed: Jul. 14, 2003

(65) Prior Publication Data

US 2004/0079962 A1 Apr. 29, 2004

Related U.S. Application Data

(62) Division of application No. 09/420,524, filed on Oct. 18, 1999, now abandoned.

(30) Foreign Application Priority Data

Oct. 16, 1998 (JP) ........................................ 10-313976
Mar. 31, 1999 (JP) ........................................ 11-092855
Jun. 18, 1999 (JP) ........................................ 11-172024
Aug. 30, 1999 (JP) ........................................ 11-242883

(51) Int. Cl.[7] ........................................ H01L 21/00

(52) U.S. Cl. .......................... 438/20; 438/713; 438/735

(58) Field of Search .......................... 438/20, 706, 713, 438/735, 738, 740

(56) References Cited

U.S. PATENT DOCUMENTS

| | | |
|---|---|---|
| 4,933,058 A | 6/1990 | Bache et al. |
| 4,968,585 A | 11/1990 | Albrecht et al. |

(Continued)

FOREIGN PATENT DOCUMENTS

| | | |
|---|---|---|
| JP | 63-051641 | 3/1988 |
| JP | 6-163481 | 6/1994 |
| JP | 7-118100 | 5/1995 |
| JP | 8-203863 | 8/1996 |
| JP | 8-250020 | 9/1996 |
| JP | 8-306752 | 11/1996 |
| JP | 9-232482 | 9/1997 |
| JP | 9-260312 | 10/1997 |
| JP | 10-188785 | 4/1998 |

OTHER PUBLICATIONS

Seigo Kanemaru, et al., "Fabrication of Metal–Oxide–Semiconductor Field–Effect–Transistor–Structured Silicon Field Emitters With A Polysilicon Dual Gate", Jpn. J. Appl. Phys., vol. 36, Part 1, No. 12B, Dec. 1997, pp. 7736–7740.

Yoshikazu Hori, et al., "New Sub–Micorn Size Si Field Emitter Arrays With Low Operation Voltage", technical Report of The Institute of Electronics Information and Communication Engineers, ED94–95, 1994–12, pp. 1–8, (w/English Abstract).

Hayakawa et al; "Mechanism of Residue Formation in Silicon Trench Etching Using a Bromine–Based Plasma," Jpn. J. Appl. Phys., vol. 37 (1998) pp. 5–9.

*Primary Examiner*—Tuan H. Nguyen
(74) *Attorney, Agent, or Firm*—Oblon, Spivak, McClelland, Maier & Neustadt, P.C.

(57) ABSTRACT

An impurity precipitation region is formed by introducing an impurity, e.g., oxygen, into a silicon substrate or a silicon layer and thermally treating it, and performing high selectivity anisotropic etching with the precipitation region used as a micro mask. Thus, a cone (conic body or truncated conic body having an annular leading end) having a very sharp and slender needle shape with an aspect ratio of about 10 and a diameter of about 10 nm to 30 nm in the vicinity of its leading end is obtained with the micro mask used as the top. By forming an insulation layer and a drive electrode such as a gate electrode around the cone, the cone can be used for a field emission device, a single electron transistor, a memory device, a high frequency switching device, a probe of a scanning type microscope or the like.

21 Claims, 51 Drawing Sheets

U.S. PATENT DOCUMENTS

| | | | | |
|---|---|---|---|---|
| 5,232,568 | A | | 8/1993 | Parent et al. |
| 5,295,305 | A | | 3/1994 | Hahn et al. |
| 5,367,165 | A | | 11/1994 | Toda et al. |
| 5,444,244 | A | | 8/1995 | Kirk et al. |
| 5,497,656 | A | | 3/1996 | Kado et al. |
| 5,587,588 | A | | 12/1996 | Kim |
| 5,614,663 | A | | 3/1997 | Itoh et al. |
| 5,780,318 | A | | 7/1998 | Hirano et al. |
| 5,844,251 | A | | 12/1998 | MacDonald et al. |
| 5,844,252 | A | * | 12/1998 | Shiomi et al. ................ 257/10 |
| 5,910,701 | A | | 6/1999 | Takemura |
| 5,967,873 | A | | 10/1999 | Rabinowitz |
| 5,992,268 | A | | 11/1999 | Decker et al. |
| 6,036,566 | A | | 3/2000 | Baldi et al. |
| 6,066,265 | A | | 5/2000 | Galvin et al. |
| 6,069,018 | A | * | 5/2000 | Song et al. ................... 438/20 |
| 6,130,106 | A | * | 10/2000 | Zimlich ....................... 438/20 |
| 6,132,942 | A | | 10/2000 | Woodworth et al. |
| 6,201,401 | B1 | | 3/2001 | Hellemans et al. |
| 6,227,519 | B1 | | 5/2001 | Yagi et al. |
| 6,270,950 | B1 | | 8/2001 | Bourdelais et al. |
| 6,285,811 | B1 | | 9/2001 | Aggarwal et al. |
| 6,328,902 | B1 | | 12/2001 | Hantschel et al. |
| 6,333,598 | B1 | | 12/2001 | Hsu et al. |
| 6,417,016 | B1 | * | 7/2002 | Gilton et al. ................. 438/20 |

* cited by examiner

Point Curvature: Large
Aspect Ratio: Small (≒1)

Point Curvature: Little Small
Aspect Ratio: Small (≒4.5)

Point Curvature: Little Small
Aspect Ratio: Small (≒1)

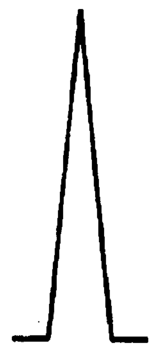
Point Curvature: Small (Several nm)
Aspect Ratio: Large (≒10)
FIG. 1D PRESENT INVENTION
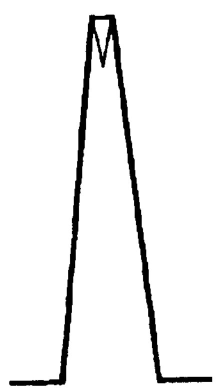
Point Curvature: Small (Several nm)
Aspect Ratio: Large (≒10)
FIG. 1E PRESENT INVENTION FIG. 3A
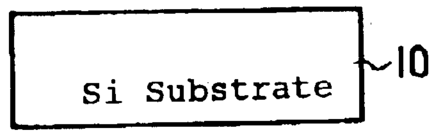
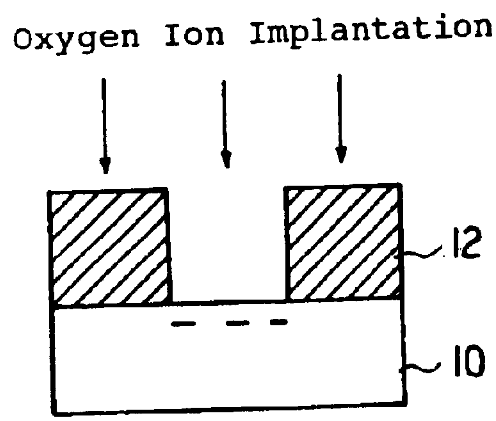
FIG. 3B
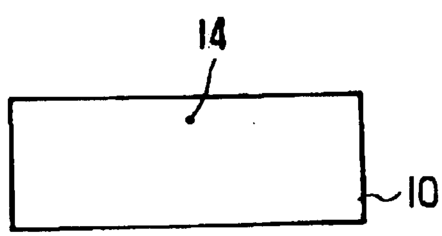
FIG. 3C
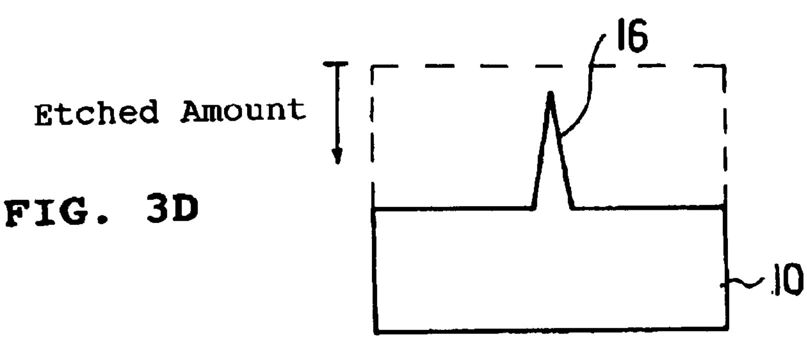
FIG. 3D

TO FIG.4B

FROM FIG.4A

B Implantation Amount:
$7 \times 10^{13} cm^{-2}$

100μm

B Implantation Amount:
$1 \times 10^{14} cm^{-2}$

100μm

Black dots
are silicon needle conic bodies.

METHOD OF MANUFACTURING SEMICONDUCTOR DEVICE AND SEMICONDUCTOR DEVICE

This application is a division of application Ser. No. 09/420,524 filed on Oct. 18, 1999, abandoned.

BACKGROUND OF THE INVENTION

The present invention relates to a semiconductor device and method of manufacture, particularly to a minute conic (circular, elliptical, poly-hedral) body having a high aspect ratio, and especially to a conic body which can be used in an FED (field emission display or device), a quantum effect device, a memory device, a high frequency device, a probe of scanning type microscope, and the like.

DESCRIPTION OF THE RELATED ART

Forming a minute projection on the order of μm on a semiconductor substrate so that the projection may be used for an electron emission source or the like is a known art. Known methods of forming such a minute projection including the method of forming it a cone as shown in FIG. 1A by performing wet etching of a specific crystal plane of a silicon substrate. In "Low voltage silicon minute structure electron source" (Kazuyoshi Hori, et al., Shingaku Giho, ED94–95, p 1–6), the authors disclose a method of producing a tower-shaped projection as shown in FIG. 1B. To produce the tower-shaped projection shown in FIG. 1B, a mask formed on a silicon substrate by photolithography is used to perform anisotropic dry etching of the silicon substrate to form a pillar-shaped structure. Then, the obtained pillar-shaped structure is subjected to anisotropic wet etching to shape the leading end of the pillar-shaped structure into a conic shape.

It is disclosed in "Fabrication of Metal-Oxide-Semiconductor Field-Effect-Transistor-Structured Silicon Field Emitters with a Polysilicon Dual Gate" (Jpn. J. Appl. Phys. Vol. 36 (1997) pp. 7736–7740) and other publications that a projection as shown in FIG. 1C can be formed on a silicon substrate by forming a mask on the silicon substrate by photolithography and performing isotropic dry etching of the substrate through the mask.

When the aforesaid minute projection is to be applied to, for example, an electron emission source or the like of a particular device, it is usually desirable that the projection have a small radius of curvature at its leading end and a large aspect ratio in order to obtain the best performance of the device. This is true because a large radius of curvature at the leading end provides a high electron emission resistance and a large parasitic capacitance with a driving electrode at a gate or the like, making a low voltage operation difficult. When the aspect ratio of the projection is small even if the radius of curvature at the projection point only is small, the projection bottom area increases, the integration as the semiconductor device cannot be improved, and the aforesaid parasitic capacitance is increased. Therefore, a projection with a large aspect ratio is desired.

The projections shown in FIG. 1A and FIG. 1C have a diameter of 100 nm to 300 nm at their leading ends, a base angle of about 30°, and an aspect ratio of about 1. It has been described in the aforesaid publication that the projection of FIG. 1B can have a radius of curvature of not more than 5 nm at the leading end of the projection but occupies a bottom area of substantially the same level as the bottom area of the projection shown in FIG. 1A because the base angle of the projection is about 30° as shown in FIG. 1B.

Accordingly, a projection having a sharp point, a small bottom area, and a high aspect ratio can not be formed by any conventional manufacturing methods.

SUMMARY OF THE INVENTION

It is an object of the present invention to provide a sharp conic (circular, elliptical, or poly-hedral) body on a semiconductor and a manufacturing method suitable for forming such a conic body.

It is also an object of the invention to provide a semiconductor device using the conic body.

In order to achieve the aforesaid objects, the method for manufacturing the semiconductor device of the present invention forms a conic body having the micro mask portion at the top on the etching exposed surface of the semiconducting material substrate or the semiconducting material layer by forming an impurity precipitation area by introducing impurities into a predetermined position of a semiconducting material substrate or a semiconducting material layer and performing anisotropic etching under the condition of high selectivity (hereinafter referred to as "high selectivity anisotropic etching" for brevity) of the semiconducting material substrate or the semiconducting material layer with the impurity precipitation area used as a micro mask.

According to another feature of the present invention in the method for manufacturing the semiconductor device, the precipitation area has an etching rate different from a main component material of the material substrate or the material layer and is formed by thermally treating the impurities introduced into the predetermined position of the material substrate or the material layer to precipitate in the crystal of the material substrate or the material layer.

In the semiconductor device according to the present invention, the conic body which was formed by the high selectivity anisotropic etching of the material substrate or the material layer with the impurity precipitation area, which was formed in the predetermined position of the semiconducting material substrate or the semiconducting material layer, used as the micro mask has the impurity precipitation area as the top, a radius of curvature of several nm to ten or more nm in the vicinity of the leading end or a diameter of about 10 nm to 30 nm near the leading end, and an aspect ratio of about 10 or more.

The minute conic body according to the present invention is formed based on the following principle. FIG. 2 shows a principle of forming the conic body. For example, oxygen is introduced as impurities into a semiconducting material substrate (e.g., a silicon substrate hereinbelow). "Impurities" as used in the present invention refers to any element other than the main component of the material substrate or the material layer. When the main component comprises a plurality of elements, only a portion of such elements are the impurities of the present invention.

When the silicon substrate having the oxygen introduced therein is thermally treated, an oxygen precipitation area (namely, an oxygen precipitation defect $SiO_2$) is formed as an impurity precipitation area in the area where oxygen has been introduced (see FIG. 2(*a*) to FIG. 2(*b*)). After the thermal treatment, when an anisotropic etching is applied to the silicon substrate under conditions with a high selectivity to $SiO_2$, an oxygen precipitate which has an etching rate different from Si crystal (not easily etched as compared with the Si crystal) becomes a micro mask, and an Si conic body is formed on the etching exposure surface with this mask used as the top (FIG. 2(*c*)).

For example, when the oxygen precipitation area in the silicon substrate or the silicon film is used as the micro mask, the anisotropic etching can be performed by dry etching (e.g., reactive ion etching) with gas containing halogen-based (Br, Cl, F) gas. By etching under these conditions, conic bodies with the oxygen precipitation area used as the top can be obtained as shown in FIG. 2(*d*).

The conic body according to the present invention obtained on the aforesaid principle is a very thin needle like conic body which has a radius of curvature of several nm to ten or more nm in the vicinity of its top and an aspect ratio of about 10 as shown in FIG. 1D. Also, its base angle can be made very large such as about 80° or more. The conic body can also be made to have a height of about several $\mu$m.

According to the present invention, the aspect ratio of the conic body can be 10 or more by controlling, for example, a mixing ratio of the mixture gas used for the anisotropic etching. It is to be understood that the aspect ratio can be controlled to less than 10 as required.

As described above, the present invention makes possible the formation of a very sharp and thin conic body. This conic body is formed with the micro mask used as the top by forming the precipitation area, which is to be the micro mask, in the substrate and performing the anisotropic etching. Therefore, a conic body smaller than the limit of exposure resolution of photolithography or the like can also be formed with ease.

Where the conic body of the invention described above is used for various types of semiconductor devices, parasitic capacitance between the leading end of the cone and a predetermined driving electrode or the like can be decreased, and when the conic body is used for a high-frequency switching device or the like, the speed of switching can be made faster. Because the conic body of the present invention has a large aspect ratio in addition to the thin leading end and can be made to have very small bottom surface, much more conic bodies can be formed in a unit area, which is very advantageous for the high integration of the device. Furthermore, the electron is readily discharged from the leading end of the conic body because the leading end of the conic body is very thin, and when the conic body is used as an electron emission element, a driving voltage can be lowered.

According to another aspect of the present invention, a semiconductor device has a frustum formed by performing the high selectivity anisotropic etching of a semiconducting material substrate or a semiconducting material layer with an impurity precipitation area, which is formed in a predetermined position of the material substrate or the material layer, used as a micro mask, and the frustum is formed with the impurity precipitation area used as the top and has a conic shape which has a radius of curvature of several nm to ten or more nm in the vicinity of the leading end or a diameter of about several nm to 30 nm in the vicinity of the leading end, and an aspect ratio of about 10 or more. The leading end of the frustum also has its center partly removed to have an annular shape.

Thus, the minute frustum according to the present invention is formed on the same principle as the aforesaid description made with reference to FIG. 2. In this aspect, the point of the frustum also has an annular shape as shown in FIG. 1E. Specifically, the frustum is removed from the upper surface toward the bottom in the shape of a mortar (or, a reverse-conic shape) to form an annular shape at the leading end of the frustum depending on a difference between the outside diameter of the leading end of the frustum and a diameter of the mortar-shaped portion so to have a very small effective area at the leading end. The inside diameter of the annular shape is formed to have a difference of, for example, 2 nm to 4 nm from the outside diameter of the leading end of the frustum, namely about several nm to about 30 nm of the outside diameter of the ring shape, and the annular shape has a width of about 1 nm to about 2 nm for example.

According to the present invention, a frustum having the aforesaid annular shape at the leading end can be manufactured by the following method, for example. In one method, impurities are introduced into a given position of a semiconducting material substrate or a semiconducting material layer to form the impurity precipitation area, and high selectivity anisotropic etching is performed on the semiconducting material substrate or the semiconducting material layer with the impurity precipitation area used as a micro mask to form a frustum with the micro mask used as the top on the etching exposure surface of the semiconducting material substrate or the semiconducting material layer. After forming the frustum, the upper surface of the frustum is exposed by etching, and the top part of the frustum is etched from the upper surface toward the bottom of the frustum in the shape of a mortar by performing the high selectivity anisotropic etching, thereby forming the frustum having the annular shape at the leading end.

The formation of the mortar shape at the upper surface of the frustum results from the presence of a sidewall protective film which is formed on the sidewall of the conic body when the frustum is formed by etching the substrate or the like by using the micro mask.

Specifically, when the micro mask is removed by further etching after forming the frustum with the micro mask used as the top to expose the upper surface of the frustum, the outside diameter part on the upper surface of the frustum is covered with the sidewall protective film. Therefore, the outside diameter part of the upper surface is not etched even if the etching is continued, and the etching advances with priority from the center on the upper surface of the frustum. As a result, the center of the upper surface of the frustum is automatically etched to form a hole to have a mortar shape or a reverse-conic shape. The mortar-shaped portion formed from the upper surface of the frustum on the aforesaid principle has an aspect ratio of about 10 or more which is a ratio of a depth to its outside diameter (inside diameter of the ring), and the ring at the top of the frustum is very narrow because the mortar-shaped portion having a very sharp shape is formed at the upper surface of the frustum.

The aspect ratio of the frustum and the mortar-shaped portion formed by etching can be 10 or more by controlling, for example, a mixing ratio of the mixture gas used for the anisotropic etching. However, it is also possible to control the aspect ration to less than 10 when necessary.

As described above, an extremely sharp, thin frustum having a ring-shaped leading end and a very small area at the top can be formed by applying the semiconductor device or the manufacturing method of the present invention.

By forming the precipitation area, which becomes a micro mask, in the substrate or the like and performing the anisotropic etching, the frustum is formed with the micro mask used as the top, and its leading end can be formed to have a ring shape by over etching. Thus, the frustum smaller in size than the limit of the exposure resolution of the photolithography or the like can be manufactured with ease.

When the frustum according to the present invention is used for various semiconductor device elements, the parasitic capacitance between a leading end of a cone and a given driving electrode or the like can be reduced, and when it is used for a switching device or the like, switching can be made faster. The frustum of the present invention has a small effective area at the leading end and a large aspect ratio so that a truncated cone can be formed to have a very small bottom. Therefore, it is very advantageous for the integration of the element. In addition, when the electron is to be emitted from the leading end of the cone, the discharge of the electron and the quantum wire effect of a quantum wire are easy to occur because the leading end of the cone is very thin.

When the conic body and the frustum having the ring shape at the leading end according to the present invention described above have the same etching condition, the base angles of a plurality of cones and frustums which are obtained with a plurality of impurity precipitation areas respectively as micro masks are constant on the same substrate, and the individual cones and frustums have a similar shape. For example, when the impurity precipitation area is formed so that the impurity precipitation area is positioned on a desired plane at a desired depth, a plurality of sharp conic bodies and frustums of the same shape and size can be formed in predetermined positions on the semiconducting material substrate or the semiconducting material layer.

The leading end of the frustum is formed to have a mortar shape by additionally etching the upper surface of the frustum exposed by removing the micro mask, and this mortar-shaped portion also has substantially a constant base angle and a similar shape among the individual frustums.

The base angles of the conic body, frustum and the mortar-shaped portion of the frustum can typically have a very steep shape of about 80° or more for example.

In addition, to form the aforesaid conic body and frustum of the present invention, there can be applied a method of introducing a predetermined amount of oxygen into the silicon material substrate or layer and also introducing boron ion or the like which is easy to bond with oxygen than with silicon, so that the micro mask can be formed with greater reliability.

It is an object of another aspect of the present invention to provide a novel single electron transistor which can be formed easily by a silicon process, and the aforesaid conic body and frustum are used for the single electron transistor. Specifically, a silicon needle conic body formed to protrude on a substrate is used in a single electronic semiconductor which controls the propagation of a single or a small number of electrons so to use this conic body as an electronic propagation route, namely at least a part of the electronic propagation route which causes a coulomb blockade. Specifically, the silicon needle conic body is functioned as a quantum dot or functioned as the quantum dot and a minute tunnel to develop a single electronic effect.

The silicon needle conic body is a conic body having a radius of curvature of several nm to ten or more nm in the neighborhood of its top and a very small leading end to develop the single electronic effect. Because it is formed of a silicon crystal, it can be provided with any conductivity by an ordinary method.

In the present invention, the single electronic semiconductor device has a source area and a drain area closely arranged with the silicon needle conic body therebetween on the side of the silicon needle conic body, uses the silicon needle conic body as a quantum dot, uses the spaces between the silicon needle conic body and the source area and between the silicon needle conic body and the drain area as small tunnel junctions to control the propagation of a single or a small number of electrons between the source area and the drain area. Moreover, the space between the silicon needle conic bodies functions as a small tunnel junction when a plurality of silicon needle conic bodies are formed between the source area and the drain area.

The silicon needle conic body of the present invention has a very thin leading end and functions readily as the quantum dot. Therefore, the single electronic semiconductor device, which has the silicon needle conic body as the quantum dot and uses as the small tunnel junction the space between the silicon needle conic body and the source area, the space between the silicon needle conic body and the drain area and the space between the conic bodies when the conic bodies are formed in the multiple number, can be realized with ease. Here, when the gate electrode is used to apply a voltage to between the source area and the drain area by a voltage for potential control (for example, gate electrode), the coulomb blockade of a single or a small number of electrons can be controlled between the source area and the drain area.

According to another feature of the present invention, the silicon needle conic body has a potential control electrode for controlling the potential in the conic body along its sidewall, and the propagation of a single or a few electrons is controlled between the vicinity of the bottom and the vicinity of the top of the silicon needle conic body by the potential control by means of the potential control electrode. In other words, the propagation of the single electron between the bottom and the leading end of the silicon needle conic body is controlled by the potential control electrode.

The vicinity of the top of the silicon needle conic body can be made to have a radius of several nm as described above, so that it functions as the quantum wire. Therefore, the single electron effect can be developed by selectively controlling the applied voltage to the vicinity of the leading end by the potential control electrode.

The single electron semiconductor device according to the present invention can also be configured to have a potential control electrode for controlling the potential in the silicon needle conic body along the sidewall of the silicon needle conic body, to make the potential control by means of the potential control electrode to deplete the vicinity of the sidewall of the silicon needle conic body so to form a quantum wire region at the core of the silicon needle conic body.

Still another feature of the single electron semiconductor device according to the present invention is to dispose the silicon needle conic body in a conducting material layer to disturb the movement of the electron in the conducting material layer by its presence or the electric field effect. The silicon needle conic body can be formed by using the micro mask which is formed by doping and precipitating the impurity in the silicon crystal, so that the number of the conic bodies in a unit area can be controlled by controlling the amount of impurities to be doped. Since a density of forming the conic bodies can be increased to a sufficiently high level by controlling the concentration of the impurities to a high level, the individual conic bodies or the conic body and the end portion of the conducting material layer can be disposed closely to each other, and the space between the conic bodies or between the conic body and the end portion of the conducting material layer can be made narrow to a level enough to provide the quantum wire effect. Therefore, the quantum dot and the small tunnel junction can be formed around the silicon needle conic body, and the coulomb blockade and tunneling of the electron in the pertinent region can be controlled.

For example, the single electron semiconductor device of the present invention is a single electron semiconductor device which controls the propagation of a single or a small number of electrons and has the silicon needle conic body formed to protrude on the substrate and the conducting material layer which is formed on the substrate so to bury at least the lower area of the silicon needle conic body. And, the periphery area of the silicon needle conic body of the conducting material layer is functioned as the quantum dot and small tunnel junction so to control the propagation of a single or a small number of electrons in the plane direction of the conducting material layer.

According to the present invention, the silicon needle conic bodies are formed in a plurality of numbers to be closely aligned in the breadth direction of the conducting material layer, so that the conducting material layer in a region intervened between two neighboring silicon needle conic bodies functions as the quantum dot and the minute channel.

Another feature of the present invention relates to the fact that, in the single electronic semiconductor device, the silicon needle conic bodies are formed in a plurality of numbers so to be closely aligned in a direction along the edge of the conducting material layer. Therefore, the conducting material layer in the region between the two neighboring silicon needle conic bodies functions as the quantum dot, and the conducting material layer in the area intervened between the aligned plurality of silicon needle conic bodies and the edge of the conducting material layer functions as a small tunnel junction.

Still another feature of the present invention is that, in the single electronic semiconductor device, the silicon needle conic bodies are formed in a plurality of numbers to be closely aligned in a direction along the edge of the conducting material layer, a depletion layer is formed in the conducting material layer in a surrounding region with the silicon needle conic body at the center, and the quantum dot and the small tunnel junction are formed in the region between the depletion layer end in the conducting material layer and the edge of the conducting material layer.

In the aforesaid invention about the single electron transistor, the silicon needle conic body formed to protrude on the substrate can be obtained on the same principle as the description made with reference to FIG. 2, for example.

According to another aspect of the present invention, as the silicon needle conic body used for the aforesaid single electron transistor, a needle frustum which has its top surface removed to form a mortar shape (or the shape of a reverse-conic body shape) toward the bottom so to have an annular leading end can also be used. The leading end is made to have an annular shape, namely an annular portion corresponding to a difference between the outer diameter of the leading end of the frustum and the diameter of the mortar-shaped portion is formed, and the effective area of the leading end is made very small. The inside diameter of the ring with respect to the outside diameter of the leading end of the frustum, namely the outer diameter of about several nm to 30 nm of the annular portion, can be configured to have a difference of 2 nm to 4 nm from the outside diameter, and the ring may have a width of about 1 nm to 2 nm, for example. Thus, when the ring having a very narrow width is formed on the leading end, the formation of quantum wire at the leading end can be made more secure and simple, and the single electronic effect can be developed more easily.

The single electron semiconductor device according to the present invention which can be obtained as described above is a very thin needle conic body which has a radius of curvature of several nm to ten or more nm at the leading end, and an aspect ratio of about 10, and the silicon needle cone which can have a base angle of about 80° or more and a height of about several μm is used for a propagation route of a single or a small number of electrons. Also, various structures can be produced by using the silicon process. For example, the silicon needle conic body is used as the quantum dot or as the quantum dot and the small tunnel junction, and the conducting material layer is formed to bury the silicon needle conic body so to have the quantum dot and the small tunnel junction in the conducting material layer around the silicon needle conic body.

Also, these silicon needle conic bodies can be formed by, for example, introducing impurities into single-crystal silicon to precipitate and performing high selectivity anisotropic etching with the precipitate used as the micro mask. Therefore, the single electron semiconductor device can be manufactured by the silicon process, and LSI which has low power consumption and can be integrated highly can be achieved so to be useful for information equipment, personal portable equipment and the like. The operating time of battery-powered equipment can thereby be extended.

According to another aspect of the present invention, the silicon crystal needle of the aforesaid conic body is used for a semiconductor memory as described below. The object is to highly integrate the memory by greatly reducing a capacitor area in each memory unit of the memory and to make it possible to achieve DRAM of G-bit class. Also, according to this aspect of the present invention, a three-dimensional structure of the good silicon crystal needle is effectively used to achieve the aforesaid object.

In order to achieve the aforesaid object, the aspect of this invention relates to a semiconductor memory which stores information by accumulating electric charge in a capacitor configuring each memory unit, in which the silicon crystal needle is formed in each memory unit, and the capacitor is formed with the side face of the needle used as one electrode.

According to the present invention, because the capacitor is formed on the side face of the silicon crystal needle, the capacitor electrode area is large, even if the needle has a small area when seen from above. Therefore, the capacity of the capacitor can be secured even if an occupied area is made small, and the electric signal can be secured sufficiently. The memory can be integrated by using this structure.

The aforesaid silicon crystal needle has an appropriate size, such as a diameter of about several nm at the leading end and a height of about 5 to 10 μm. This needle functions as one electrode of the capacitor. Another capacitor electrode (outside electrode) is formed around the needle through a film such as an oxide film. The other electrode is formed of for example polysilicon having conductivity. By configuring as described above, a sufficiently large capacitor capacity, for example, the capacity of about 18 fF, is secured as compared with the wiring capacity.

The aforesaid silicon crystal needle is a conic structure preferably formed with a micro mask as the top by performing high selectivity anisotropic etching of the silicon substrate or the silicon layer with the impurity precipitation region formed in the silicon substrate or the silicon layer used as the micro mask. Thus, a silicon needle suitable for realizing the required capacitor capacity is obtained.

According to another aspect of the present invention, a switching transistor for supplying the capacitor with electric charges is formed in part of the silicon crystal needle. The switching transistor may be formed at the base (bottom, base end or root) of the silicon crystal needle. And, the switching transistor may be formed at the leading end of the silicon crystal needle. Thus, the memory can be further integrated by this embodiment.

In addition, by disposing the switching transistor at the leading end of the silicon crystal needle, the single electron transistor function with the needle end portion as the quantum dot is obtained, and power consumption can be lowered.

Another aspect of the present invention relates to a method for manufacturing a semiconductor memory. This manufacturing method includes a step of forming a silicon crystal needle and a step of forming a capacitor on the side face of the silicon crystal needle. In addition, it includes a step of forming a switching transistor for supplying the capacitor with electric charge on the silicon crystal needle or in its vicinity.

As described above, the present invention can secure a large capacitor capacity in a small area because the silicon crystal needle is formed on a memory cell and the capacitor on the side face of the needle. Besides, the occupied area on the memory cell can be decreased substantially by forming the switching transistor on the needle. The needle having an appropriate shape and structure is obtained by the anisotropic etching method using the aforesaid micro mask. Thus, the semiconductor memory can be integrated highly, and DRAM of G-bit class can be realized.

Although the above description related mainly to DRAMs, it should be understood that the present invention can also be applied to a semiconductor memory using a capacitor other than DRAM.

BRIEF DESCRIPTION OF THE DRAWINGS

FIG. 1D shows a conic body obtained by the present invention;

FIG. 1E shows a frustum having a mortar shape at its leading end obtained by the present invention;

FIGS. 3A, 3B, 3C and 3D illustrate a method of manufacturing a cone according to the present invention;

DESCRIPTION OF THE PREFERRED EMBODIMENTS

Figure 1A:
FIGS. 1A, 1B and 1C show conventional projections.
Figure 1B:
Figure 1C:

Preferred embodiments of the present invention will be described with reference to the accompanying drawings.

Embodiment 1

The conic body of the present invention can be formed by forming an impurity precipitation region in a specific region of a semiconducting material substrate or a predetermined semiconducting material layer and performing high selectivity anisotropic etching with the impurity precipitation region used as a micro mask. Thus, the conic body is formed on the surface exposed by etching with the micro mask used as the top. The conic body in the following embodiment is a cone as an example, and the conic body in the following description will be illustrated with reference to a cone. However, the conic body herein referred to is not limited to a cone, but intended to include every kind of pyramid.

FIGS. 3A, 3B, 3C and 3D show an example of a method for manufacturing the aforesaid conic body. The following description will be made with reference to a case that a silicon substrate is used as the semiconducting material substrate, and oxygen is introduced as impurities into the silicon substrate to form an oxygen precipitation area (precipitation defect).

When the used silicon substrate 10 contains oxygen in a high concentration, the oxygen is precipitated to form the micro mask. Therefore, this embodiment uses a substrate having a low oxygen concentration (e.g., oxygen concentration of $10^{10}/cm^3$).

After cleaning the silicon substrate 10 having a low oxygen concentration (FIG. 3A), a resist pattern is formed on the surface of the silicon substrate 10 by photolithography, and oxygen ion is implanted as impurities in an opening of a resist 12 to a predetermined depth of the substrate 10 (FIG. 3B).

After implanting the oxygen ion, the resist 12 is removed, and the substrate 10 is thermally treated under predetermined conditions (e.g., a temperature range of 600° C. to 1100° C., and an oxidizing atmosphere or a non-oxidizing atmosphere). Thus, an oxygen precipitation defect ($SiO_2$), namely an oxygen precipitation region 14, is formed to a predetermined depth of the opening of the resist 12 (FIG. 3C).

When thermally treated in an oxidizing atmosphere, $SiO_2$ film is formed on the thermally treated substrate 10, and when thermally treated in a non-oxidizing atmosphere, an oxide film is also formed on its surface. And the presence of the oxide film serves as a mask and disturbs the anisotropic etching. Therefore, the oxide film is removed first. Then, the high selectivity anisotropic etching, e.g., RIE (reactive ion etching), is performed. The anisotropic etching to a predetermined depth forms a cone 16 having a height corresponding to an amount of etching with the oxygen precipitation region 14 used as a top as shown in FIG. 3D.

When the anisotropic etching is performed, etching gas is supplied from a separate gas-supplying device into an etching device. However, when etching is performed by using a common magnetron RIE device, halogen-based mixture gas (e.g., $HBr/NF_3/He+O_2$ mixture gas) is suitably used as the etching gas against the oxygen precipitate in the silicon substrate. The halogen-based etching gas has its etching selectivity increased in order of F, Cl and Br with respect to the oxygen precipitation region (precipitation defect) in the silicon. Therefore, when the cone is securely formed by the anisotropic etching, Br-based gas is most preferable, and order of Cl and F follows it. It is considered that the RIE causes to adhere a protective film consisting of a reaction product to the sidewall of the cone so to contribute to the retention of the conic shape. This protective film can be removed by immersing the substrate 10 in, for example, dilute hydrofluoric acid, after the anisotropic etching. This step of removing the sidewall protective film is not essential and may be omitted.

The cone formed on the silicon substrate as described above has, for example, an aspect ratio of about 10 or more. It is a sharp cone with a high aspect ratio having a diameter of 10 nm to 30 nm at the leading end (a radius of curvature of several nm to ten or more nm), a base angle of 80° or more, e.g., 85°, and a height of several μm. And, its diameter near the bottom is very small, e.g., about 0.5 μm.

Figure 4A:
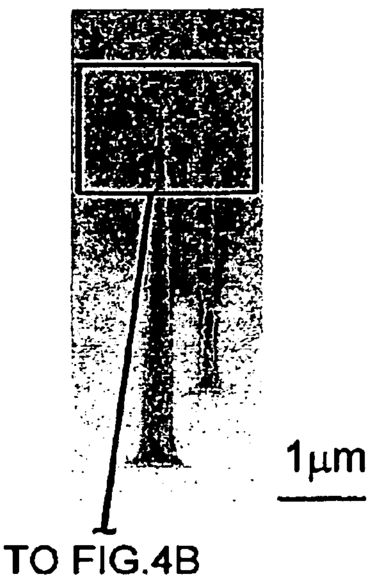
FIG. 4 is a microscope photograph of a cone obtained by high selection anisotropic etching according to the present invention.
Figure 4B:
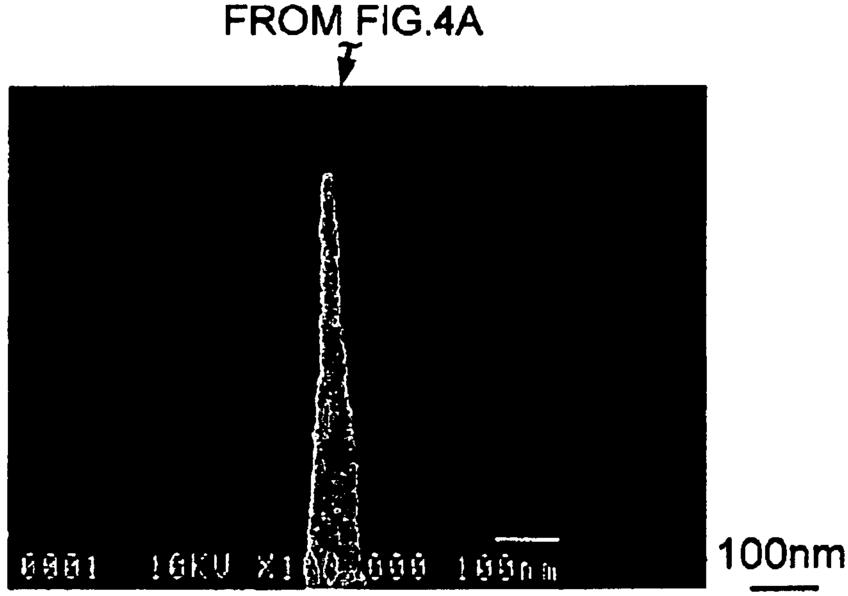

FIG. 4 is SEM photographs of a cone obtained by anisotropic etching with the oxygen precipitation region formed on the silicon substrate used as the micro mask. The cone of FIG. 4 was specifically formed under the following conditions. First, the silicon substrate was a CZ substrate having an oxygen concentration of $1.6\times10^{18}$ $cm^{-3}$, and thermally treated in an oxygen atmosphere at 1000° C. for 220 minutes to form the oxygen precipitation region ($SiO_2$) to be used as the micro mask in the CZ substrate. The silicon substrate was also subjected to the high selectivity anisotropic etching with $HBr/NF_3/He+O_2$ mixture gas by an ordinary magnetron RIE device. A plurality of cones are formed on the substrate with the micro mask as the top. One of these is shown in (*a*) of FIG. 4. It can be seen from the drawing that the cone has a base angle of about 85° and an aspect ratio (a ratio of its bottom diameter to its height) of 10 or more. And, (*b*) of FIG. 4 is a photograph showing an enlarged leading end of the cone of (*a*). It is seen from the photograph that the leading end of the cone has a radius of curvature of about ten or more nm.

It is also apparent from FIG. 4 that a cone having a small curvature at the leading end and a large aspect ratio, which cannot be realized by a conventionally proposed method, can be formed by performing the anisotropic etching with the oxygen precipitation region used as the micro mask.

Cone Forming Conditions

Conditions under which a cone such as the aforesaid cone 16 can be formed will be described in the following.

(i) Control of Micro Mask Forming Density and Size

Figure 5:
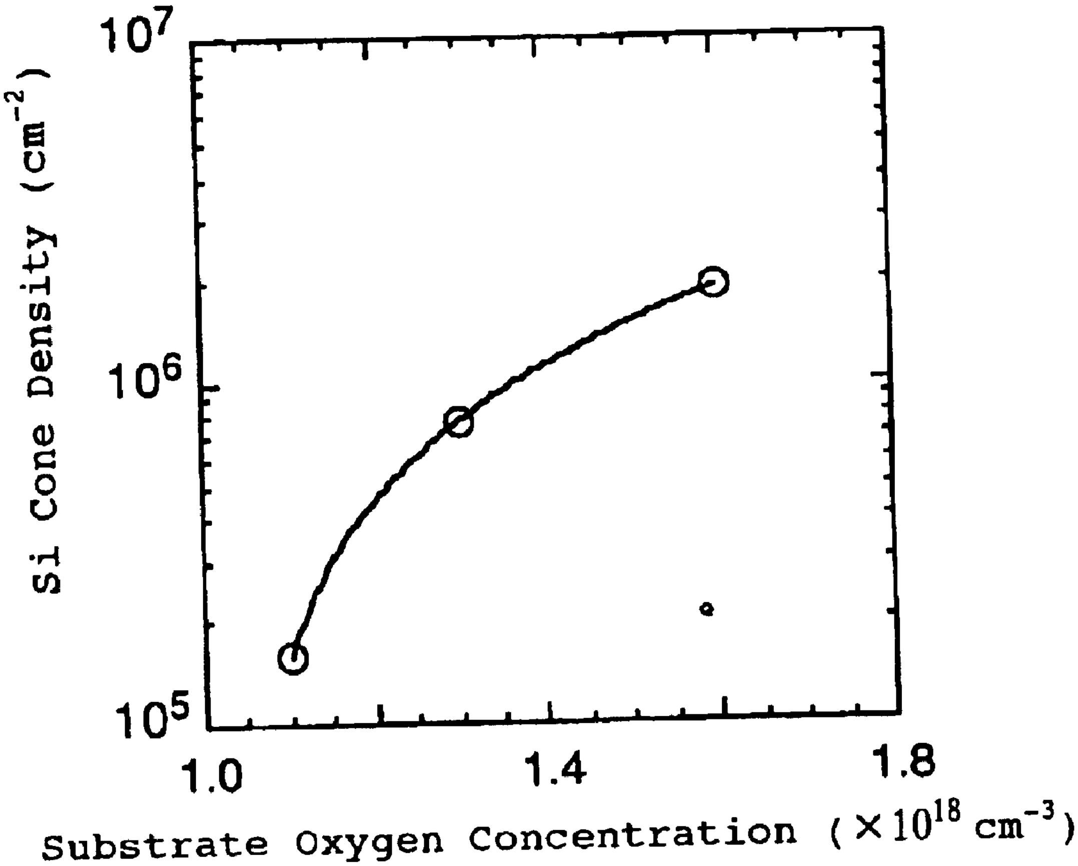
FIG. 5 shows a relation between a density of forming Si cones and a substrate oxygen concentration according to an embodiment of the present invention.

FIG. 5 shows a relation between an oxygen concentration of the silicon substrate and a density of Si cones formed. FIG. 5 shows a result obtained by measuring a density of Si cones obtained by performing the high selectivity anisotropic etching of CZ silicon substrates having a different oxygen concentration under the same conditions as described with reference to FIG. 4. It can be seen from the measurement result shown in FIG. 5 that when a large amount of oxygen is used as material for the micro mask, the density of Si cones formed in the substrate becomes high, and the density of the micro mask (oxygen precipitate: $SiO_2$) as a source for the Si cones can be controlled by controlling the amount of oxygen introduced into the substrate.

Figure 6A:
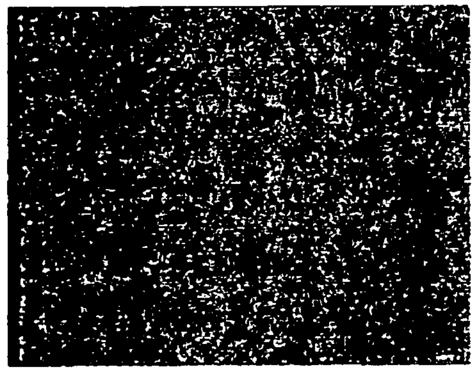
FIGS. 6A and 6B are microscope photographs for illustrating a relation between a B ion implantation concentration and a density of Si cones obtained by high selection anisotropic etching according to an embodiment of the present invention.
Figure 6B:
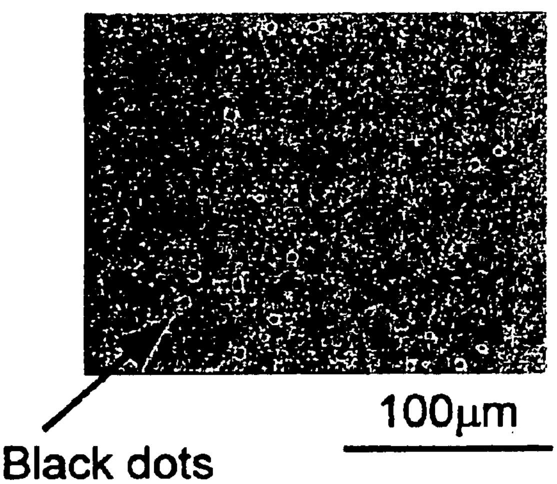

FIGS. 6A and 6B are optical microscope photographs showing B ion implantation dependency of a density of Si cones obtained by performing the B ion implantation before thermally treating the CZ substrate having an oxygen concentration of $1.1\times10^{18}$ $cm^{-3}$ to precipitate oxygen.

The photograph shown in FIG. 6A shows the surface of the CZ substrate after the anisotropic etching obtained with a B ion implantation concentration of $7\times10^{13}$ $cm^{-2}$. No Si cone is seen on the surface of the substrate obtained after the etching. The same result was also obtained when no B ion was implanted. Thus, it is apparent that when the B ion implantation concentration is not more than $7\times10^{13}$ $cm^{-2}$, the Si cone is not formed even if the CZ substrate has an oxygen concentration of $1.1\times10^{18}$ $cm^{-3}$.

Meanwhile, when the B ion implantation concentration is $1\times10^{14}cm^{-2}$ the Si cones are seen as black dots on the surface of the CZ substrate after the anisotropic etching shown in FIG. 6B. Thus, it can be seen that the thermal treatment is preferably performed after implanting the B ion in a concentration of more than $7\times10^{13}$ $cm^{-2}$ in addition to the introduction of oxygen into the substrate. The measured result of FIG. 5 was obtained by implanting the B ion in a concentration of $1\times10^{14}$ $cm^{-2}$.

It is considered that the micro mask can be easily formed by the B ion implantation because B is easy to bond to O than to Si, and when the B ion is supplied into the silicon crystal, the B—O bond is formed in the silicon crystal, and a minute cluster of the B—O bond serves as a seed to form a Si—O bond.

The size of the micro mask, namely the size of the impurity precipitation region, can be controlled by adjusting the thermal treatment conditions and the aforesaid condition of introduced oxygen amount (including the B ion implantation amount). Here, the thermal treatment conditions include suitably a temperature of 600° C. to 1100° C., a duration of 10 minutes to five hours and an oxidizing or non-oxidizing atmosphere. But, when the treating temperature is higher with the same treating duration, an area of the micro mask, namely an area of the oxygen precipitation region, is increased, but when the treating duration is extended with the same treating temperature, an area of the oxygen precipitation region is also increased.

As described above, the impurity precipitation region which becomes the micro mask used to form the cone of the present invention can have its density controlled by the concentration of the impurity introduced into the semiconducting material and the implantation of the B ion. It can also be seen that the size of the impurity precipitation region can be controlled by a combination of the control of the impurity concentration and B ion concentration and the thermal treating conditions.

(ii) Control of Micro Mask Position

Control of the position of the impurity precipitation region which is to be the micro mask will next be described. When a plurality of cones are formed with a plurality of micro masks as the top under the same anisotropic etching condition, the individual cones of the present invention have similar shapes, and have a height substantially equal to a distance from the position where the micro mask is formed to the etching exposed surface. Therefore, to form the cones having the same uniform height and the same shape in the same multiple semiconductor substrate or semiconductor layer, it is necessary to control a depth of the micro mask formed in the substrate or layer.

In order to control the micro mask in its depth direction, two methods are considered as follows. A first method introduces the impurity by, for example, an ion implantation method as exemplified in connection with the Si cone forming process of FIGS. 3A, 3B, 3C, and 3D. According to the ion implantation method, a depth of the impurity introduced can be controlled by controlling its implantation energy or the like. According to a second method, the silicon crystal region where the cones are formed is epitaxially grown, and the epitaxial growing is performed while introducing impurity gas (such as oxygen gas) or the like into the atmosphere gas in the position where $SiO_2$ to be used as the micro mask is desired to be formed.

For the control of the micro mask in its plane direction, for example, the mask (e.g., a resist mask) which is open at the cone forming region only by the photolithography is formed on the semiconductor substrate or the semiconductor layer, and the impurity is introduced into the mask opening by the implantation of ions, thereby forming the micro mask in the predetermined plane position. And, when the impurity is introduced for the epitaxial growing, the semiconducting material layer may be formed on the cone-forming region only by the selective epitaxial growth. For example, it can be realized by a method of previously covering the region other than the cone-forming region with the mask. And, it can also be realized by forming an epitaxial growing layer (having an impurity gas introduction process) on the entire surface of the substrate and etching to remove the region other than the cone forming region before the thermal treatment or if the thermal treatment has been completed already, by removing the region other than the cone forming region by an etching method other than the anisotropic etching.

(iii) Control of Cone's Aspect Ratio

When the semiconductor substrate or the semiconductor material is subjected to the anisotropic etching through the micro mask by RIE as described above, a reaction product adheres to the sidewall of the cone formed. During the anisotropic etching, the reaction product adhered to the sidewall of the cone becomes the protective film to retain the cone shape, and the cone shape (an aspect ratio of the cone) is controlled depending on an amount of the protective film adhered to the sidewall. The sidewall protective film amount can be controlled by changing a mixing ratio of etching gas (e.g., $NF_3$) and gas for deposition (e.g., HBr gas) among the aforesaid etching mixture gases. Specifically, the cone becomes thinner and sharper and has a higher aspect ratio when the etching gas ratio is increased, while it has a lower aspect ratio when the deposition gas ratio is increased.

Therefore, the aspect ratio of the cone can be controlled by adjusting the ratio of the mixture gas used for the anisotropic etching to control an amount of the reaction product and an amount of the reaction product adhered to the cone.

In Embodiment 1 described above, the silicon substrate was used as the semiconducting material substrate, but another material substrate other than silicon may be used. The semiconducting material layer may also be a single-crystal silicon layer or another material layer formed on a semiconductor or insulator substrate. The micro mask is not limited to the oxygen precipitate ($SiO_2$) in the Si material, and may also be nitrogen precipitate (SiN) or carbon precipitate (SiC) in the Si material by having an appropriate etching gas and etching conditions according to the materials used. In this case, for the etching material to the SiN and SiC precipitates, fluorine-based gas can be used as the etching gas for the anisotropic etching in the same manner as the aforesaid $SiO_2$. And, by performing the anisotropic etching of SiN and SiC by using, for example, a fluorine-based gas material, cones having them as the tops can be formed. And, Si in the $SiO_2$ material can be considered to be the impurity having an etching rate different from a main component $SiO_2$, and it can be used as the micro mask to form the cones. Besides, Si in the SiN material or Si in the SiC material can be used as the micro mask to form the cones.

It is to be understood that the method for manufacturing the conic body described above is only an illustrative example and that the manufacturing method is not limited to that described above, and the present invention allows for other manufacturing methods to be used to obtain the conic body.

Embodiment 2

A process of manufacturing the cone of the present invention obtained by the aforesaid method when it is used for a semiconductor device, e.g., a field emission device or an electron gun will next be described with reference to FIGS. 7A, 7B and 7C. The process shown in FIGS. 7A, 7B and 7C is performed subsequent to the process of FIG. 3D.

Figure 7A:
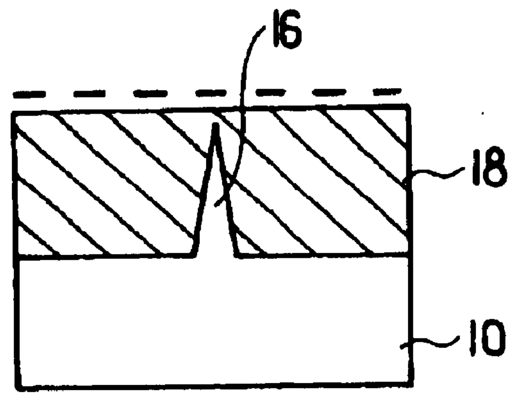
FIGS. 7A, 7B and 7C illustrate a method for manufacturing a semiconductor device using a cone of the present invention.
Figure 7B:
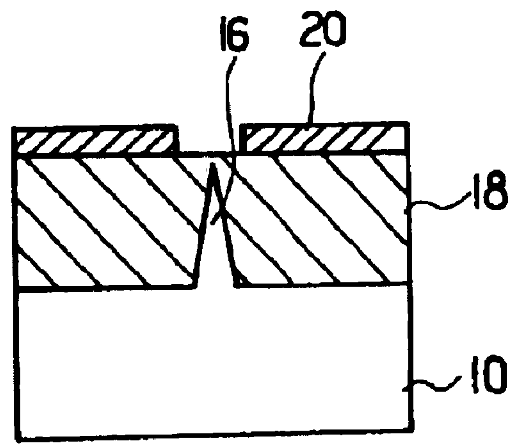
Figure 7C:
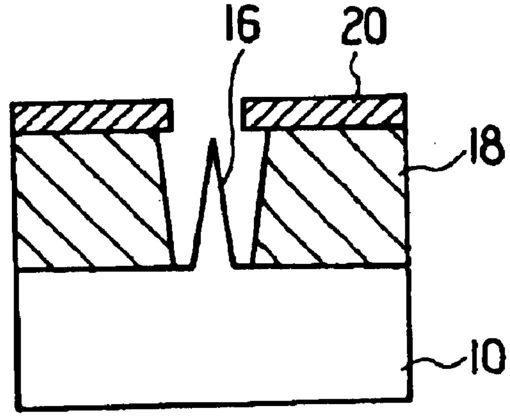

A cone 16 is formed on a silicon substrate 10, a sidewall protective film is removed in the same way as in Embodiment 1 (FIG. 3D), and $SiO_2$ layer 18 is formed as an insulation layer to bury the Si cone 16 as shown in FIG. 7A. In Embodiment 2, for example, to form a polycrystalline silicon (poly-Si) film as a gate electrode on the $SiO_2$ film 18 in the next step, a thickness of the $SiO_2$ layer 18 to be formed is, larger than a height of the Si cone 16, e.g., about 10 nm larger than the thickness of the Si cone 16, so that the leading end of the Si cone 16 is not etched when the poly-Si is patterned.

After forming the $SiO_2$ layer 18 to a predetermined thickness on the silicon substrate 10, a poly-Si film is formed on the $SiO_2$ layer 18. A resist is further formed on the entire surface of the poly-Si film, and photolithography is performed to form a resist pattern having an opening on the region where the Si cone 16 is formed. RIE is conducted with the resist pattern used as the mask to remove the poly-Si film from the resist opening, namely the region where the Si corn is formed, to obtain a gate electrode 20 (FIG. 7B).

Next, the resist used to form the gate electrode 20 is removed, and the $SiO_2$ layer 18 exposed in the opening of the gate electrode 20 is etched by RIE. Thus, the Si cone 16 of monocrystal Si of the same material as the substrate is exposed in the opening of the gate electrode 20 (FIG. 7C).

In the oxygen precipitation region forming process in Embodiment 1 (see FIG. 3B), the cones 16 having the same shape are formed in a plurality of positions on the substrate 10 by forming a plurality of oxygen precipitation regions having a predetermined depth in the plurality of positions on the substrate 10. By performing the process shown in FIGS. 7A, 7B and 7C to the substrate on which the multiple cones 16 are formed, a structure body 30 which has the Si cones 16 exposed at the multiple gate electrode opening regions as shown in FIG. 8A is obtained.

For example, when a substrate 42 on which RGB fluorescent material layer 40 is formed is disposed to oppose the structure body 30, a device, which uses the structure body 30 as a field emission device or a minute electron gun, e.g., a color plane display (FED), can be configured. In the aforesaid structure, when a predetermined driving voltage is applied to the gate electrode 20 in a predetermined position to emit an electron ($e^-$) from the leading end of the Si cone 16, the fluorescent material layer 40 in the corresponding region can be emitted, and desired display can be effected.

Figure 8A:
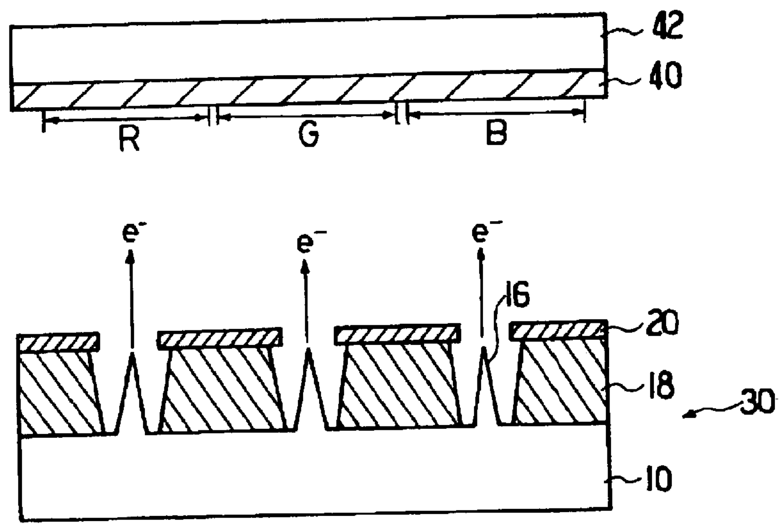
FIGS. 8A and 8B illustrate structures of semiconductor devices according to an embodiment of the present invention.
Figure 8B:
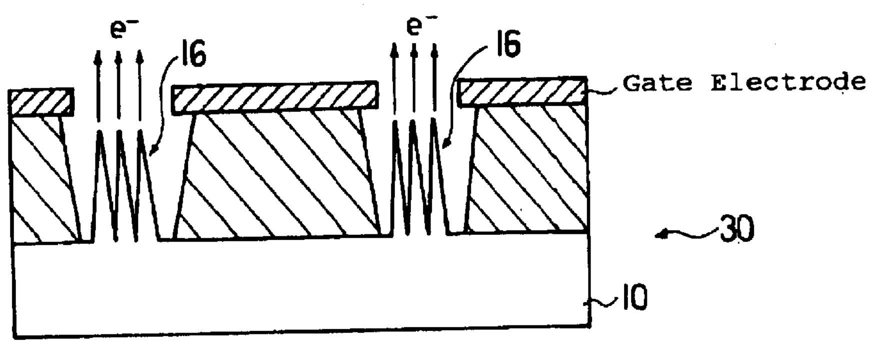

In addition, the aforesaid structure body 30 is not limited to the one shown in FIG. 8A and can be configured to have a plurality of Si cones 16 formed in a single gate electrode opening region as shown in FIG. 8B. The structure body 30 shown in FIG. 8B can be realized by adjusting the impurity concentration to be introduced when the precipitation region is formed and the thermal treatment conditions so to control the number of micro masks formed for each unit area, and the number of cones formed in the each gate electrode opening region can be made equal.

Embodiment 3

Figure 9A:
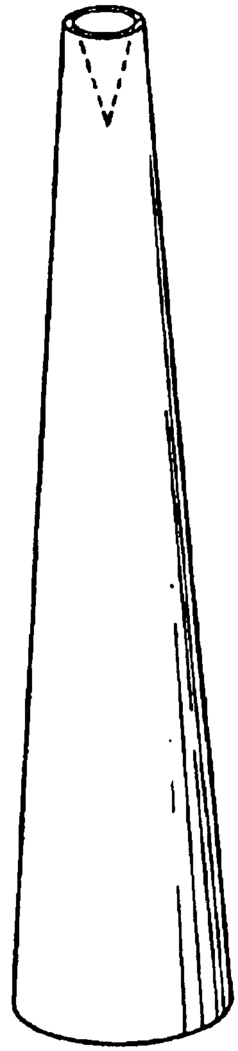
FIG. 9 shows a structure of a truncated cone according to the present invention.
Figure 9B:
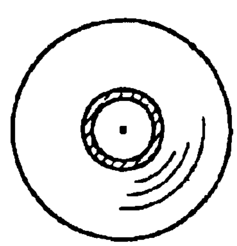

FIG. 9 schematically shows a frustum according to Embodiment 3 of the present invention. The conic body in Embodiment 3 is a cone, and the following description in connection with the frustum will be made with reference to a truncated cone. In FIG. 9, (*a*) shows a structure of the truncated cone seen from its side, and (*b*) shows a plane structure of the same truncated cone seen from above its leading end. And, the truncated cone has its top removed in the shape of a mortar so to have an annular shape at its leading end. A frustum other than the truncated cone has an annular shape (e.g., a corresponding polygonal annular shape when the frustum is a polygonal prismoid) along its sidewall at the leading end.

An impurity precipitation region is formed on a particular region in a semiconducting material substrate or a predetermined semiconducting material layer to form a micro mask, and high selectivity anisotropic etching is applied to the micro mask to form the truncated cone with the micro mask used as the top on the etching exposure surface. When the etching is continued, the micro mask is removed, and the center of the upper surface of truncated cone exposed by the continued etching is etched in the shape of a mortar toward the bottom of the truncated cone. Thus, the truncated cone having the annular leading end is obtained as shown in the drawing.

The resulting truncated cone has a radius of curvature of several nm to ten or more nm in the vicinity of the leading end and an aspect ratio of about 10. Thus, a very slender needle-shaped cone can be produced. The base angle of the truncated cone can be enlarged to about 80° or more for example. It is also possible to adjust the height of the truncated cone to about several $\mu$m. The diameter of the mortar-shaped portion formed on the top surface when the top of the truncated cone has a diameter of about several nm to 30 nm is about 2 nm to 4 nm smaller than the diameter at the top of the truncated cone. Thus, the annular portion formed at the leading end of the truncated cone has a thickness (width) of about 1 nm to 2 nm. The mortar shape is substantially the same as the truncated cone, and an aspect ratio indicating a ratio of the depth to the diameter at the top surface can be about 10 equal to that of the truncated cone and a base angle can be about 80°.

Manufacturing Example 1

FIGS. 10A to 10F show one example of a method for manufacturing the truncated cone according to Embodiment 3. In this example, the silicon substrate is used as the semiconducting material substrate, and oxygen is introduced as the impurity into the silicon substrate to form an oxygen precipitation region (precipitation defect) which functions as the mask. When the used silicon substrate 10 contains a high concentration of oxygen, the oxygen itself precipitates to make the micro mask. Therefore, a low oxygen concentration substrate (e.g., an oxygen concentration of $10^{10}/cm^3$) is used in this example.

Figure 10A:
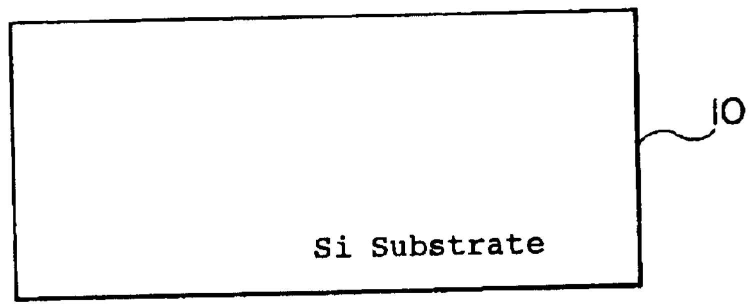
FIGS. 10A, 10B, 10C, 10D, 10E and 10F are flow diagrams for illustrating a method for manufacturing a truncated cone according to the present invention.
Figure 10B:
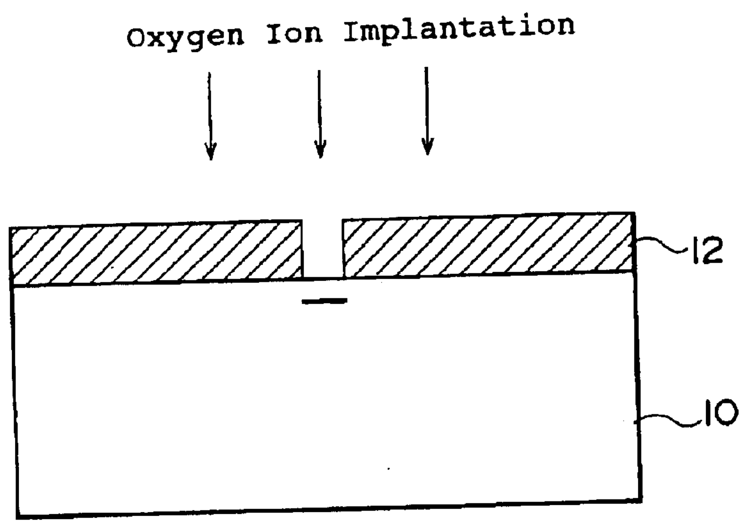

After cleaning the silicon substrate 10 having a low oxygen concentration (FIG. 10A), a resist pattern is formed on the surface of the silicon substrate 10 by photolithography, and oxygen ion is implanted as impurities in the opening of the resist 12 to a predetermined depth, e.g., about 0.2 $\mu$m, of the substrate 10 (FIG. 10B).

Figure 10C:
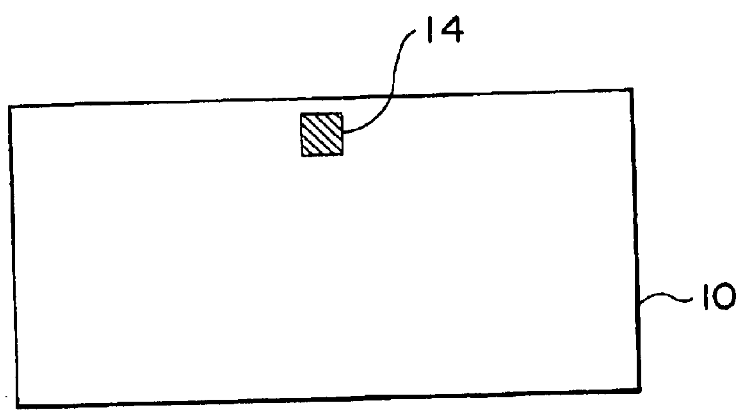

After implanting the oxygen ion, the resist 12 is removed, and the substrate 10 is thermally treated under predetermined conditions (e.g., a temperature range of 600° C. to 1100° C., and an oxidizing atmosphere or a non-oxidizing atmosphere). Thus, an oxygen precipitation defect ($SiO_2$), namely an oxygen precipitation region 14 to be the micro mask, is formed to a predetermined depth (e.g., about 2 $\mu$m from the surface of the substrate) in the opening region of the resist 12 (FIG. 10C). This micro mask 14 is formed so to have a diameter of about 10 nm to 30 nm for example.

Figure 10D:
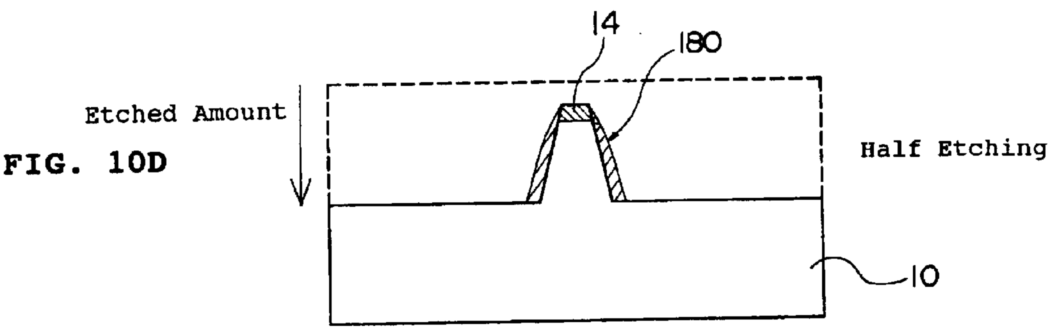

When thermally treated in the oxidizing atmosphere, $SiO_2$ film is formed on the thermally treated substrate 10, and when thermally treated in the non-oxidizing atmosphere, an oxide film is also formed on its surface. The presence of the oxide film serves as a mask and disturbs the anisotropic etching. Therefore, the oxide film is removed first, then the high selectivity anisotropic etching, e.g., RIE (reactive ion etching), is performed. Through the anisotropic etching, the beginnings of a cone having a height corresponding to an amount of etching is formed with the oxygen precipitation region (micro mask) 14 as a top on the etching exposed surface of the silicon substrate 10 as shown in FIG. 10D (half-etched state).

When the anisotropic etching is performed, etching gas is supplied from a separate gas-supplying device into an etching device. However, when etching of the oxygen precipitate in the silicon substrate is performed by using a common magnetron RIE device, halogen-based mixture gas (e.g., $HBr/NF_3/He+O_2$ mixture gas) is suitably used as the etching gas. The halogen-based etching gas has its etching selectivity increased in order of F, Cl and Br with respect to the oxygen precipitation region (precipitation defect) in the silicon. Therefore, Br-based gas is most preferable to form the cone surely by the anisotropic etching, and order of Cl and F follows it. A reaction product or the like generated at the etching adheres to the sidewall of the truncated cone so to form a sidewall protective film 180, which serves to maintain the conic shape while etching.

Figure 10E:
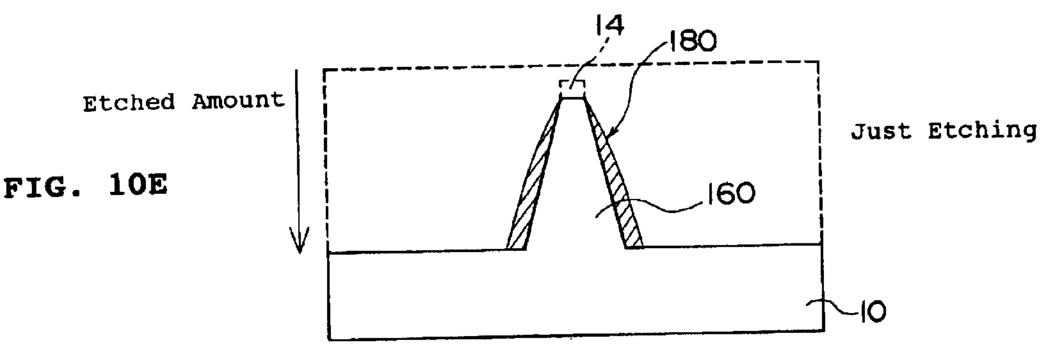

By continuing the RIE to a predetermined depth, the micro mask 14 formed to a predetermined depth from the original surface is also removed by etching to expose the top surface of the truncated cone 160 as shown in FIG. 10E (just-etched state).

Figure 10F:
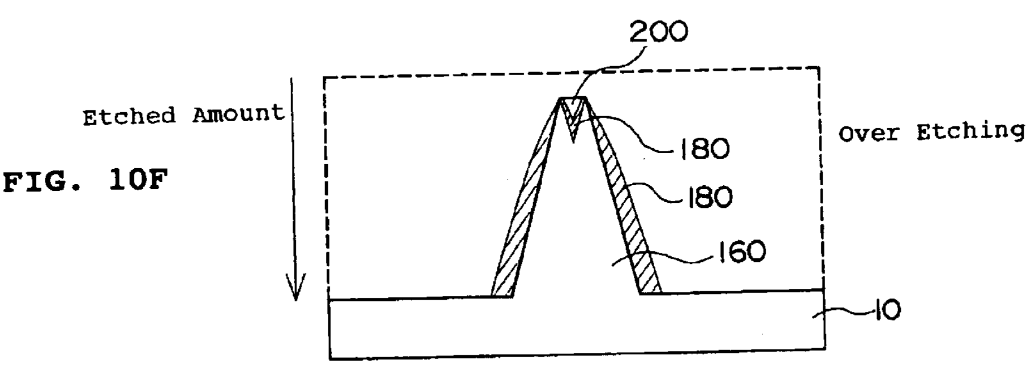

When the etching is further continued to perform over etching, further etching is prevented because the outside diameter portion on the top surface of the truncated cone 160 is covered with the sidewall protective film 180, so that the etching advances with priority from the center of the upper surface. Thus, the etching advances from the upper center portion of the truncated cone 160 toward the bottom to form a mortar-shaped portion 200, thereby forming an annular shape at the leading end of the truncated cone 160 as shown in FIG. 10F. And, the mortar shape is maintained when etching because the sidewall protective film 180 is formed on the sidewall of the mortar-shaped portion 200 by the adhered reaction product and the like generated by the etching. The surface of the substrate 10 is further etched to a level similar to the depth of the mortar-shaped portion 200 formed by the over etching, and the height of the truncated cone 160 is increased accordingly.

The truncated cone 160 formed on the silicon substrate as described above has an aspect ratio of about 10 or more, a diameter of 10 nm to 30 nm at the leading end (a radius of curvature of several nm to ten or more nm), a base angle of 80° or more, e.g., 85°, and becomes a sharp conic shape having a height of several $\mu$m with a high aspect ratio. The diameter near the bottom is very small, e.g., about 0.5 $\mu$m. The mortar-shaped portion 200 having substantially the same shape as the truncated cone is formed on the top surface of the truncated cone 160. The mortar-shaped portion 200 is formed to have a diameter about 2 nm to 4 nm smaller than the diameter of the top surface of the truncated cone 160 by controlling the over etching time. For example, the annular portion formed at the leading end of the truncated cone can be made to have a thickness (width) of about 1 nm to 2 nm as described above. Therefore, the effective area at the leading end of the truncated cone can be made very small as indicated as a shaded portion in (*b*) of FIG. 9.

The sidewall protective film formed on the sidewalls of the truncated cone 160 and the mortar-shaped portion 200 by the RIE can be removed by immersing the substrate 10 in, for example, dilute hydrofluoric acid, after the anisotropic etching. This step of removing the sidewall protective film is not essential and may be omitted.

Specifically, the truncated cone having the annular leading end as described above can be formed under the following conditions, but is not limited to being formed under such conditions.

For the substrate 10, a silicon substrate was used, and a CZ substrate having an oxygen concentration of $1.6\times10^8$ $cm^{-3}$ was also used. The CZ substrate was thermally treated in an oxygen atmosphere at 600° C. to 1100° C., e.g., 1000° C., for 225 minutes to form about 20 nm of an oxygen precipitation region ($SiO_2$) to be used as the micro mask in the silicon substrate. Then, a natural oxide film formed on the surface of the substrate was removed. The silicon substrate was subjected to the high selectivity anisotropic etching with $HBr/NF_3/He+O_2$ mixture gas by an ordinary magnetron RIE device. The RIE was performed under a condition that etching property to $SiO_2$ to be the micro mask 14 is 1/200 (selectivity of 200) of the etching property to the Si monocrystal. An etching depth from the surface of the substrate in the state after completing the over etching in FIG. 10F was 6 $\mu$m. Etching to this depth thoroughly removes the micro mask 14 formed to a depth of 2 $\mu$m from the original surface of the silicon substrate. Therefore, the top surface of the truncated cone 160 formed with the micro mask 14 as the top in the position shallower than 2 $\mu$m from the original surface of the silicon substrate was over etched in the shape of a mortar on the principle of the present invention. Thus, the truncated cone 18 with the annular leading end was obtained.

Figure 11:
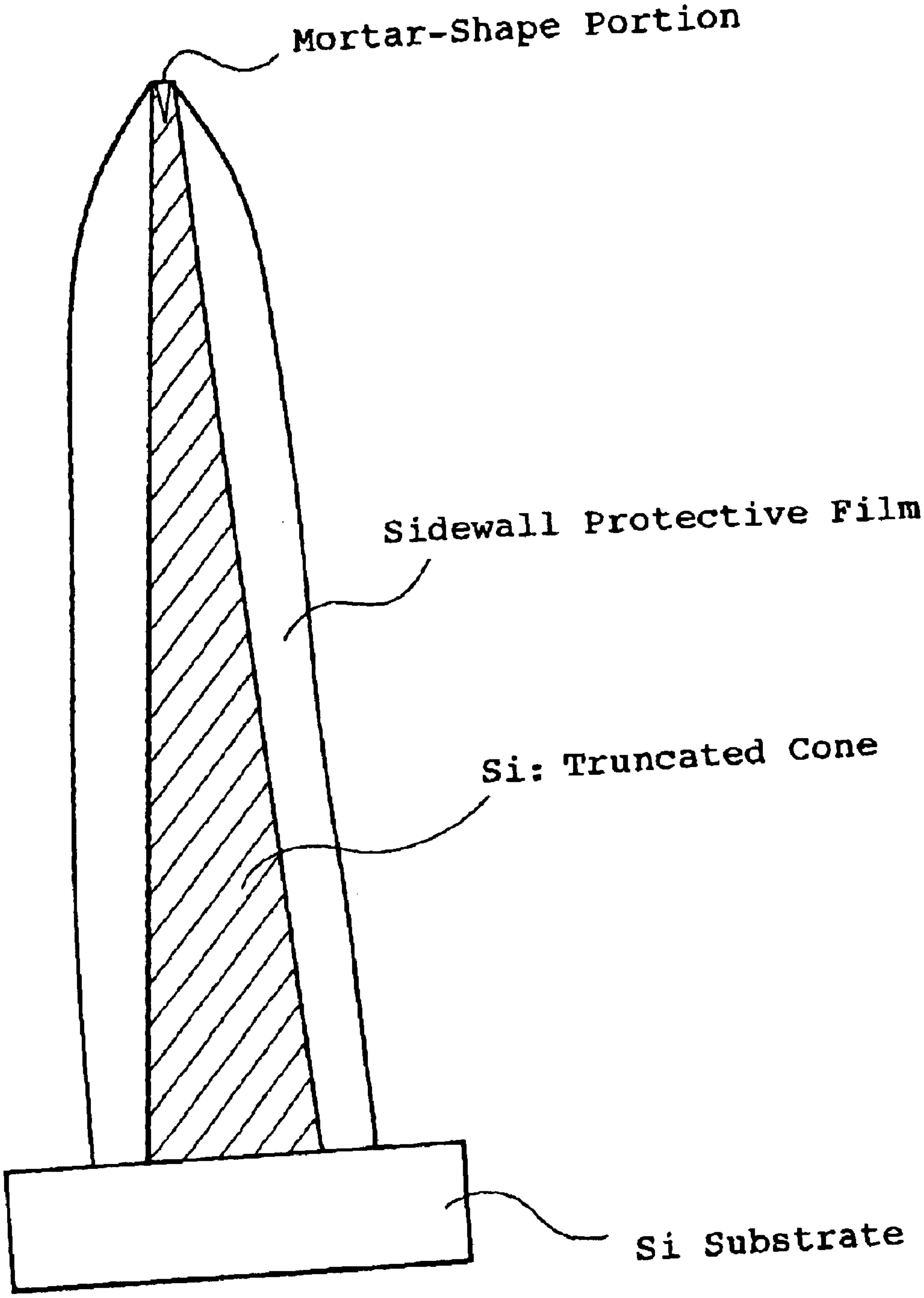
FIG. 11 is a schematic diagram drawn from a TEM photograph of a truncated cone of the present invention actually manufactured.

FIG. 11 schematically shows a TEM section observation image of the truncated cone having the annular leading end obtained above, showing a state before the removal of the sidewall protective film after forming the truncated cone. As shown in FIG. 11, the truncated cone having a height of about 4 $\mu$m was formed on the silicon substrate, the mortar-shaped portion at the leading end had a base angle of about 80°, and the annular portion formed at the leading end of the truncated cone had a width of about 1 to 2 nm.

Therefore, it is apparent from FIG. 11 that the truncated cone having a small curvature at the leading end, a large aspect ratio and an annular leading end can be formed actually by performing the anisotropic etching with the oxygen precipitation region used as the micro mask.

Manufacturing Example 2

The aforesaid Manufacturing Example 1 forms the mortar-shaped portion at the leading end of the truncated cone by performing the over etching after forming the truncated cone with the micro mask 14 used as the mask. To form truncated cones with a more uniform height on the substrate, the truncated cones can be formed by a manufacturing method using a combination of different etching conditions.

Figure 12A:
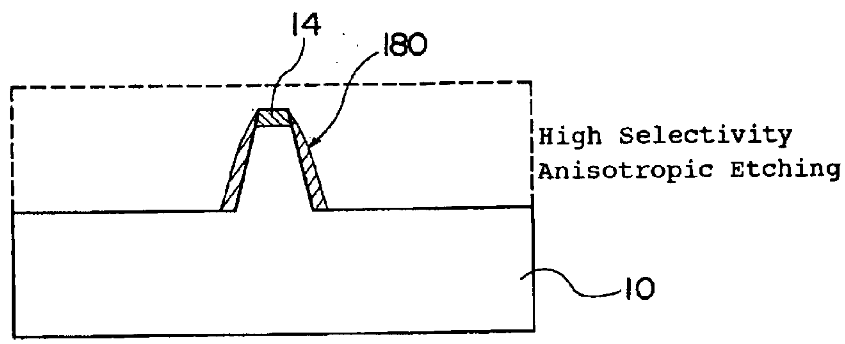
FIGS. 12A, 12B and 12C are flow diagrams for illustrating another method for manufacturing a truncated cone.
Figure 12B:
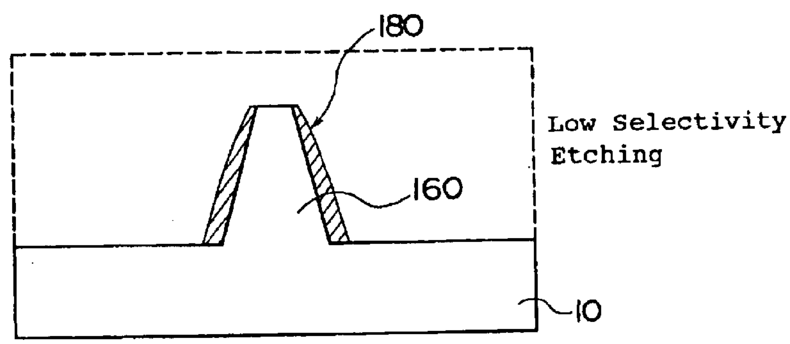
Figure 12C:
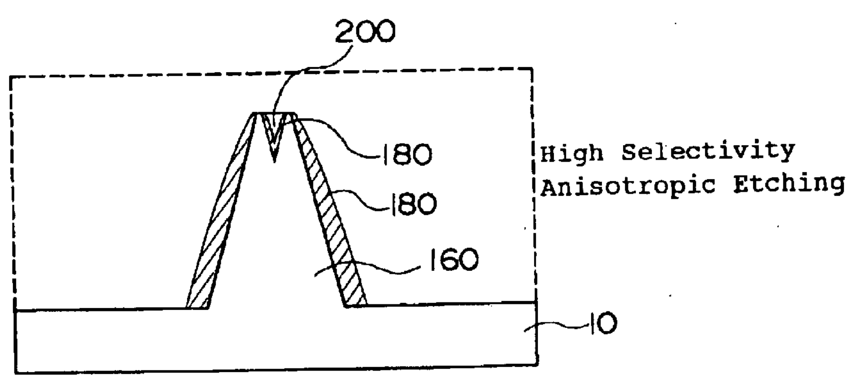

In Manufacturing Example 2, a manufacturing method using a combination of etching conditions will be described with reference to FIGS. 12A, 12B and 12C. The process of forming a micro mask having a diameter of 10 nm to 30 nm by forming a desired resist pattern on a substrate, selectively implanting oxygen ion and thermally treating is performed by the same method as shown in FIGS. 10A to 10C. After forming the micro mask 14 in a predetermined position on the substrate 10 as shown in FIG. 10C, the oxide film formed by the thermal treatment for forming the micro mask is removed, and high selectivity anisotropic etching such as RIE is performed. Thus, the truncated cone with the micro mask (oxygen precipitation region) 14 as the top is formed as shown in FIG. 12A. After performing the high selectivity anisotropic etching to a predetermined extent, the etching condition is changed to a low selectivity, and the micro mask 14 is removed by etching as shown in FIG. 12B to expose the top surface of the truncated cone 160. Since the sidewall of the truncated cone 160 is covered with the sidewall protective film 180, the etching is hard to advance, so that the cone shape is retained. Meanwhile, the surface of the substrate 10 is etched by the low selectivity etching to increase a height of the truncated cone 160.

As shown in FIG. 12B, when the top surface of the truncated cone 160 is exposed, the etching condition is changed again to the high selectivity anisotropic etching. Thus, the exposed top surface of the truncated cone 160 is etched with priority from the vicinity of the center free from the sidewall protective film 180, to form a mortar-shaped (a base angle of 80° or more and a high aspect ratio) portion 200 at the leading end of the truncated cone 160. Thus, an annular leading end is formed. The principle of forming the mortar-shaped portion 200 at the leading end of the truncated cone 160 is the same as in Manufacturing Example 1.

By removing the micro mask 14 by the low selectivity etching according to the method of Manufacturing Example 2, the exposed truncated cone is etched by the high selectivity etching, and the truncated cones 160 can be formed with a uniform height on the plane surface of the substrate. Because the high selectivity anisotropic etching is performed under the same conditions after exposing the upper surface of the each truncated cone 160, the mortar-shaped portions 200 formed on the upper surfaces of the truncated cones 160 can also be formed with a uniform diameter. Thus, the truncated cones having the annular leading end formed on the substrate have a uniform size (particularly, height), and the annular portions at the leading ends can be made to have the same size.

Manufacturing Example 3

Manufacturing Example 3 describes a method different from Manufacturing Example 2 which forms the truncated cones with the more uniform size on the substrate. Manufacturing Example 3 will be described with reference to FIGS. 3A to 3D and FIGS. 13A to 13D. First, the cone 16 is formed on the surface of the substrate according to the process shown in FIGS. 3A to 3D described in Embodiment 1. Specifically, a very small micro mask (oxygen precipitate) is formed in the silicon substrate through the ion implantation and the thermal treatment, and then the high selectivity anisotropic etching is performed to form the cone 16 with the micro mask as the top as shown in FIG. 3D.

Figure 13A:
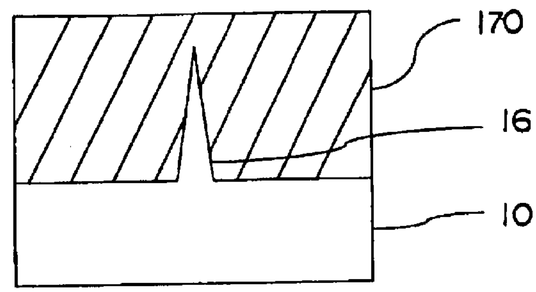
FIGS. 13A, 13B, 13C and 13D are flow diagrams subsequent to FIG. 3D for illustrating another method for manufacturing a truncated cone.
Figure 13B:
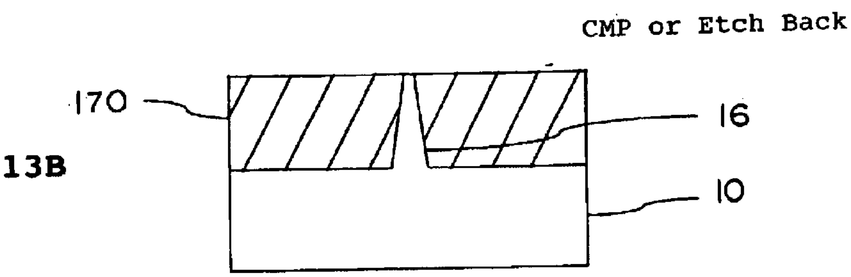
Figure 13C:
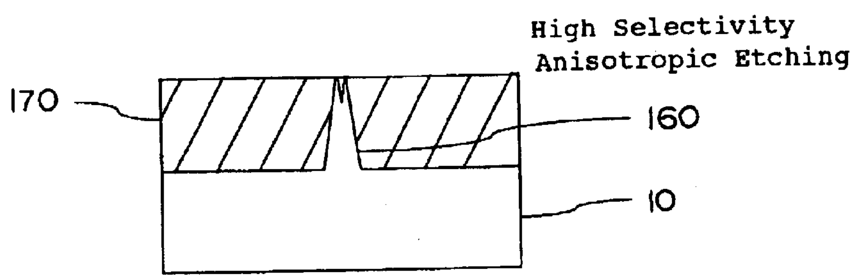
Figure 13D:
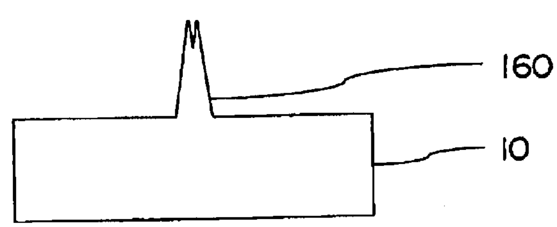

After forming the cone, an $SiO_2$ film 170 is fully formed on the substrate to bury the cone 16 on the substrate by CVD or the like as shown in FIG. 13A. Then, the surface of the substrate foully covered with the $SiO_2$ film 170 is etched by CMP (chemical mechanical polish) or etch back to expose the leading end of the silicon cone to the etched surface as shown in FIG. 13B. The etching is particularly preferably performed so that the leading end of the cone is etched to some extent to have a truncated cone shape. After exposing the leading end of the cone as shown in FIG. 13B, high selectivity anisotropic etching such as RIE is performed with the $SiO_2$ film 170 burying the cone remained as it is. The exposed top surface of the cone is etched by the etching, and the truncated cone 160 is formed. Here, the outer circumference (sidewall part) at the top surface of the truncated cone 160 is covered with the $SiO_2$ film 170, so that the high selectivity anisotropic etching advances with priority from the truncated cone 160 of silicon, particularly from the center of the exposed upper surface of the truncated cone 160. As a result, the mortar-shaped portion is formed on the upper surface of the truncated cone as shown in FIG. 13C. After forming the mortar-shaped portion, the $SiO_2$ film 170 burying the truncated cone 160 is removed, so that the cone having the annular leading end is formed to protrude on the substrate as shown in FIG. 13D. As described above, the formed cone is buried in Manufacturing Example 3, and the film having buried the cone is etched uniformly to align the leading ends (heights of the upper surfaces) of the truncated cones in advance, and the mortar-shaped portion is formed at the upper surface of the truncated cone. Therefore, when a plurality of truncated cones are formed on the substrate, finally obtained truncated cones can be made to have the same heights. When the respective cones have roughly equal heights, the individual cones have substantially the same size, and the upper surfaces have a uniform area when the upper surface positions of the truncated cones are uniform. Because the mortar-shaped portion is formed under the same condition (particularly, the same etching time) to the each truncated cone, differences in the diameter of the mortar-shaped portion are not common. Therefore, a plurality of truncated cones having an annular leading end are made to have a more uniform shape on the substrate.

In Embodiment 3, the leading end diameter and height of the truncated cone, and the diameter and depth of the mortar-shaped portion can be made to have desired values by controlling a size of the micro mask, a selectivity of etching of the mask and the substrate and an etching amount. In the above embodiment, the silicon substrate originally containing oxygen as material for $SiO_2$ to be used as the micro mask was used. But, as shown in FIG. 10B, a plurality of truncated cones having a uniform height can be formed in desired positions on the substrate by introducing oxygen by ion implantation.

In Embodiment 3 described above, a silicon substrate was used as the semiconducting material substrate, but any material substrate other than silicon can also be used. And, the semiconducting material layer may be the single-crystal silicon layer formed on the semiconductor or insulator substrate or another material layer. The micro mask is not limited to the oxygen precipitate ($SiO_2$) in the Si material but may be a nitrogen precipitate (SiN) or carbon precipitate (SiC) in the Si material by properly adjusting the etching gas and the etching condition depending on the material used. In this case, the etching material to the precipitates SiN and SiC can be fluorine-based gas as etching gas for the anisotropic etching in the same manner as $SiO_2$. When the anisotropic etching of SiN and SiC is performed by using, for example, the fluorine-based gas material, the truncated cone can be formed with these materials as the surface. After the truncated cone is formed, over etching can be performed to form an annular leading end. And Si in the $SiO_2$ material can be assumed to be the impurity having an etching rate different from the main component $SiO_2$, and it can be used as the micro mask to form the truncated cone. Further, Si in the SiN material or Si in the SiC material can be used as the micro mask to form the truncated cone.

The aforesaid truncated cone, which is provided with the annular leading end by forming the mortar-shaped portion at the leading end, can be used for a semiconductor device, e.g., a field emission device or an electron gun in the same manner as in Embodiment 2. When it is used for the field emission device, it has the same structure as shown in FIG. 8A or FIG. 8B. The truncated cone 160 formed in Embodiment 3 can also be used instead of the cone 16 shown in FIGS. 8A and 8B. The truncated cone 160 of Embodiment 3 has a high aspect and a slender shape, and its leading end is formed to have an annular shape. Therefore, the effective area at the leading end is very small and the electrons can be discharged at a lower voltage. In addition to the field emission device, the truncated cone 160 can be used for a component of a single electron transistor to be described afterward or the like.

Embodiment 4

An embodiment applying the aforesaid needle conic body to a single electron semiconductor device for controlling the propagation of a single or a small number of electrons, and particularly an embodiment applying the aforesaid needle conic body to a single electronic semiconductor device to be produced by a silicon process, will next be described.

A single electron transistor is expected to be an element which can achieve reduction of power consumption which is one of the maximum pending problems in providing LSI with high integration at the present age. A basic structure of the single electron transistor and its operation principle are plainly described in a reference "Quantum optics and New Technology [V]" (Journal of Electronic Information Communication Association, Vol. 72, No. 10, pp. 1177 to 1184).

Figure 14A:
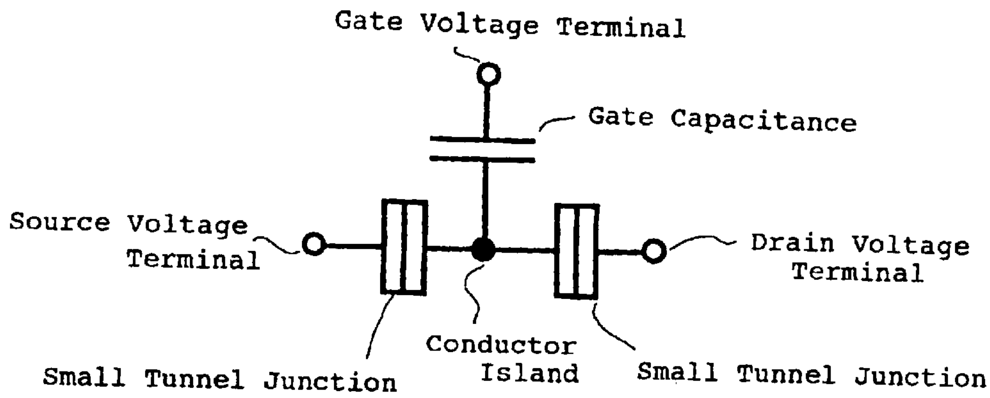
FIG. 14A is a general equivalent circuit chart of a single electron transistor.

FIG. 14A shows a general equivalent circuit of a single electron transistor. The single electron transistor has three terminal elements of source, drain and gate, and electrons flow from the source to the drain. Included are a conductor island, or a quantum dot (a space on the size of the order of nanometers and wherein electrons can be present) in a route, where a carrier flows, via small tunnel junctions (minute insulating region with a capacity of about $10^{-18}$ F and a thickness of a level that the electrons can tunnel), and a gate electrode via a gate capacitance (the capacity is not particularly specified but generally larger than that of the small tunnel junction by about three digits) to control the potential of the conductor island. The single electron transistor is a device using a phenomenon (coulomb blockade) in which not even a single electron can tunnel the small tunnel junction.

The coulomb blockade is a phenomenon wherein electrostatic energy $e^2/C$ involved in the movement of a single electron to the conductor island by moving through the small tunnel junction becomes larger than thermal energy ($k_BT$) because C is small, and tunneling cannot be made because it loses in energy if tunneled. Here, e indicates an elementary charge of $1.6\times10^{-19}$ C, $k_B$ indicates a Boltzmann's constant of $8.62\times10^{-5}$ (eV/K), and T indicates an absolute temperature.

Figure 14B:
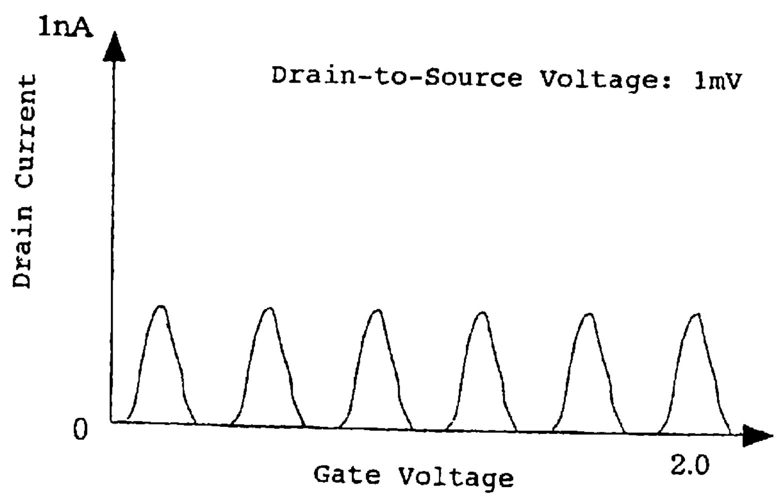
FIG. 14B shows a performance characteristic of a single electron transistor.

For example, when the single electron transistor already has N electrons in the conductor island and energy $\Delta E$ ($N\rightarrow N-1$) (this may be called the work done by the system in the tunnel) involved when the number of electrons in the conductor island becomes N−1 as the electrons tunnel the small tunnel junction becomes large to lose energy ($\Delta E(N\rightarrow N-1)>0$), the coulomb blockade is caused. When there is a gain in terms of energy ($\Delta E(N\rightarrow N-1)<0$), the coulomb blockade is not caused. This coulomb blockade can be adjusted by the gate voltage. As a result, gate voltage and drain current characteristics can be obtained as shown in FIG. 14B, and the operation of a switching element can be achieved by using the presence or not of the coulomb blockade.

A compound semiconductor which combines gallium arsenide or the like is often adopted as a material for the single electron transistor proposed to the present (e.g., Japanese Patent Laid-Open Publication No. Hei 9-139491). Metal may also be adopted. For example, the quantum dot and the small tunnel junction are typically manufactured by oxidizing a titanium ultra thin film (to 3 nm) by using STM needle. By adopting such materials, a very fine control processing far finer than in the photolithography process (processing accuracy of about 100 nm) used for minute processing by the silicon process today.

However, when considering mounting the single electron transistor together with silicon CMOS integrated circuit in the same chip by the prior art, it is necessary to make silicon and the compound semiconductor layer in the same chip. However, there are problems that the process is complex, and contamination by impurities occurs easily. Thus, it is not possible to realize easily. When the STM or the like is used, throughput is extremely bad and it cannot be put to practical use.

Therefore, the present invention provides a novel single electron transistor which can be formed easily by the silicon process as described in the following embodiments.

Embodiment 4-1

Embodiment 4-1 uses in the aforesaid single electron semiconductor device a silicon needle conic body formed to protrude on the substrate as the propagation route for a single or a small number of electrons, namely as the quantum dot (a region with a size of the order of nanometers where the electrons are easy to exist) in the single electron semiconductor device. The silicon needle conic body can be formed by using the impurity precipitation region formed in the single crystal silicon substrate or the single crystal silicon layer as the micro mask and performing the high selectivity anisotropic etching of the silicon substrate or the silicon layer with the micro mask used as the top. The silicon needle conic body formed on the aforesaid principle is a needle conic body with a very small leading end having a radius of curvature of several nm to ten or more nm in the vicinity of the leading end.

Figure 15A:
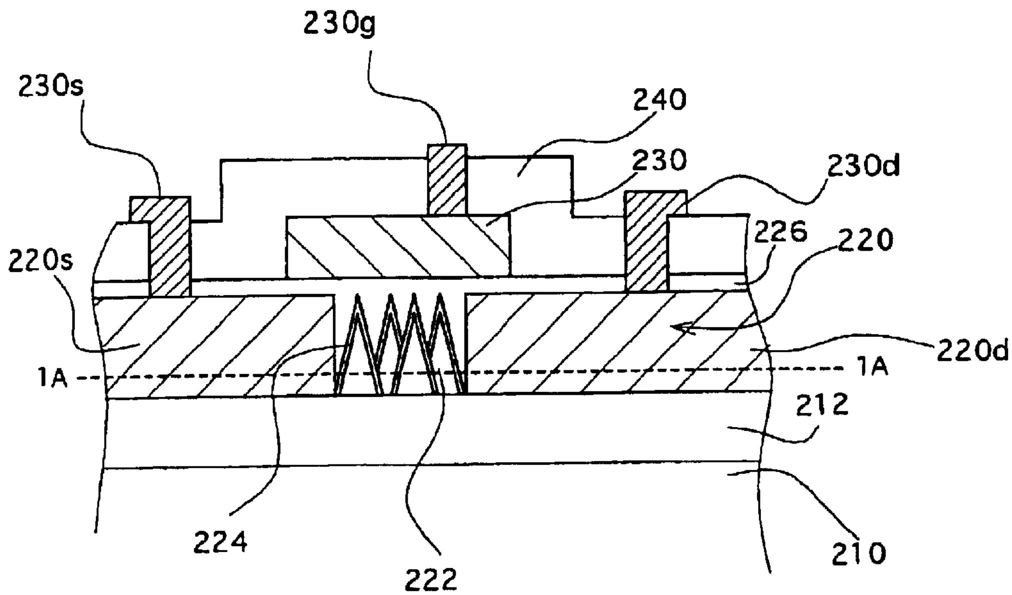
FIGS. 15A and 15B show a structure of the single electron transistor according to Embodiment 4-1 of the present invention.
Figure 15B:
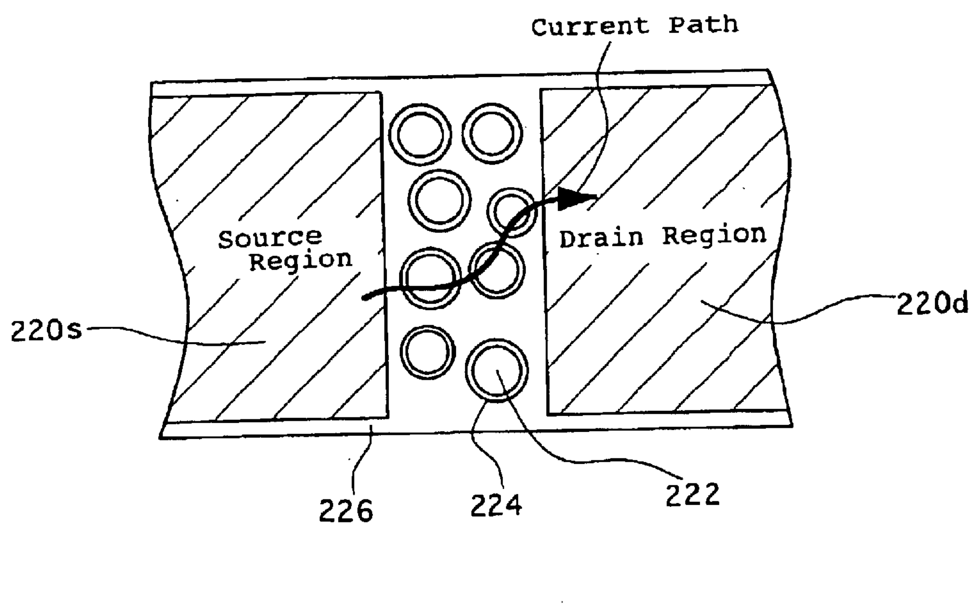

FIGS. 15A and 15B show a single electron transistor according to Embodiment 4-1. FIG. 15A shows a sectional structure, and FIG. 15B shows a planar structure of the same transistor taken along dotted line 1A—1A of FIG. 15A. In FIGS. 15A and 15B, an embedding oxide film 212 and a thin single-crystal silicon layer 220 are formed on a silicon substrate 210 to form an SOI (silicon on insulator) structure. The thin single-crystal silicon layer 220 is used to densely form a plurality of silicon needle conic bodies 222 and also used to closely form a source region 220*s* and a drain region 220*d* horizontally with a group of silicon needle conic bodies intervened therebetween. The plurality of silicon needle conic bodies 222 have a height of about 10 nm, and each of the silicon needle bodies 222 functions as an independent quantum dot. The spaces between the plurality of silicon needle conic bodies 222, between the source region 220*s* and the silicon needle conic body 222 and between the drain region 220*d* and the silicon needle conic body 222 function as the small tunnel junction.

In Embodiment 4-1, the silicon needle conic bodies 222 are densely and closely formed between the source region 220*s* and the drain region 220*d* so that the electrons can tunnel between the conic bodies 222. The space between the silicon needle conic bodies 222 formed between the source region 220*s* and the drain region 220*d* is buried with an insulation layer such as an oxide film 226 or the like, and a gate electrode 230 for controlling the potential which uses polysilicon or the like as a conducting material is formed above the region where the silicon needle conic bodies 222 are formed. A gate terminal 230*g* of aluminum or the like is connected to the gate electrode 230 through a contact hole. Similarly, a source terminal 230*s* of aluminum is connected to the source region 220*s* through a contact hole, and a drain terminal 230*d* of aluminum is also connected to the drain region 220*d* through a contact hole.

One example method for manufacturing the single electron transistor according to Embodiment 4-1 will be described in further detail with reference to FIGS. 16A to 16H.

(a) The whole surface of the single-crystal silicon layer on the SOI substrate is oxidized, the oxide film is wet etched with hydrofluoric acid to make the silicon layer 220 thinner so to form the thin single-crystal silicon layer 220 having a thickness of about 10 nm to 15 nm on the SOI substrate. See FIG. 16A.

(b) A resist is applied to the thin single-crystal silicon layer 220, an opening is formed to provide a region where the silicon needle conic body is formed by photolithography, and oxygen is implanted as the impurity (a dose of $1\times10^{15}$ $cm^{-2}$ to $1\times10^{16}$ $cm^{-2}$, and acceleration energy of 30 keV). The dose of oxygen is preferably adjusted to a high concentration at a level so that the plurality of silicon needle conic bodies are closely arranged so to allow the electrons to tunnel between them. See FIG. 16B.

Figure 16A:
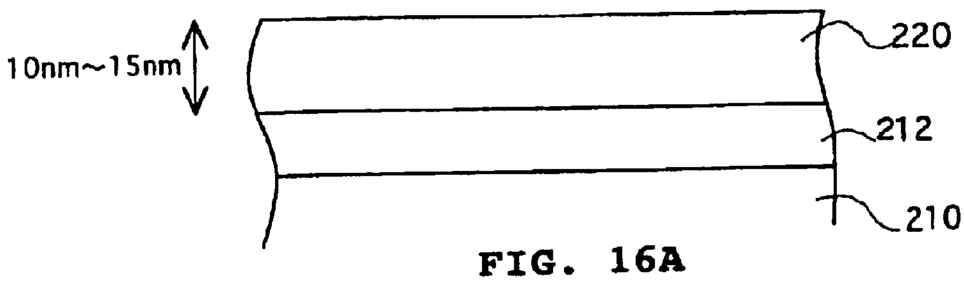
FIGS. 16A, 16B, 16C, 16D, 16E, 16F, 16G and 16H are diagrams for illustrating a process of the manufacturing method for the single electron transistor according to Embodiment 4-1 of the present invention.
Figure 16B:
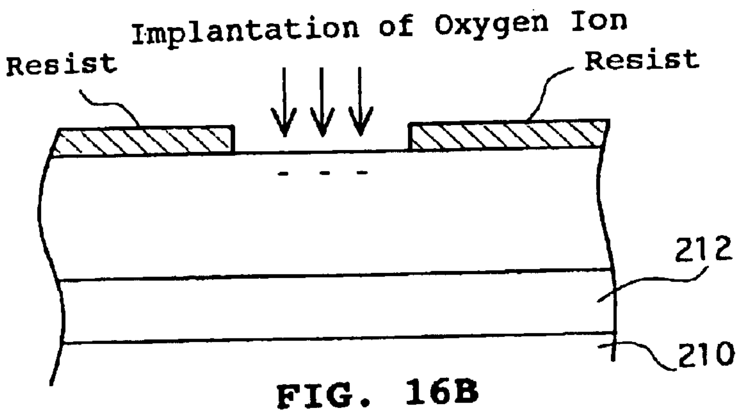
Figure 16C:
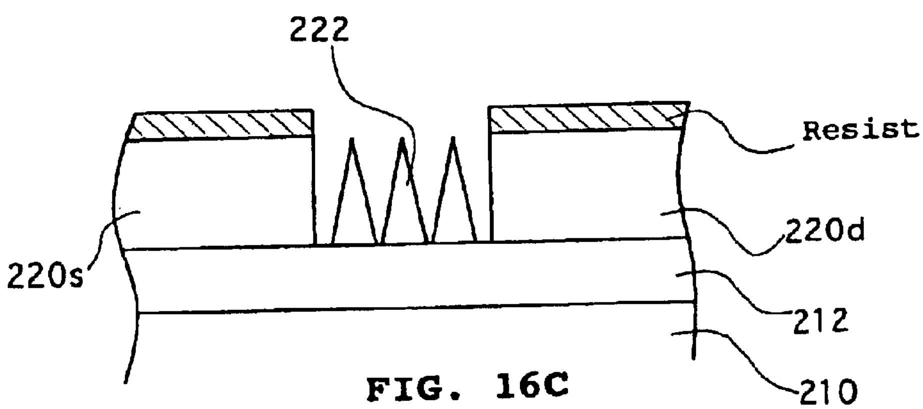
Figure 16D:
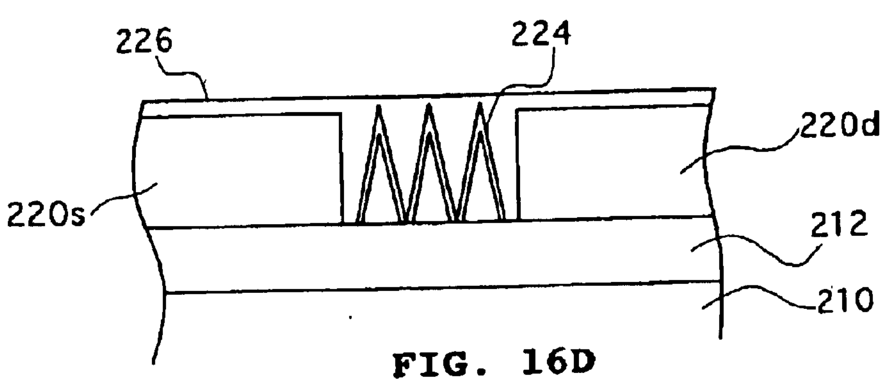
Figure 16E:
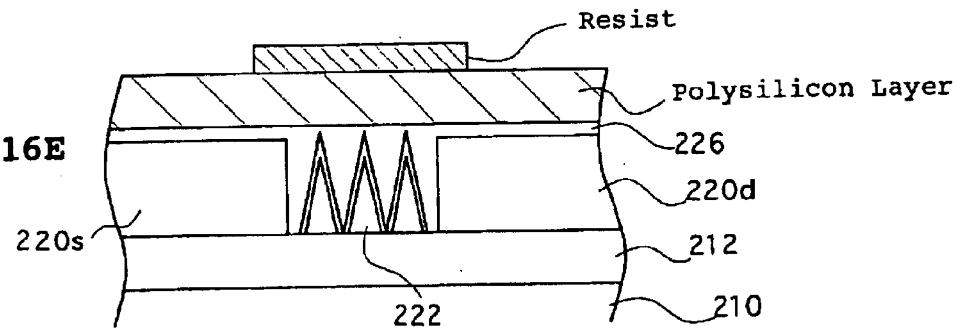
Figure 16F:
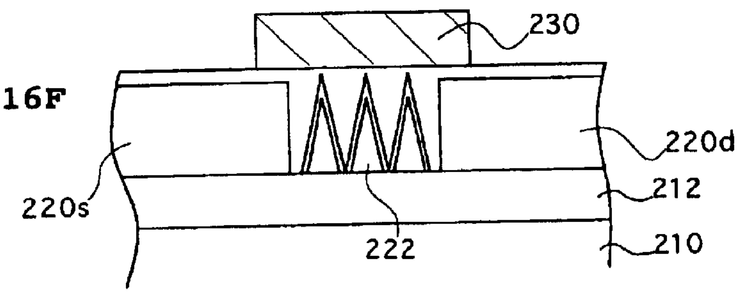

(c) After implanting the oxygen ion, the substrate is annealed, and after the annealing, high selectivity dry etching by which $SiO_2$ produced by the bonding and precipitation of Si and the implanted oxygen atom by the annealing is not easily etched by 100 times or more is performed on Si crystal as the main component of the single-crystal silicon layer 220. Using high selectivity anisotropic etching, the oxygen precipitate $SiO_2$ not as easily etched as the Si crystal becomes the micro mask, and the silicon needle conic bodies 222 are formed on the etching exposed surface with the mask used as the top. The anisotropic etching preferably uses halogen-based mixture gas (e.g., $HBr/NF_3/He+O_2$ mixture gas) when the etching is performed by using the general RIE device with the oxygen precipitation region in the silicon substrate or the silicon film used as the micro mask. The halogen-based etching gas has its etching selectivity enhanced to become higher in order of F, Cl and Br to the oxygen precipitation region (precipitation defect) in the silicon, so that the Br-based gas is most preferable and order of Cl and F comes next to securely form the needle conic body by the anisotropic etching. It is considered that when the RIE is performed, a protective film of the reaction product and the like is adhered to the sidewall of the cone to serve for retaining the conic body, but this protective film is removed by immersing the substrate 210 into, for example, diluted hydrofluoric acid after performing the anisotropic etching. Thus, by performing the anisotropic etching under the conditions described above, the conic bodies, or cones here, are formed with the oxygen precipitation region used as the top. The method for manufacturing the cone is not limited to the method described above. The region covered with the resist to intervene the opening serves to remain the thin single-crystal silicon layer 220 without being etched when the silicon needle conic body 222 is formed, and the source region 220*s* and the drain region 220*d* are formed to intervene the conic bodies 220 when the silicon needle conic bodies 222 are formed as can be seen in FIG. 16C.

(d) After forming the silicon needle conic bodies 222, the resist is removed, the thermal oxidizing treatment is performed to oxidize the surface (sidewall) of the silicon needle conic bodies 222 so to form a thermal oxidation film 224 on the surface of the sidewall of the conic bodies. Then, the opening around the silicon needle conic bodies 222 is buried by plasma CVD (chemical vapor deposition), and an oxide film 226 is formed to cover the source region 222*s* and the drain region 220*d*, as can be seen from FIG. 16D.

(e) Polysilicon is deposited as a conducting material to a thickness of 30 nm on the oxide film 226 to form a polysilicon layer. Then, a resist is applied to the polysilicon layer, and the resist is removed excepting the region above the silicon needle conic bodies 222 by photolithography, as can be seen from FIG. 16E.

(f) The polysilicon layer is etched (e.g., dry etching) with the resist formed in (e) above used as the mask. Then, phosphor (P) is introduced as the impurity into the remained polysilicon layer and the source region 220*s* and the drain region 220*d* of the thin single-crystal silicon layer remained on the sides of the silicon needle conic bodies 222. Thus, the gate electrode 230 of the polysilicon and the source and drain regions 220*s*, 220*d* of the single-crystal silicon can be enhanced to have sufficiently high conductivity, as can be seen from FIG. 16F.

Figure 16G:
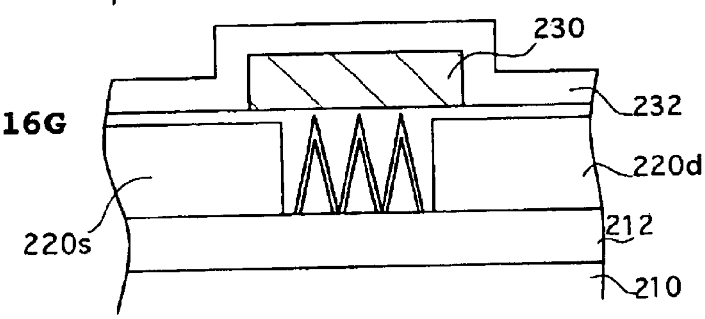

(g) After introducing the impurity, an oxide film 232 is deposited to a thickness of about 800 nm by plasma CVD so to fully cover the gate electrode 230, the source region 220*s* and the drain region 220*d*, as can be seen from FIG. 16G.

(h) To form terminals for applying a predetermined signal to the source region 220*s*, the drain region 220*d* and the gate electrode 230, corresponding positions of the oxide film 232 are etched by dry etching or the like to form contact holes. Aluminum is then sputtered, a resist is formed on a wiring pattern region by photolithography, and wiring is formed by dry etching. Thus, the source terminal 230*s* is connected to the source region 220*s* through the contact hole, the drain terminal 230*d* is connected to the drain region 220*d*, and the gate terminal 230*g* is connected to the gate electrode 230.

In the single electron transistor obtained according to Embodiment 4-1, an electric field in the vicinity of the source region 220*s*, the drain region 220*d* and the region where the silicon needle conic bodies 222 are formed by the gate electrode 230 is controlled. Thus, the silicon needle conic bodies 222 are functioned as the quantum dots to block tunneling by the electron in the small tunnel junction present between the source and the drain or to release the blockade, thereby enabling exhibition of the single electron effect.

For example, as shown in FIGS. 15A and 15B, when the plurality of silicon needle conic bodies 222 are formed between the source region and the drain region to form the plurality of quantum dots and the plurality of small tunnel junctions between the source region and the drain region, the propagation of a single or a small number of electrons between the source region and the drain region is prohibited by controlling the applied voltage (particularly between the gate terminal and the drain terminal) so to have the condition that the tunneling of the electrons can be blocked in any of the small tunnel junctions. When it is conditioned to allow the release of the coulomb blockade in all the small tunnel junctions, a single or a small number of electrons can be propagated between the source region and the drain region.

Figure 16H:
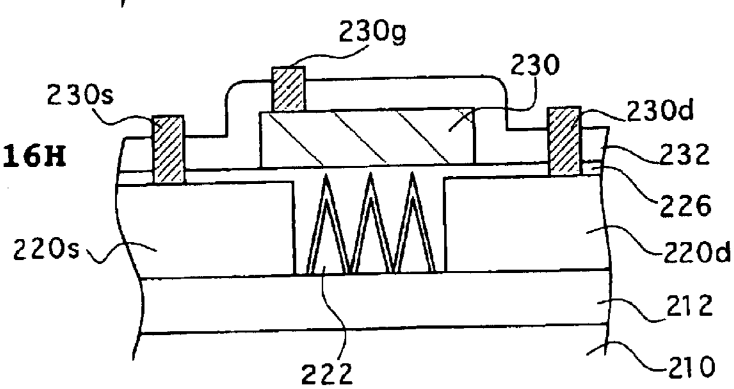

The number of silicon needle conic bodies 222 formed between the source region and the drain region is not particularly specified when they are closely formed so to allow the electrons to make tunneling. Also, when the silicon needle conic bodies 222 are closely arranged to allow tunneling, they may be arranged in the shape of a grid or may be arranged randomly as shown in FIG. 15B. The plurality of silicon needle conic bodies 222 may also be arranged in a row between the source and the drain, namely along the direction that an electric current flows, as shown in FIG. 16H. Further, when a single silicon needle conic body 222 is formed between the source region and the drain region, the single electron effect can be developed if the silicon needle conic body 222 is formed close enough to the source and the drain.

The gate electrode 230 is not limited to one made of polysilicon, but may be of a metallic material such as aluminum.

The silicon needle conic body 222 of the present invention can be formed, for example, by using as the micro mask the oxygen precipitate ($SiO_2$) which was introduced by implanting the ion into the single-crystal silicon and thermally treating, so that the mask obtained is smaller than one which can be formed by photolithography. Thus, the silicon needle conic body 222 having a size enough to function as the quantum dot having a very steep shape and a sharp leading end can be formed by the high selectivity anisotropic etching. When a plurality of impurity precipitation regions are respectively used as the micro masks under the same conditions for the high selection anisotropic etching, a plurality of silicon needle conic bodies obtained have a constant base angle on the same substrate and the same shape. Accordingly, by forming the impurity precipitation region so that the impurity precipitation region is formed on a predetermined plane at a predetermined depth, a plurality of silicon needle conic bodies 222 having the same sharp shape and size can be formed in a predetermined position of the silicon substrate or the silicon layer. The density of forming the silicon needle conic bodies 222 can be controlled by adjusting the amount of oxygen implanted into the thin single-crystal silicon layer 220.

Figure 17A:
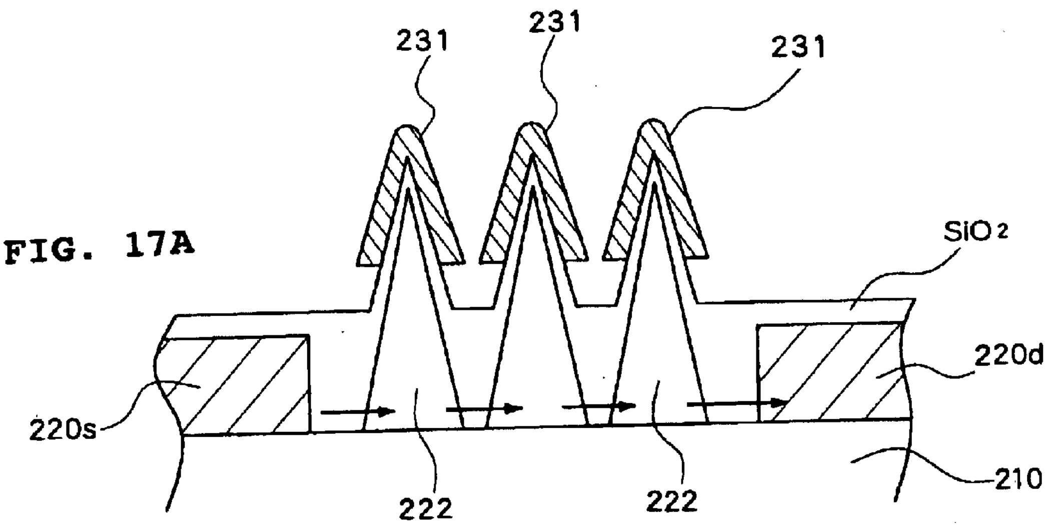
FIGS. 17A, 17B and 17C are diagrams showing another structure of the single electron transistor according to Embodiment 4-1 of the present invention.
Figure 17B:
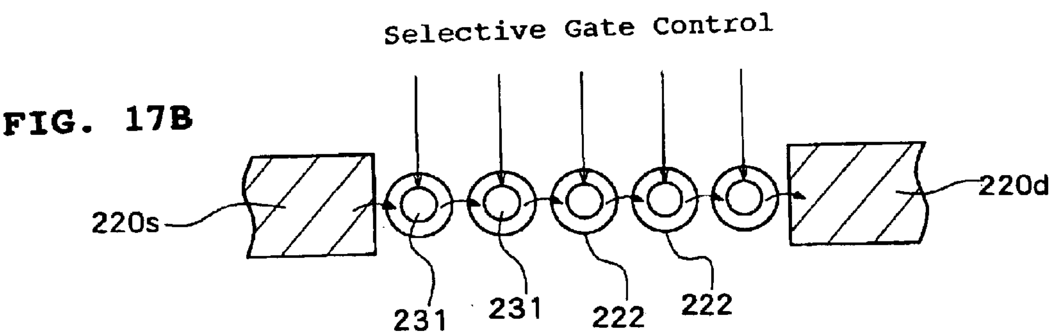
Figure 17C:
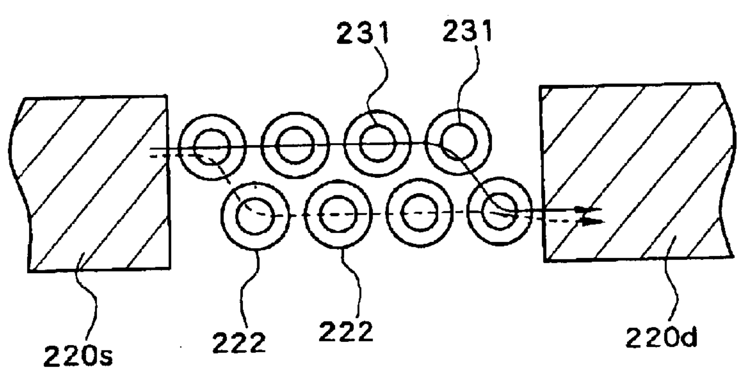

In the above description, the plurality of silicon needle conic bodies 222 are controlled by the common gate electrode 230, but the gate electrode may comprise separate electrodes corresponding to the individual needle conic bodies 222. For example, as shown in FIG. 17A, separate gate electrodes 231 may be formed above the plurality of silicon needle conic bodies 222, which are formed between the source region and the drain region, with an oxide film ($SiO_2$) intervened therebetween to configure the single electron transistor. In the same way as in Embodiment 4-1, the individual silicon needle conic bodies 222 function as the quantum dot between the source region 220*s* and the drain region 220*d*. Therefore, it is necessary to form the silicon needle conic bodies 222 closely sufficient to enable the tunneling of the electrons between the closely adjacent conic bodies. The silicon needle conic bodies 222 may be arranged in a random fashion between the source region 220*s* and the drain region 220*d* as shown in FIG. 15B or may be arranged in a straight line as shown in the plan diagram of FIG. 17B. Besides, a plurality of rows may be arranged regularly between the source region 220*s* and the drain region 220*d* as shown in FIG. 17C. In such arrangements, the separate gate electrode 231 is provided for each of the silicon needle conic bodies 222, so that by sequentially controlling the individual gate electrodes 231, the electrons can be tunneled, for example, from the silicon needle conic body 222 closest to the source region 220*s* to the next silicon needle conic body 222 positioned on the side of the drain region 220*d*. As shown in FIGS. 15B and 17C, when the plurality of silicon needle conic bodies 222 are arranged two-dimensionally, the silicon needle conic bodies 222 to be functioned as the quantum dots between the source region 220*s* and the drain region 220*d* can be selected as desired. Therefore, the electron propagation route can be determined as desired (see a dotted line in FIG. 17C). The individual gate electrodes 231 may be formed so to correspond with the silicon needle conic bodies 222 in pairs as shown in FIGS. 17A, 17B and 17C. But, a single gate electrode 231 may be corresponded with two or more and not more than a predetermined number of silicon needle conic bodies 222 so that the plurality of individual gate electrodes 231 separately control the coulomb blockade between the source region and the drain region.

Embodiment 4-2

Figure 18:
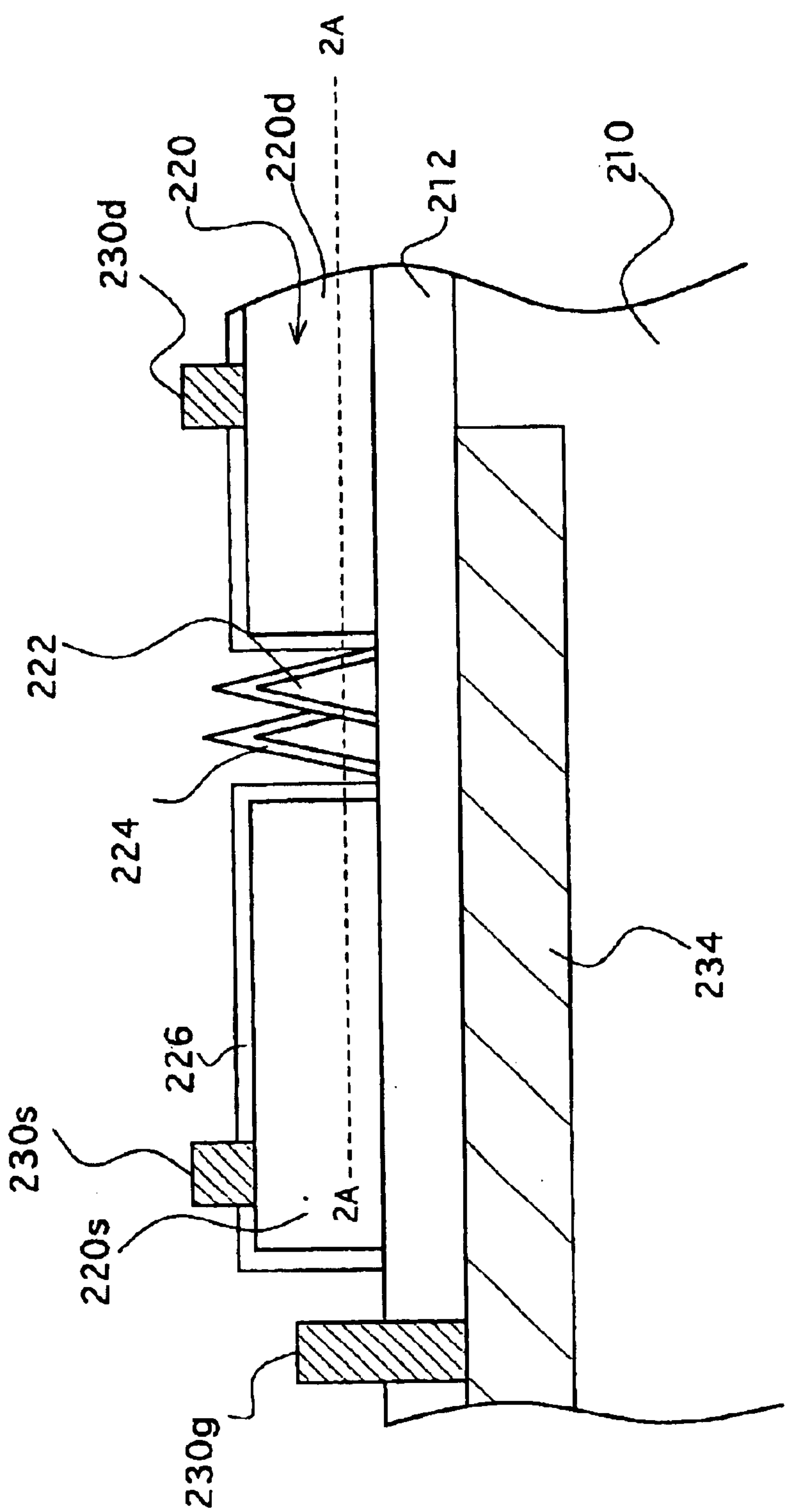
FIG. 18 is a diagram showing a structure of the single electron transistor according to Embodiment 4-2 of the present invention.

FIG. 18 shows a schematic structure of the single electron transistor according to Embodiment 4-2. The planar structure taken along dotted line 2A—2A of FIG. 18 is the same as in FIG. 15B. A difference from Embodiment 4-1 is that the gate electrode as an electrode for controlling the potential in the electron propagation route between the source region 220*s* and the drain region 220*d* is formed in the silicon substrate 210. This gate electrode uses a layer 234 which is formed by implanting a high concentration of the impurity into a region immediately below the silicon needle conic body of the silicon substrate 210 below the embedding oxide film. The high-concentration impurity implanted layer 234 may be a layer formed by implanting either a donor impurity of arsenic and phosphorus or an acceptor impurity such as boron if it has a sufficiently low resistance as the gate electrode and a characteristic between the high concentration impurity implanted layer 234 and wiring using aluminum or the like becomes ohmic.

The device of Embodiment 4-2 has occupies a larger area than that of Embodiment 4-1, but it is used easily as the quantum dot, even if the silicon needle conic body 222 is somewhat large. In other words, even when the silicon needle conic body 222 as a whole is too large to be said as the quantum dot, e.g., a radius in the vicinity of the bottom is 30 nm or more, the silicon needle conic body 222 is depleted from the bottom by applying a voltage to the high-concentration impurity layer 234 which is the gate electrode, so that the electrons can be enclosed in the leading end (5 nm to 10 nm) of the silicon needle conic body 222, and the leading end of the silicon needle conic body 222 functions as the quantum dot. The device of Embodiment 4-2 is easily produced as compared with Embodiment 4-1 but has a large occupation area than in Embodiment 4-1. Similar to the single electron transistor shown in FIGS. 17A, 17B and 17C, the impurity implantation layer 234 may be formed so that separate gate electrodes correspond to the individual silicon needle conic bodies 222 (or every predetermined number of silicon needle conic bodies 222).

Embodiment 5-1

Figure 19A:
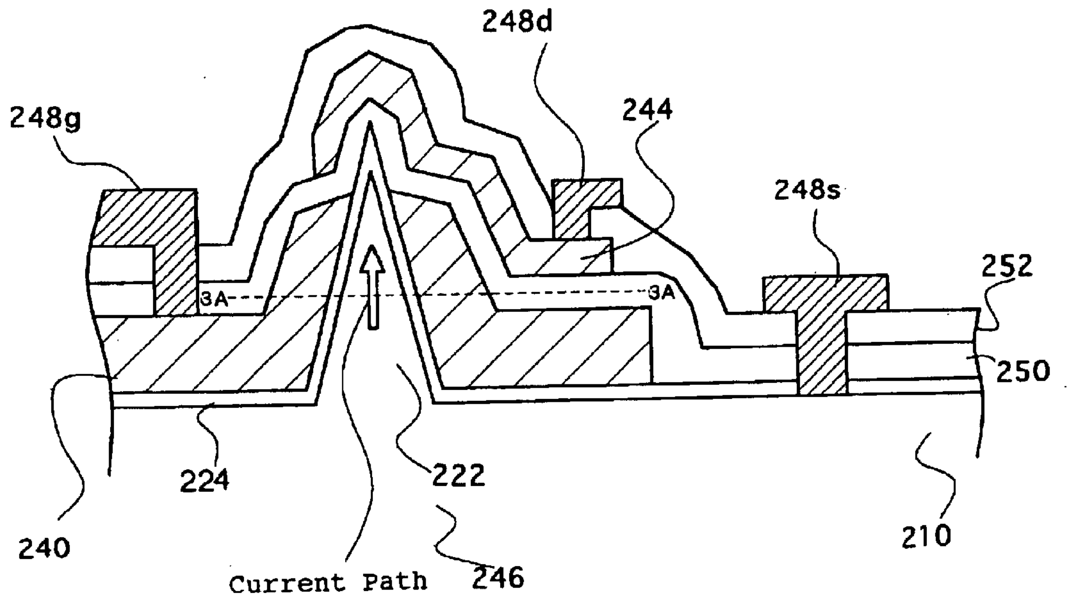
FIGS. 19A and 19B show a structure of the single electron transistor according to Embodiment 5-1 of the present invention.
Figure 19B:
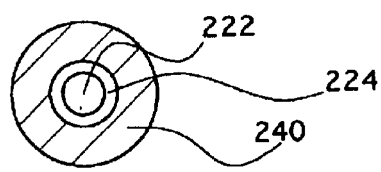

FIGS. 19A and 19B show a structure of the single electron transistor according to Embodiment 5-1. FIG. 19A shows a sectional structure of the single electron transistor, and FIG. 19B shows a planar structure taken along dotted line 3A—3A of FIG. 19A. Embodiment 5-1 is the same as Embodiments 4 on the point that the silicon needle conic body is used for the electron propagation route, but Embodiment 5-1 configures the quantum dot and the small tunnel junction in a single silicon needle conic body and determines a vertical direction, namely a height direction of the silicon needle conic body, as the electron propagation direction. FIGS. 19A and 19B show a three-terminal element which has the inside of a single silicon needle conic body as a channel, the bottom of the silicon needle conic body as the source region, the leading end as the drain region and the periphery as the gate electrode.

The silicon needle conic body 222 is obtained by the high selectivity anisotropic etching of the silicon substrate 210 on the same principle as the method described in Embodiment 4-1, but Embodiment 5-1 uses an n-type conductive silicon substrate as the substrate 210. A substrate having the impurity such as phosphorus introduced so that only the surface region of the substrate 210 on which the silicon needle conic body 222 is formed may be used.

The thermal oxidation film 224 is formed on the sidewall of the silicon needle conic body 222, and the gate electrode 240 of polysilicon is formed on the substrate 210 so to bury the lower region of the conic body 222 through the oxide film 224. Also, the drain region 244 of polysilicon is formed above the leading end of the silicon needle conic body 222 protruded from the gate electrode 240 with an oxide film 250 intervened therebetween. The lower region of the silicon needle conic body 222 is a source region 246.

With this configuration, when a negative voltage is applied to the gate electrode 240, the silicon needle conic body 222 is depleted from its sidewall toward the inside, and an n-type quantum wire is formed at the core of the conic body 222. The silicon needle conic body 222 used in Embodiment 5-1 often has a radius of 10 nm or more excepting its leading end, but the quantum wire of the order of several nanometers is obtained on the conic body 222 by the electric field control by the gate electrode 240 from the circumference of the conic body. Therefore, when a (negative) gate voltage lower than the gate voltage when the quantum wire is formed is applied, the single electron effect as shown in FIG. 14B, namely coulomb blockade of the electron, occurs in the quantum wire region.

Here, the thermal oxidation film 224 and the oxide film 250 are formed between the leading end of the silicon needle conic body 222 and the drain region 244 connected to a drain terminal 248*d*. The silicon needle conic body 222 has a radius of about 5 nm at the leading end, and this region, to which a very high electric field is applied, easily suffers from an electrical breakdown. Therefore, electrical conduction between the leading end of the silicon needle conic body 222 and the drain region 244 is secured by the electrical breakdown in the vicinity of the leading end of the conic body.

A method for manufacturing the single electron transistor of Embodiment 5-1 will be described with reference to FIGS. 20A to 20H.

Figure 2:
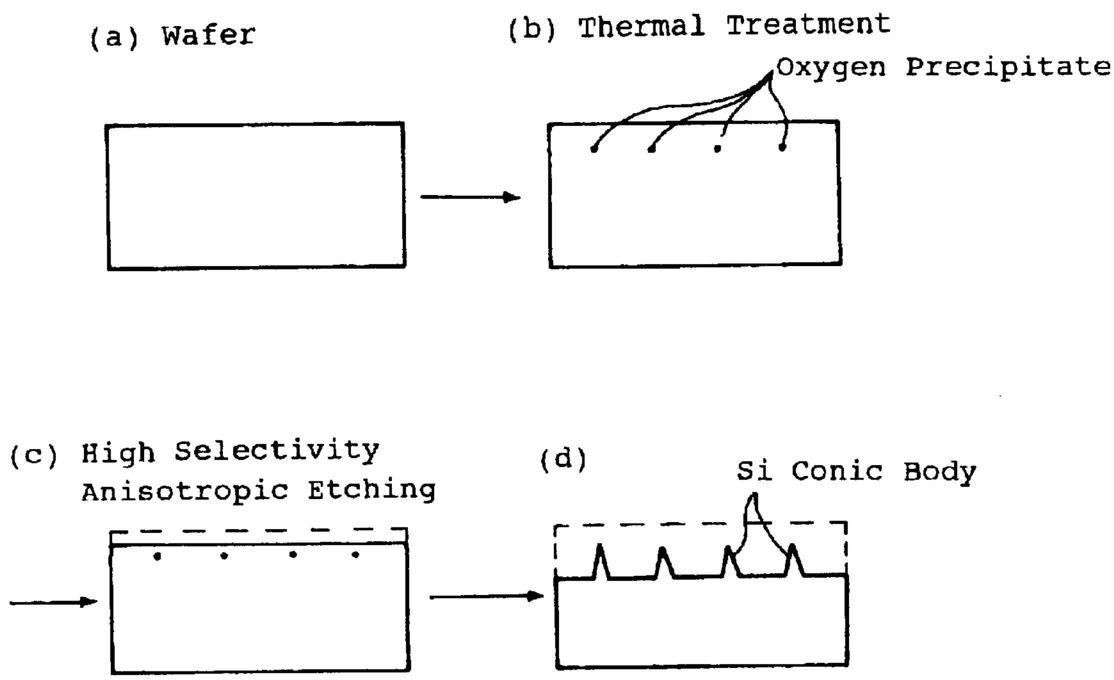
FIG. 2 shows schematically a principle of forming a conic body of the present invention.

(a) oxygen is introduced as the impurity on the basis of the principle of FIG. 2 into a predetermined position of the silicon substrate 210, which indicates n-type conductivity in a region from at least the surface to a depth deeper than 3 $\mu$m from the surface, and thermal treatment is performed to form an oxygen precipitate so to obtain a micro mask. Then, the high selectivity anisotropic etching of the substrate 210 is performed to form an n-type conductive silicon needle conic body 222 with the micro mask used as the top. Next, thermal treatment is performed to thermally oxidize the surface of the silicon needle conic body 222 and the etching exposure surface of the silicon substrate 210 to form the thermal oxidation film 224 of about 20 nm. The silicon needle conic body 222 protruded from the silicon substrate 210 is not specified to have a particular height but has a height of about 3 $\mu$m in Embodiment 5-1, as can be seen from FIG. 20A.

Figure 20A:
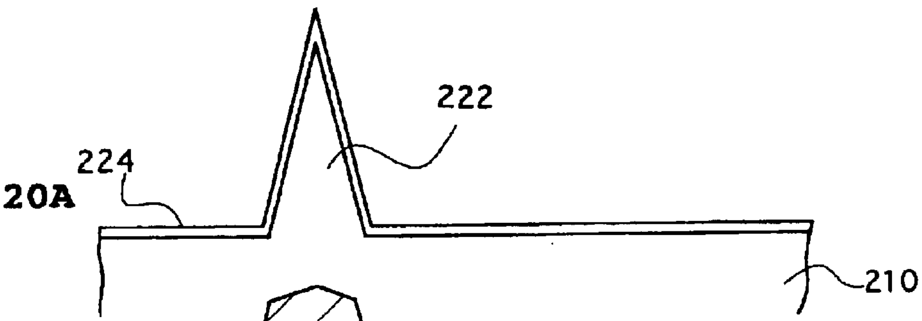
FIGS. 20A, 20B, 20C, 20D, 20E, 20F, 20G and 20H are diagrams showing a process of the manufacturing method for the single electron transistor according to Embodiment 5-1 of the present invention.
Figure 20B:
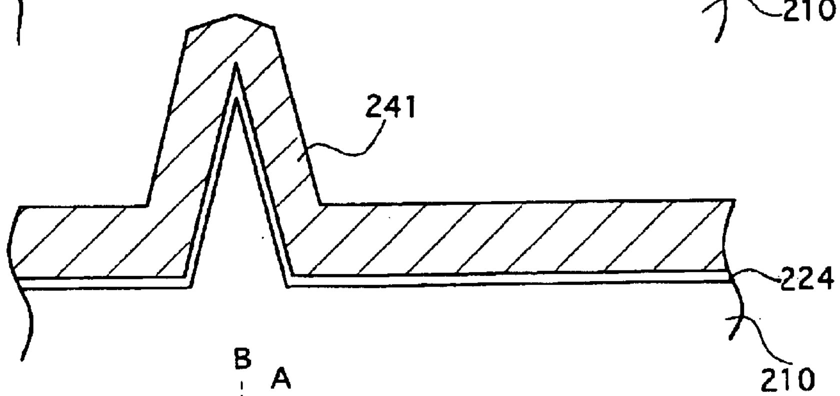
Figure 20C:
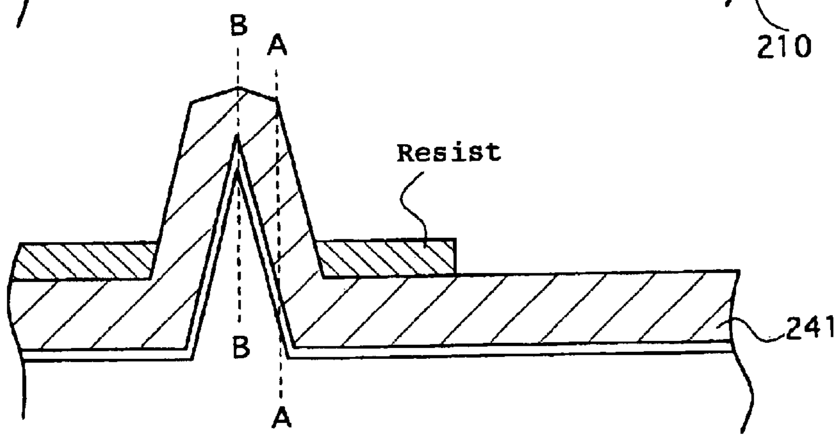
Figure 20D:
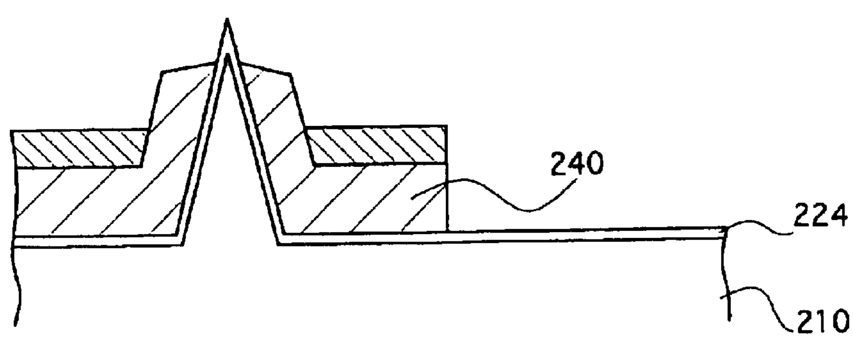

(b) By a low pressure CVD method, the polysilicon layer 241 having a thickness of about 50 nm is formed to cover the silicon substrate 210 and the silicon needle conic body 222 which had the surfaces thermally oxidized, as can be seen from FIG. 20B.

(c) A resist is applied to the polysilicon layer 241, the electron beam lithography is used to expose it, and the resist is removed from the region other than the region where the gate electrode is to be formed. Here, the polysilicon layer 241 has a thickness of 50 nm and is formed to cover the silicon needle conic body, so that the silicon needle conic body portion (the polysilicon layer deposited on the silicon needle conic body and its sidewall) has a diameter of about 100 nm. And, this region having a diameter of about 100 nm is traced by electron beam lithography to perform resist processing to selectively remain the resist on the outer periphery of the region, as can be seen from FIG. 20C.

(d) With the patterned resist used as the mask, dry etching is performed under the condition that the polysilicon is etched easier than the oxide film 224. This etching removes the polysilicon layer 241 which is not covered with the resist on the plane surface of the silicon substrate. The polysilicon layer 241 is etched because the region where the silicon needle conic body 222 is formed is not covered with the resist. However, as the polysilicon layer 241 is thicker in the vertical direction than at the position of line B—B in FIG. 20C because the sidewall effect at the position of line A—A, the polysilicon layer 241 having covered the leading end of the silicon needle conic body 222 is selectively removed by controlling the etching duration, so that the polysilicon layer 241 can be remained around the conic body 222. By etching as described above, the gate electrode 240 of the polysilicon is formed to bury the lower region of the silicon needle conic body 222, as can be seen from FIG. 20D.

Figure 20E:
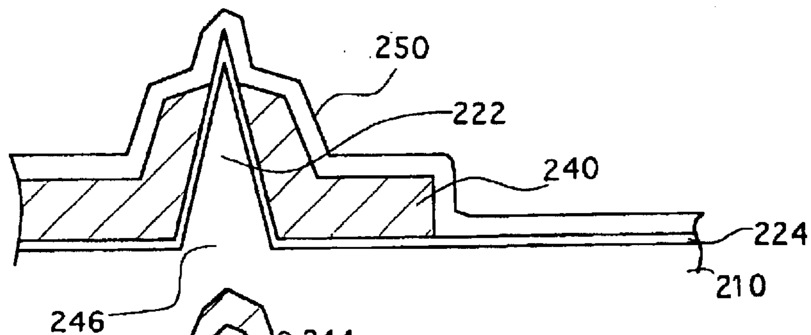
Figure 20F:
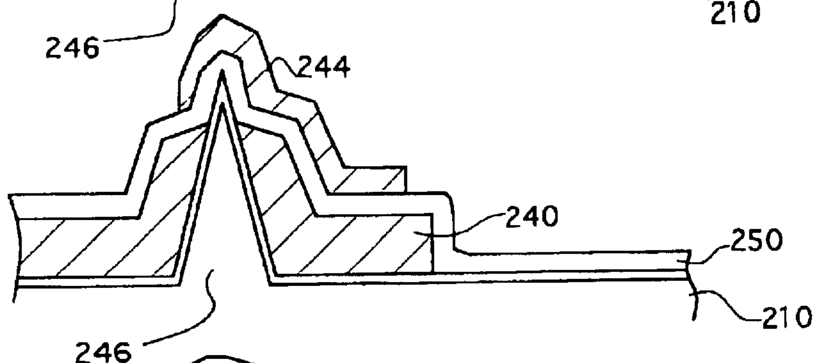

(e) A CVD silicon oxide film 250 of about 20 nm is formed by a plasma CVD method and used to cover the gate electrode 240, the leading end of the silicon needle conic body 222 protruded from the gate electrode 240 and the surface of the substrate (oxide film 224), as can be seen from FIG. 20E.

(f) After forming the oxide film 250, a polysilicon layer having a thickness of about 50 nm is deposited on it by the low pressure CVD method. Then, the polysilicon layer is dry etched to form a pattern so that the region corresponding to the leading end of the silicon needle conic body 222 is remained. Thus, the drain region 244 of polysilicon is formed in the region corresponding to the leading end of the silicon needle conic body 222, as can be seen from FIG. 20F.

Figure 20G:
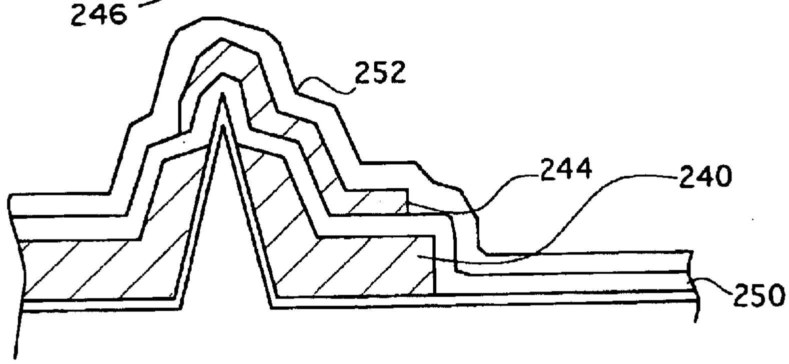
Figure 20H:
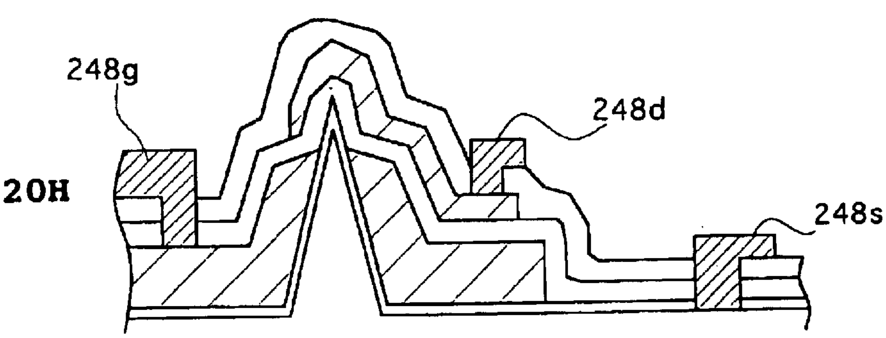

(g) After forming the drain region 244, a silicon oxide film 252 of about 20 nm is formed on the entire surface including the drain region 244 by the plasma CVD method, as can be seen from FIG. 20G.

(h) After forming the oxide film 252, dry etching is performed to expose the respective surfaces for connection with the source region 246, connection with the gate electrode 240 and connection with the drain region 244, thereby forming contact holes in required positions. Then, aluminum is sputtered, and the aluminum layer is patterned by the dry etching to form a source terminal 248*s*, a drain terminal 248*d* and a gate terminal 248*g*.

The single electron transistor of Embodiment 5-1 obtained as described above can confine electrons within the core of the silicon needle conic body 222, so that the single electron effect can be developed, by applying a negative high voltage as the gate voltage even when the sectional size of the bottom of the silicon needle conic body 222 has a diameter of about 100 nm. Thus, the single electron transistor which makes the silicon needle conic body 222 function as the quantum wire can be achieved. The structure of Embodiment 5-1 has an advantage that integration is easy as compared with the device having the quantum wire formed in the planar direction of the substrate because it becomes a single electron transistor which flows an electric current in a height direction (vertical direction) of the silicon needle conic body 222.

Embodiment 5-2

Figure 21:
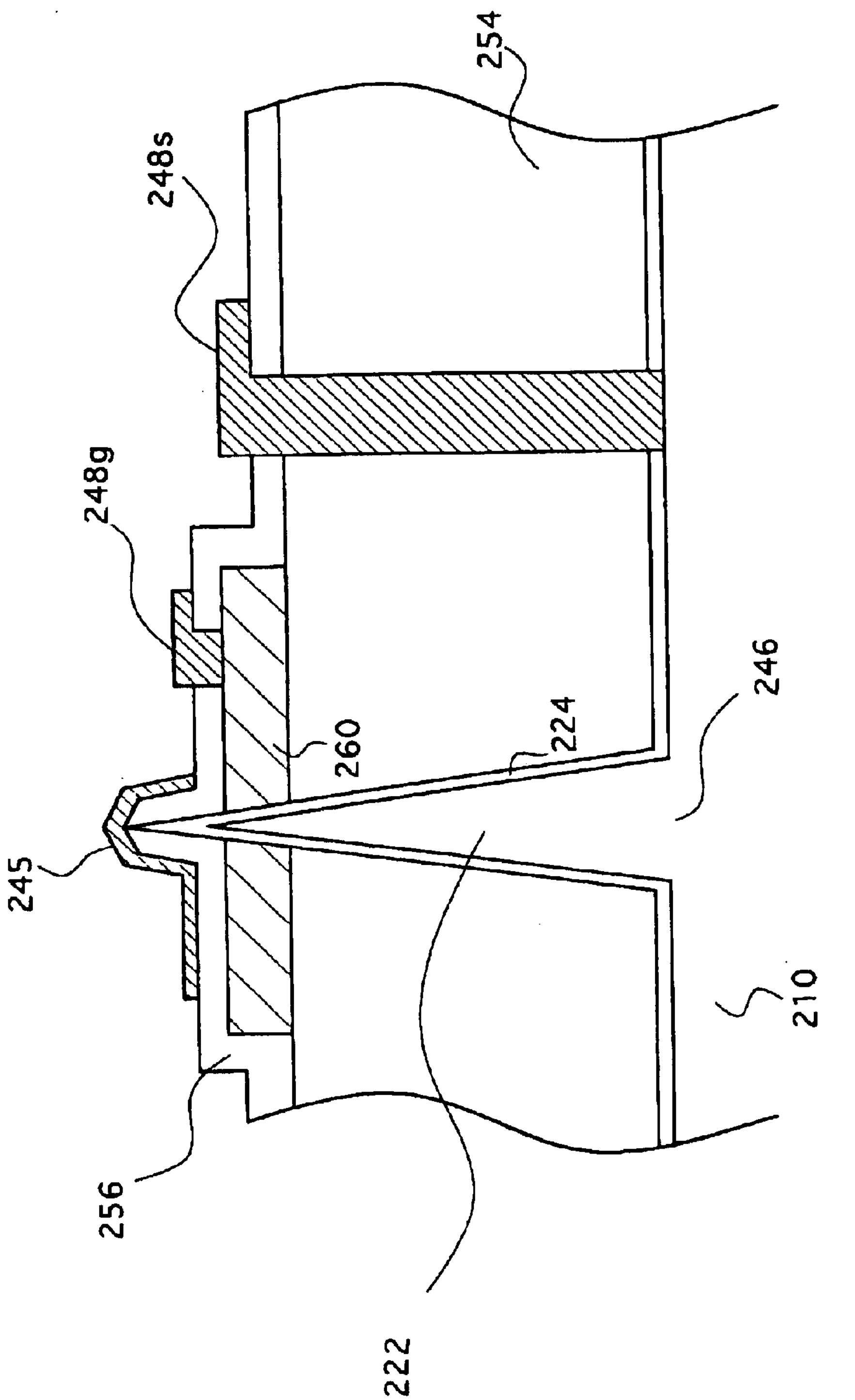
FIG. 21 is a diagram showing a structure of the single electron transistor according to Embodiment 5-2 of the present invention.

FIG. 21 shows a structure of the single electron transistor according to Embodiment 5-2. The structure of flowing an electric current to between the bottom and the leading end of the silicon needle conic body 222 is the same as in Embodiment 5-1, but Embodiment 5-2 forms a gate electrode 260 using polysilicon only around the leading end of the needle. In Embodiment 5-2, in order to have the position where the gate electrode 260 is formed in the vicinity of the leading end of the conic body, a thick oxide film (e.g., CVD silicon oxide film) 254 is formed on the silicon substrate 210 having its surface thermally oxidized so to bury the silicon needle conic body 222 up to the vicinity of its leading end. The gate electrode 260 of polysilicon is formed around the leading end of the silicon needle conic body 222 further protruded from the oxide film 254. The gate electrode 260 is covered with the oxide film (e.g., CVD silicon oxide film) 256, and the drain region 245 is formed to cover the region above the leading end of the silicon needle conic body 222 on the oxide film 256. The drain region 245 in Embodiment 5-2 also serves as the drain terminal and uses aluminum as the material. It may also be polysilicon in the same way as in Embodiment 5-1. A gate terminal 248*g* of aluminum is connected to the gate electrode 260 through a contact hole formed in the oxide film 256, and the source region 246 in the silicon substrate 210 is connected to the source terminal 248*s* of aluminum through contact holes formed in the thermal oxidation film 224 and the oxide films 254 and 256.

The silicon needle conic body 222 formed with the impurity precipitation region used as the micro mask according to the present invention has the leading end with a radius of about 2 nm to 5 nm and can function as the quantum wire without depleting.

Therefore, by forming the gate electrode 260 in the vicinity of the leading end of the conic body 222 as in Embodiment 5-2, a bias voltage for depleting the silicon needle conic body 222 is not required, and the single electron effect can be developed regardless of a range of the gate voltage (in the whole range of the applicable gate voltage). However, it is necessary that the gate electrode 260 be securely formed in the vicinity of the leading end of the silicon needle conic body 222 and a short-circuit shall be prevented between the gate electrode 260 and the drain region 245 which is formed on the gate electrode 260 with the CVD silicon oxide film 256 intervened therebetween.

Embodiment 5-3

Figure 22:
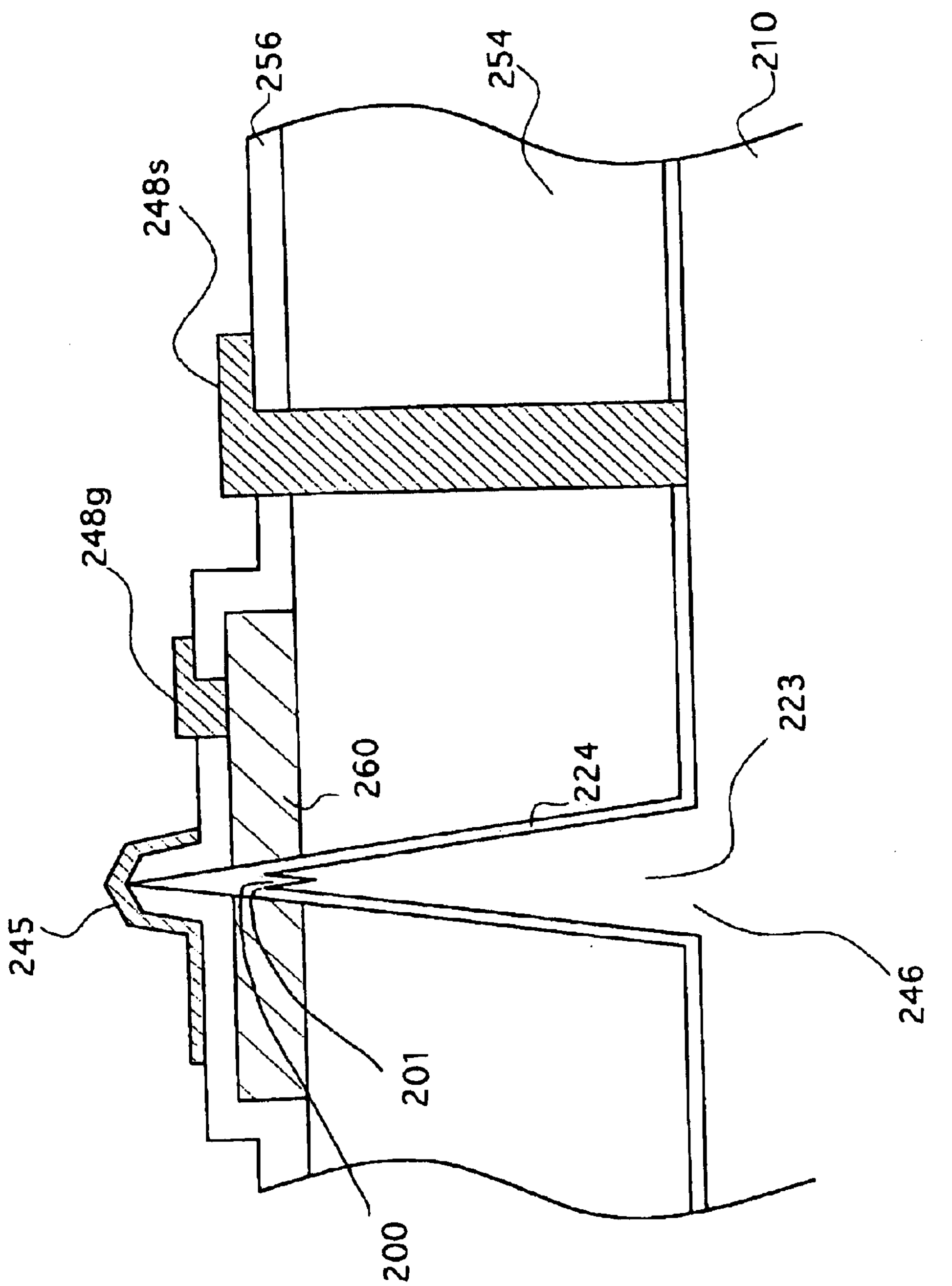
FIG. 22 is a diagram showing a structure of the single electron transistor according to Embodiment 5-3 of the present invention.

FIG. 22 shows a structure of the single electron transistor according to Embodiment 5-3. In Embodiment 5-3, the silicon needle conic body 223 of the single electron transistor has a different structure from the silicon needle conic body 222 of Embodiment 5-2, but the other structure is common to that of FIG. 21. This silicon needle conic body 223 has the shape of a frustum, and its top surface at the leading end is etched in the shape of a mortar toward the bottom of the conic body so to have an annular leading end.

This silicon needle conic body 223 having the mortar-shaped region 200 at the leading end is formed by the method described in the aforesaid Embodiment 3.

The size, base angle, aspect ratio, radii of curvature at the bottom and leading end of the silicon needle conic body 223 are equal to those of the silicon needle conic body 222 in the aforesaid respective embodiments. The mortar-shaped portion on the upper face of the leading end is substantially similar to the silicon needle conic body 223, and the aspect ratio indicating a ratio of a depth to a diameter at the upper surface is about 10 equal to the conic body 223, and the base angle is about 80°. For example, when the silicon needle conic body 223 has a diameter of several nm to 30 nm at the upper surface, the mortar-shaped portion formed on the upper surface can be made to have a diameter about 2 nm to 4 nm smaller than the diameter at the upper surface of the needle conic body. Thus, the annular portion 201 remained at the leading end of the needle conic body has a thickness (width) of about 1 nm to 2 nm. Therefore, the mortar-shaped portion of the silicon needle conic body 223 is a very small region of about 1 nm to 2 nm, the leading end of the conic body 223 can function as the quantum dot, and an electric current flows in the vertical direction between the bottom and leading end of the silicon needle conic body 223, so that the single electron transistor exhibiting a clear quantum effect at room temperature can be obtained.

Embodiment 6-1

Next, Embodiment 6-1 of the present invention will be described.

Figure 23A:
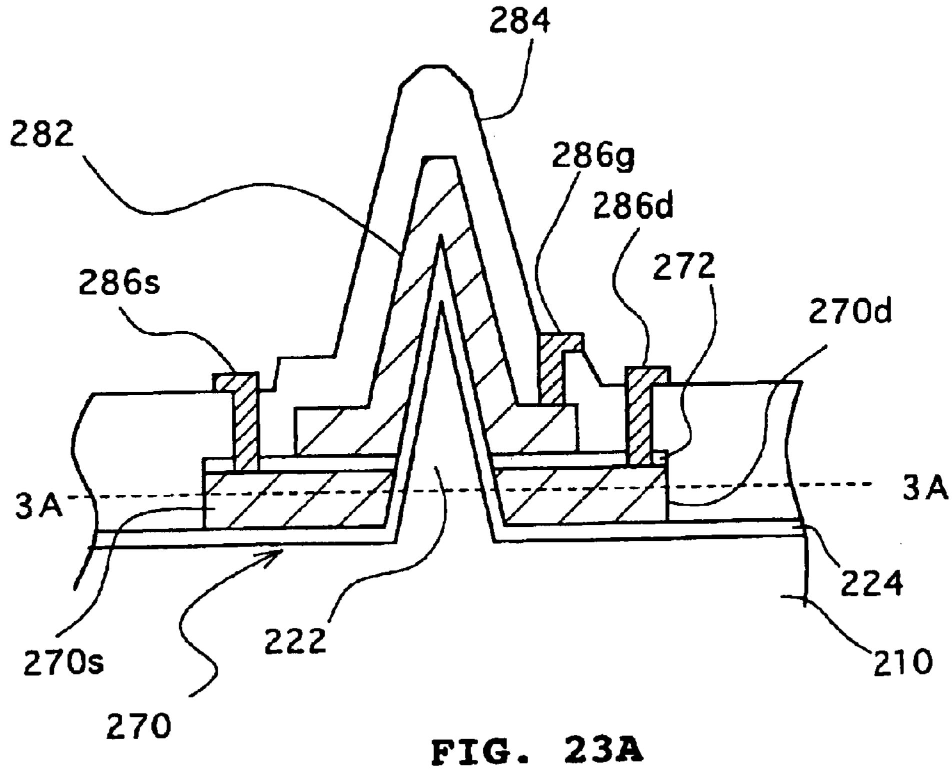
FIGS. 23A and 23B show a structure of the single electron transistor according to Embodiment 6-1 of the present invention.
Figure 23B:
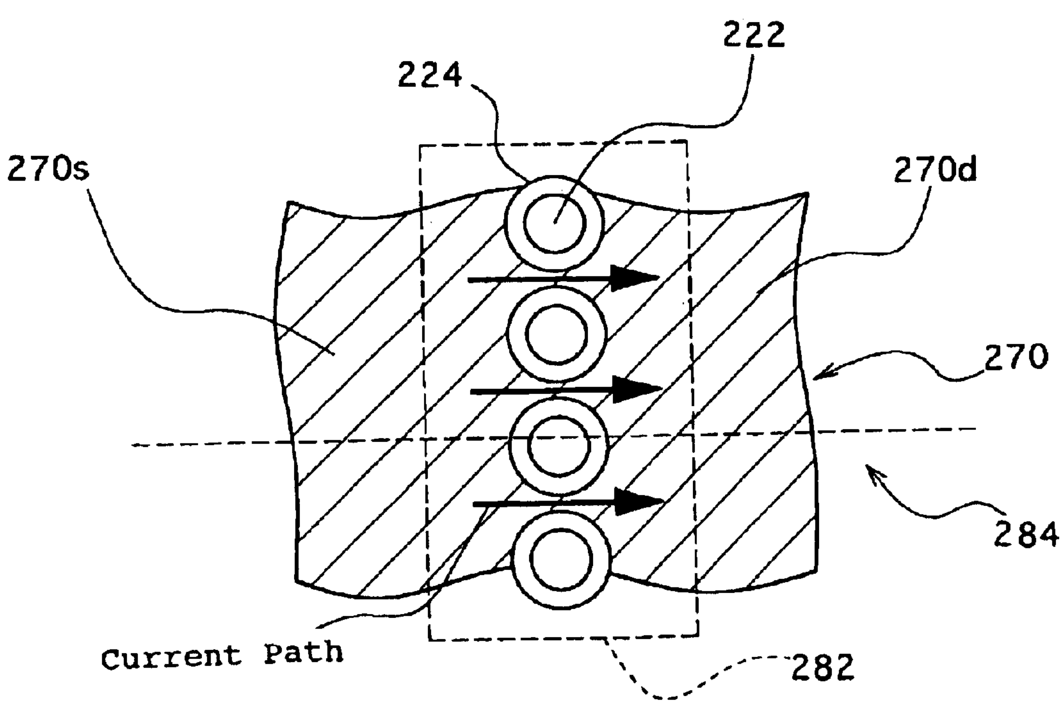

FIGS. 23A and 23B show a structure of the single electron transistor according to Embodiment 6-1. FIG. 23A shows partly a cross section of the single electron transistor of this embodiment, and FIG. 23B shows a plane structure taken along dotted line 3A—3A of FIG. 23A.

In Embodiment 6-1, the silicon needle conic body is used as the single electron transistor in the same way as in the aforesaid embodiment. The silicon needle conic body is however not used as an electron propagation route for developing the single electron effect as in the aforesaid embodiment, rather the conducting material layer around the silicon needle conic body functions as the quantum dot and small tunnel junction to obtain the single electron effect.

The silicon needle conic body 222 formed to protrude on the silicon substrate 210 (may be a single-crystal silicon film) is formed on the same principle as the conic body 222 described in the aforesaid individual embodiments. Further, the silicon needle conic body 222 of Embodiment 6-1 has its bottom buried with the conducting material layer of polysilicon. In the plan view of FIG. 23B, a plurality of silicon needle conic bodies 222 are closely arranged in a row so to divide a conducting material layer 270 in its breadth direction. A gate electrode 282 is formed as an electrode for controlling potential above the row of silicon needle conic bodies 222 along the arranged direction of the conic bodies 222 with the oxide film 224 therebetween.

An example method for manufacturing the single electron transistor shown in FIGS. 23A and 23B will be described with reference to FIGS. 24A to 24J.

(a) First, the silicon needle conic bodies 222 are formed on the silicon substrate 210. In order to form the silicon needle conic bodies 222 arranged in a row, an opening with a small width is formed along the direction that the silicon needle conic bodies are arranged on the resist mask for introducing the impurity, the impurity is introduced, and thermal treatment is performed to form the impurity precipitation region, thereby forming the micro mask. In order to closely form the plurality of silicon needle conic bodies 222, oxygen ions are implanted as the impurity at a high dose, and thermal treatment is performed to form an oxygen precipitation nucleus at a high density. Then, high selectivity anisotropic etching of the substrate 210 is performed, and the obtained oxygen precipitation nucleus is used as the micro mask to obtain silicon needle conic bodies 222 arranged in multiple rows. After forming the silicon needle conic bodies 222, thermal oxidation treatment is performed to form the oxide film 224 having a thickness of about 20 nm on the surface of the each conic body 222, as can be seen from FIG. 24A.

Figures 24A, 24B, 24C, 24D, 24E:
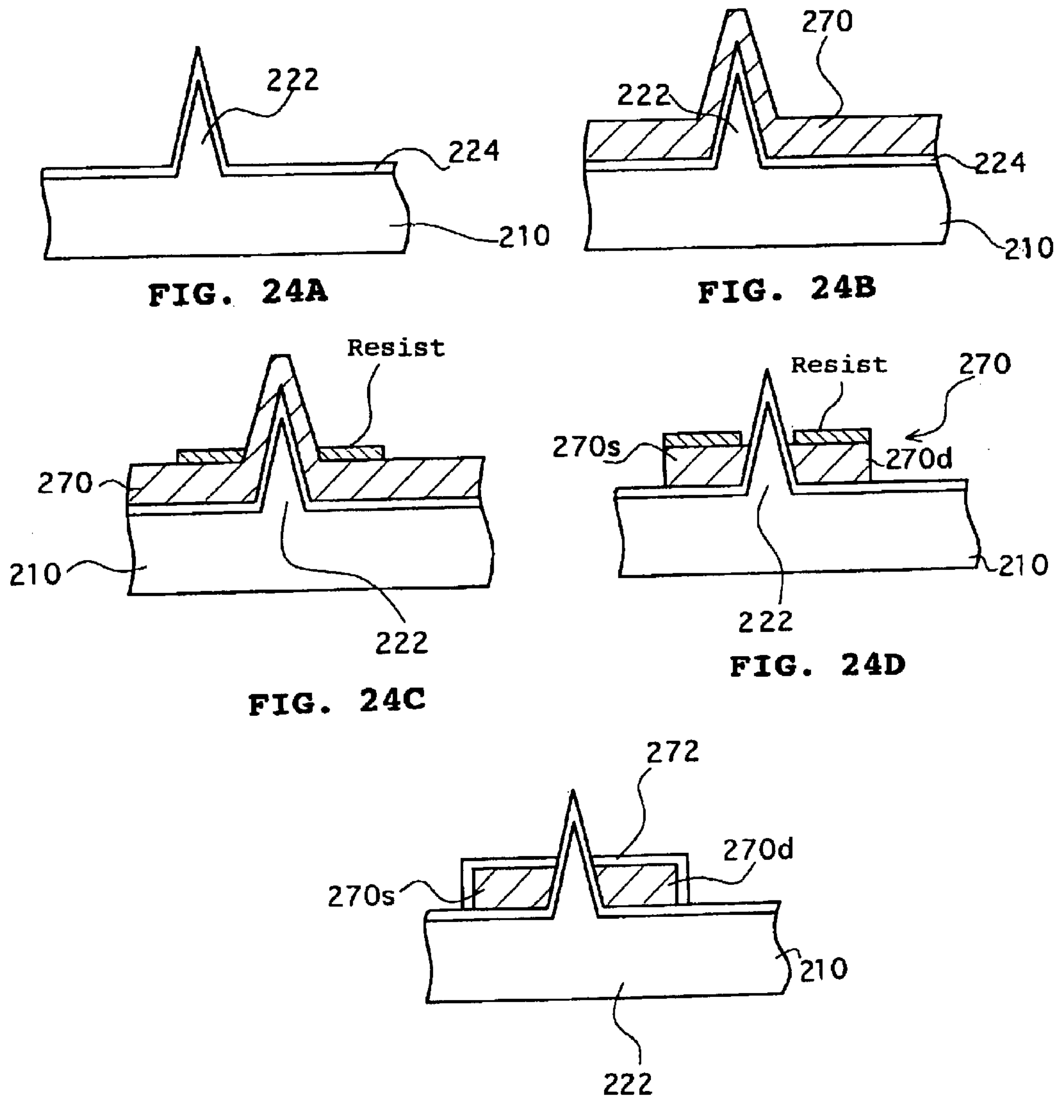
FIGS. 24A, 24B, 24C, 24D, 24E, 24F, 24G, 24H, 24I and 24J are diagrams showing a process of the manufacturing method for the single electron transistor according to Embodiment 6-1 of the present invention.

(b) After forming the oxide film 224, polysilicon is deposited to a thickness of about 10 nm on the entire surface of the substrate by the low pressure CVD method, as can be seen from FIG. 24B.

(c) Photolithography is performed to leave the resist around the multiple rows of silicon needle conic bodies 222, as shown in FIG. 24C.

(d) With the resist used as the mask, dry etching is performed under conditions that the etching of the polysilicon is easily progressed than the silicon oxide film. Thus, the portion not covered with the resist of polysilicon is removed, and the polysilicon conducting material layer 270 with the source region 270*s* and the drain region 270*d* formed with the multiple rows of silicon needle conic bodies 222 used as a boundary, as shown in FIG. 24D.

(e) After patterning the conducting material layer 270, the resist is removed, and thermal oxidation is performed to oxidize about 20 nm of the polysilicon which forms the conducting material layer 270 to form an oxide film 272 on the surface, as shown in FIG. 24E.

Figure 24F:
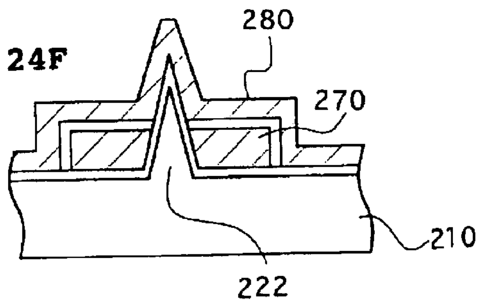

(f) Then, 30 nm of the polysilicon film 280 is deposited so to cover the oxide film 272 and the leading end of the silicon needle conic body 222 protruded from the oxide film 272. Besides, for example, phosphorus is doped (doping concentration of about $10^{20}$ $cm^{-3}$) as the impurity into the polysilicon film 280 to make the polysilicon film 280 a good conductor layer, as shown in FIG. 24F.

Figure 24G:
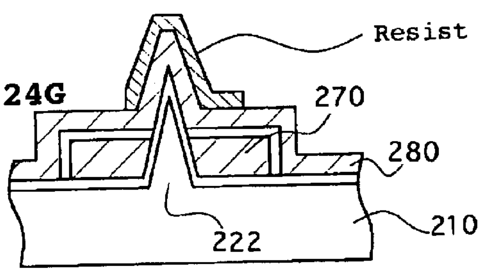
Figure 24H:
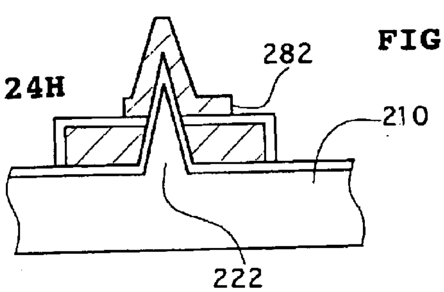

(g) Photolithography is performed to selectively remain the resist on the region, where the silicon needle conic body is formed, on the polysilicon film 280, as can be seen from FIG. 24G.

(h) The polysilicon film 280 is dry etched with the resist patterned in (g) above used as the mask to obtain the gate electrode 282 of the polysilicon film having the impurity doped so to cover the leading end of the silicon needle conic body 222. And, after patterning the polysilicon film 280, the resist used as the mask is removed, as can be seen from FIG. 24H.

Figure 24I:
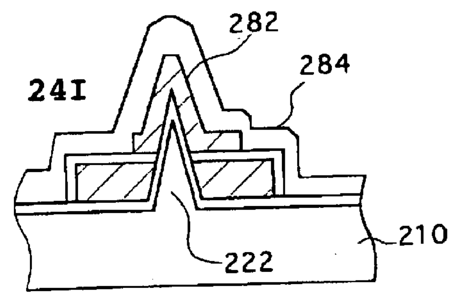

(i) After removing the resist in (h) above, an oxide film (CVD oxide film) 284 is deposited to a thickness of about 800 nm so to cover the entire surface of the substrate by the plasma CVD method, as can be seen from FIG. 24I.

Figure 24J:
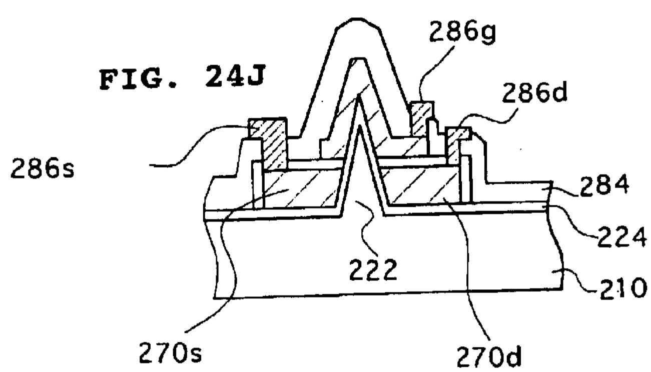

(j) Then, the oxide films 224 and 284 are etched to partly expose the source region 270*s* and the drain region 270*d* and also the oxide film 284 is etched so to partly expose the gate electrode 282, thereby forming contact holes for connecting with the corresponding terminals. Then, aluminum is sputtered, the resist is applied, the resist is exposed to remain the regions near the contact hole portion and the predetermined wiring, and the aluminum is dry etched. Thus, the source terminal 286*s* of aluminum connected to the source region 270*s*, the drain terminal 286*d* of aluminum connected to the drain region 270*d* and the gate terminal 286*g* of aluminum connected to the gate electrode 282 are formed as shown in FIG. 24J.

The single electron transistor shown in FIGS. 23A and 23B can be formed through the aforesaid steps (a) to (j). In the single electron transistor shown in FIGS. 23A and 23B, an electric current flows from the source region 270*s* to the drain region 270*d* of the conducting material layer 270, but the group of silicon needle conic bodies closely arranged in a row in the breadth direction of the conducting material layer 270 is arranged to disturb the current route. Therefore, the electrons are forced to pass through the group of silicon needle conic bodies. The silicon needle conic bodies 222 according to the present invention can have a base angle of about 80° and an aspect ratio of about 10, so that they can be formed closely to one another in the order of nanometers. And, an impurity trap, which substantially does not disturb the conduction when the electrons flow a very broad region, affects the electron conduction among the conic bodies 222.

Therefore, in the conduction region which is formed in the conducting material layer 270 between the silicon needle conic bodies 222, a portion where the electron is easy to exist becomes the quantum dot, and a portion where the electron is hard to present functions as the small tunnel junction. In other words, the quantum wire region is formed in the conducting material layer 270 between the source and drain regions and between the multiple rows of silicon needle conic bodies 222.

Next, the gate voltage to be applied to between the source region and the drain region is controlled by using the gate electrode 282 for controlling the potential formed above the silicon needle conic bodies 222, so that the coulomb blockade and tunneling of the electrons between the source region and the drain region are controlled, and the single electron effect is developed.

In the aforesaid description, polysilicon is used as material for the source region 270*s*, the drain region 270*d* and the gate electrode 282, but a metallic material may be used instead.

Figure 25A:
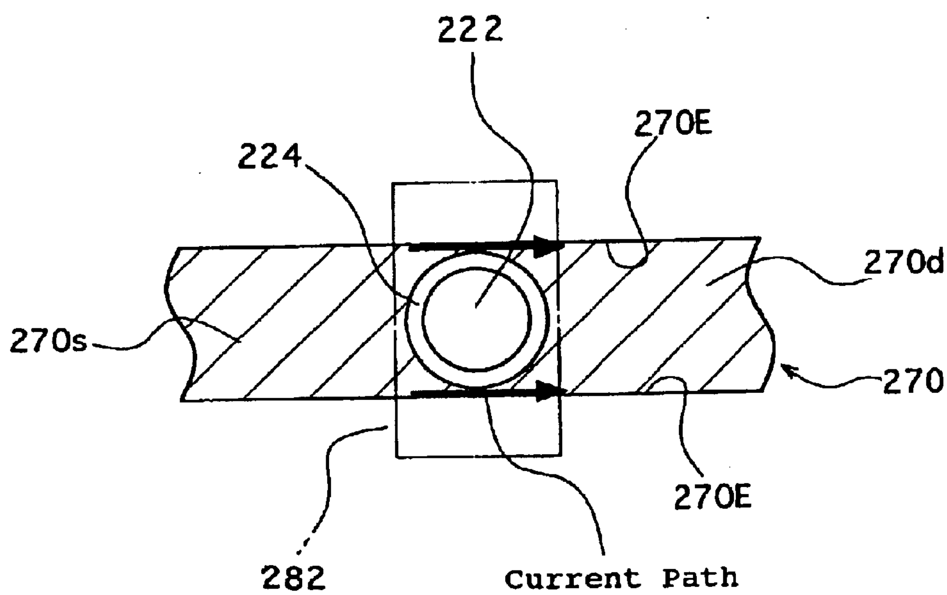
FIGS. 25A and 25B are diagrams showing another arrangement of the silicon needle cone according to Embodiment 6-1 of the present invention.

The multiple silicon needle conic bodies 222 which were arranged in a row in the breadth direction of the conducting material layer 270 were used in the aforesaid description, but the quantum effect can be developed by cutting off the electron propagation route of the conducting material layer 270 having a sufficiently narrow width by the single silicon needle conic body 222 as shown in FIG. 25A. In such a case, the conductive body 222 and the conducting material layer 270 are formed so that a distance from the silicon needle conic body 222 to an end 270E of the conducting material layer 270 is on the order of nanometers. Therefore, a very small region between the conic body 222 and the end 270E can be functioned as the quantum dot and the small tunnel junction, and the coulomb blockade can be controlled by the gate electrode 282 which controls the voltage. Thus, the single electron effect is developed.

Figure 25B:
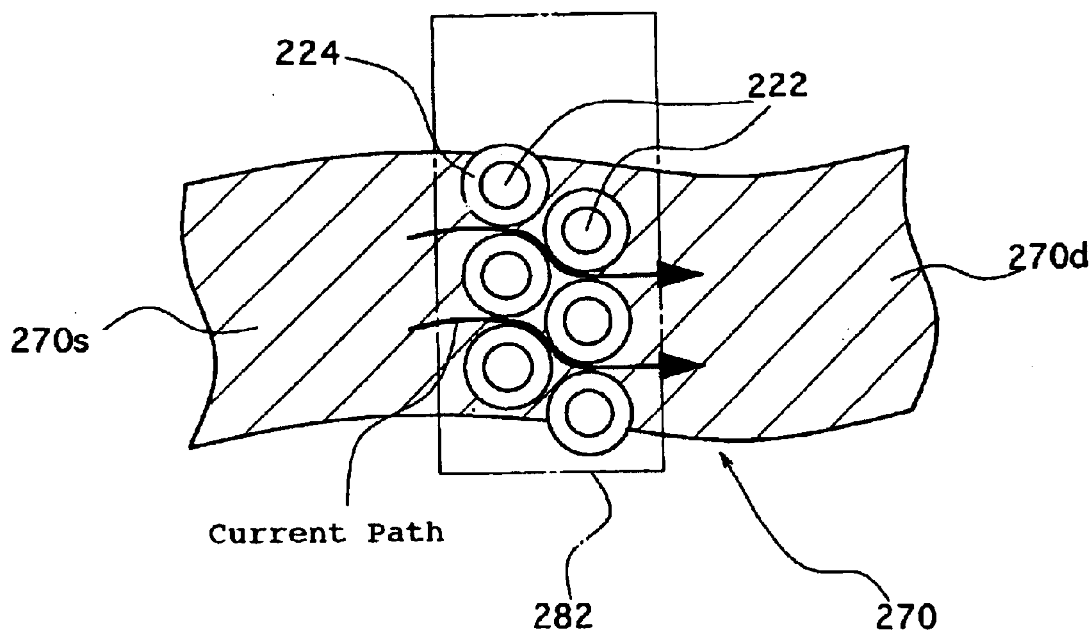

Further, a group of multiple silicon needle conic bodies 222 closely arranged can be adopted instead of arranging the silicon needle conic bodies 222 in a row as shown in FIG. 25B. When the conic bodies are closely arranged so that the quantum wire region can be formed between the conic bodies, it does not matter whether the group of silicon needle conic bodies 222 is arranged orderly like a lattice or not arranged orderly. In the structure shown in FIG. 25B, an electric current flows through a narrow conducting material layer 270 between the plurality of silicon needle conic bodies 222, the quantum dot and the small tunnel junction are formed in the conducting material layer 270 between the silicon needle conic bodies, and the single electron effect can be developed by the gate voltage control. FIGS. 25A and 25B show planar structures taken along dotted line 3A—3A of FIG. 23A, and the non-illustrated other structure is the same as the one shown in FIGS. 23A to 23C, 24A to 24J.

Embodiment 6-2

Figure 26A:
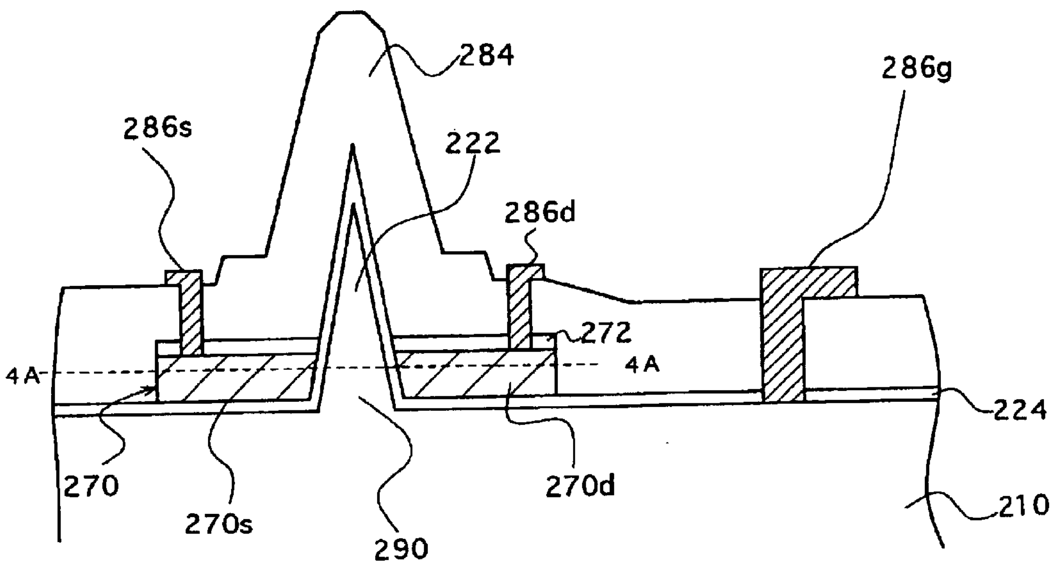
FIGS. 26A and 26B show a structure of the single electron transistor according to Embodiment 6-2 of the present invention.
Figure 26B:
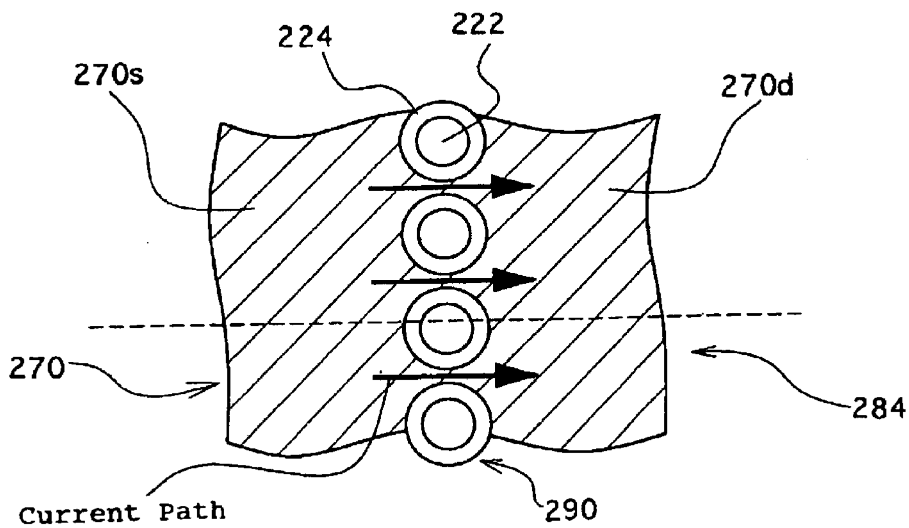

FIGS. 26A and 26B show a structure of the single electron transistor according to Embodiment 6-2. FIG. 26A shows a sectional structure of the single electron transistor, and FIG. 26B shows a planar structure taken along dotted line 4A—4A of FIG. 26A.

The main difference between Embodiment 6-1 and Embodiment 6-2 is the gate electrode. Specifically, a polysilicon film is formed as the gate electrode 282 above the region where the group of silicon needle conic bodies 222 is formed, but Embodiment 6-2 uses the silicon needle conic body 222 itself as the gate electrode 290. The other structure is the same as in Embodiment 6-1. The conducting material layer 270 is separated to the source region 270*s* and the drain region 270*d* by the multiple silicon needle conic bodies 222 arranged in a row, and the conducting material layer between the silicon needle conic bodies 222 is used as the quantum wire.

In Embodiment 6-2, an n-type conductive substrate is used as the silicon substrate 210 (or a substrate having an n-type conductive impurity doped into the conic body forming surface region of the substrate), and the plurality of silicon needle conic bodies 222 which also serve as the gate electrode 290 are formed on the substrate 210. After forming up to the oxide film 284, contact holes are formed to penetrate the oxide films 284 and 224 when the other terminals 286*s* and 286*d* are formed, and the gate terminal (aluminum) 286*g* is formed for connection with the substrate 210 (gate electrode 290). To make only the surface region containing the silicon needle conic body 222 of the silicon substrate 210 have the n-type conductivity, the silicon needle conic body 222 is formed on the silicon substrate 210 on the aforesaid principle, and the impurity such as phosphorus may be introduced into the transistor forming region.

The single electron transistor configured as described above has the quantum wire region formed in the conducting material layer 270 between the silicon needle conic bodies 222 closely arranged in a row so to cross the electric current passage, so that the coulomb blockade of the electrons in the quantum wire region can be controlled by controlling the potential of the quantum wire region by the gate voltage applied through the gate terminal 286*g*, and the single electron effect is developed.

The single electron transistor of Embodiment 6-2 can eliminate the necessity of the depositing and patterning steps of the polysilicon 280 as the gate electrode 282 required in Embodiment 6-1, so that the device-manufacturing cost can be reduced as compared with Embodiment 6-1. Meanwhile, the device occupation area is increased as compared with Embodiment 6-1. In Embodiment 6-2, it is necessary to take measures not to form a p-n junction between the silicon needle conic body 222 and the gate terminal 286*g*. If the p-n junction is formed, controllability of the electric field effect to the conduction region between the silicon needle conic bodies 222 through the gate terminal 286*g* becomes poor.

Embodiment 6-2 also allows for adoption of a structure of forming the quantum wire region with the end 270E of the conducting material layer 270 by the single silicon needle conic body 222 as shown in FIG. 25A. By forming a group of multiple silicon needle conic bodies 222 closely as shown in FIG. 25B, it is possible to adopt a structure that the quantum wire region is formed between the mutual conic bodies 222.

Embodiment 6-3

Figure 27A:
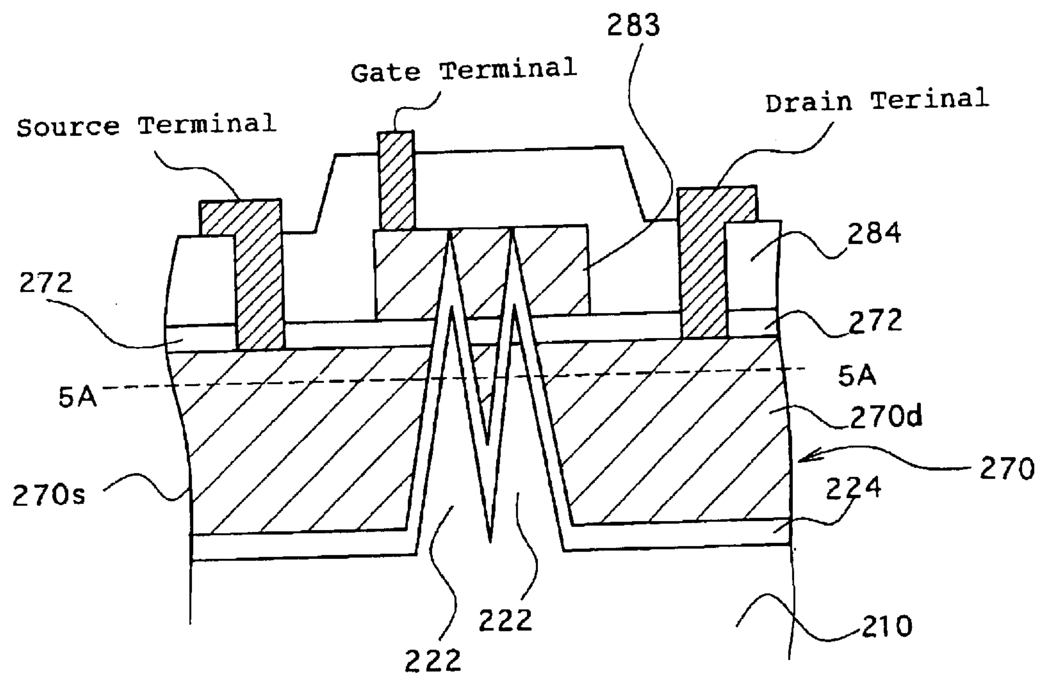
FIGS. 27A and 27B show a structure of the single electron transistor according to Embodiment 6-3 of the present invention.
Figure 27B:
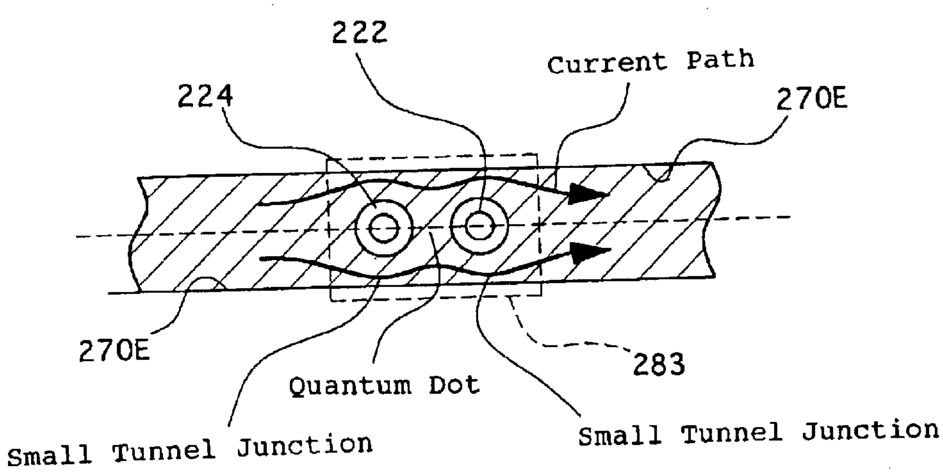

FIGS. 27A and 27B show a structure of the single electron transistor according to Embodiment 6-3. FIG. 27A shows a sectional structure of the single electron transistor, and FIG. 27B shows a planar structure taken along dotted line 5A-5A of FIG. 27A.

Embodiments 6-1 and 6-2 are configured to pass through the silicon needle conic bodies 222 arranged in a row, namely a direction of the arranged silicon needle conic bodies 222 and a direction of the moving electrons intersect substantially at right angles. However, the single electron transistor of Embodiment 6-3 has the silicon needle conic bodies 222 arranged in a row substantially in parallel to the direction of the moving electrons.

In the single electron transistor of Embodiment 6-3, the conducting material layer 270 between two silicon needle conic bodies 222 functions as the quantum dot, and the region having a narrow electric current passage with the end 270E of the conducting material layer 270 due to the presence of the silicon needle conic bodies 222 functions as the small tunnel junction. Accordingly, the single electron effect can be developed by controlling the gate voltage to be applied by the gate electrode 283 disposed on the formed regions.

A method for manufacturing the device is substantially the same as in Embodiment 6-1, except that, as shown in FIGS. 27A and 27B, two silicon needle conic bodies 222 are arranged in a row in parallel to a direction (direction along the end of the conducting material layer) that the conducting material layer 270 is extended. The conducting material layer 270 of polysilicon is formed to a large thickness (e.g., the conducting material layer 270 has a thickness of about 10 nm to a height of ten or more nm of the conic body 222) in order to bury the silicon needle conic bodies 222 up to the vicinity of their leading ends to thereby securely form the conducting material layer between the two silicon needle conic bodies 222 by having the conducting material layer 270 in a sufficient thickness which is formed to bury the circumference of the conic bodies even when the silicon needle conic bodies 222 are formed very closely as shown in FIG. 27A. However, it is not essential that the conducting material layer 270 have a large thickness as shown in FIGS. 27A and 27B, and the conducting material layer 270 may have a sectional structure as shown in FIG. 23A. Further, the silicon needle conic body may be configured to also serve as the gate electrode as shown in FIG. 26A. The formed conducting material layer 270 has its surface thermally oxidized so to be covered with the oxide film 272, the gate electrode 283 of polysilicon is formed on the oxide film 272, and the vicinity of the leading end of the silicon needle conic body 222 protruded from the conducting material layer 270 is covered with the gate electrode 283.

Embodiment 6-4

Figure 28:
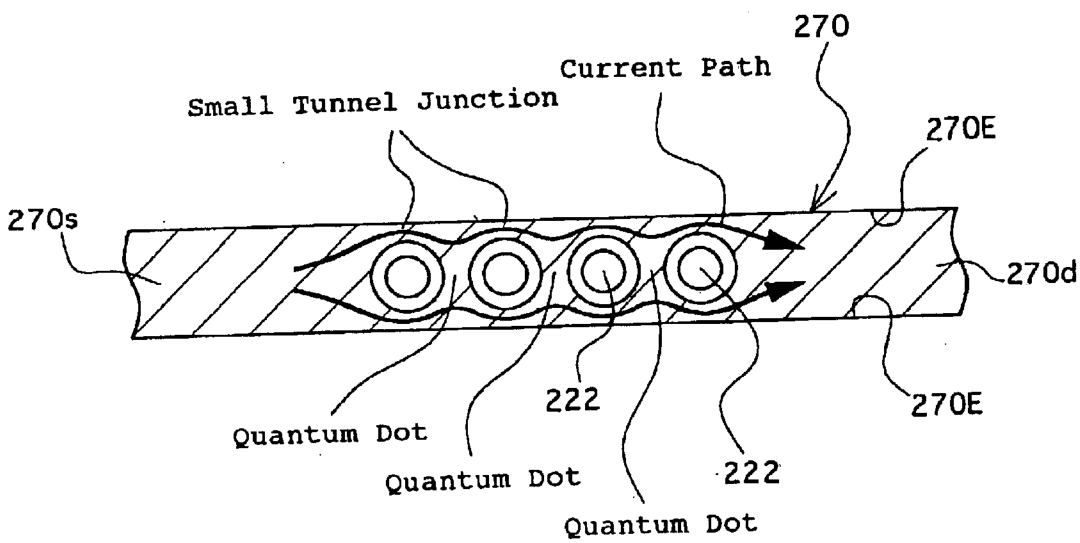
FIG. 28 shows a structure of the single electron transistor according to Embodiment 6-4 of the present invention.

FIG. 28 shows a structure of the single electron transistor according to Embodiment 6-4, and more specifically a planar structure taken along dotted line 5A-5A of FIG. 27A. Embodiment 6-4 has a feature that the silicon needle conic bodies 222 arranged in a row in the direction of the electric current passage in Embodiment 6-3 were increased to be arranged in at least three or more rows. FIG. 28 shows that four silicon needle conic bodies 222 are arranged in a row in the direction of the electric current passage (corresponding to the direction that the end 270E of the conducting material layer 270 is extended). Otherwise, the structure is the same as in Embodiment 6-3.

As shown in FIG. 28, by arranging three or more silicon needle conic bodies 222 along the direction of the electric current passage, the quantum dot configured between the individual silicon needle conic bodies 222 is present in multiple numbers between the source region 270*s* and the drain region 270*d*. Here, the electrons which propagate between the source and the drain conduct a plurality of quantum dots without fail, so that coordinated tunneling which is experienced when the quantum dot is one can be prevented by configuring as in Embodiment 6-4. The coordinated tunneling means a leakage current for the coulomb blockade, indicating a phenomenon that electrons tunnel two small tunnel junctions at the same time.

Therefore, by preventing the coordinated tunneling, the single electron effect becomes more conspicuous than the single electron transistors having the structures described in Embodiments 6-1, 6-2 and 6-3 (excepting the structure of FIG. 25B). When the quantum dots are two, the coordinated tunneling may also occur. Therefore, it is more preferable to arrange the silicon needle conic bodies 222 so that the quantum dots become three or more.

When the arrangement of the silicon needle conic bodies 222 as shown in FIG. 25B described in Embodiment 6-1 is adopted, the coordinated tunneling-preventing effect is obtained because a plurality of quantum dots are present between the source and the drain, and the single electron effect becomes remarkable.

Embodiment 7-1

Figure 29A:
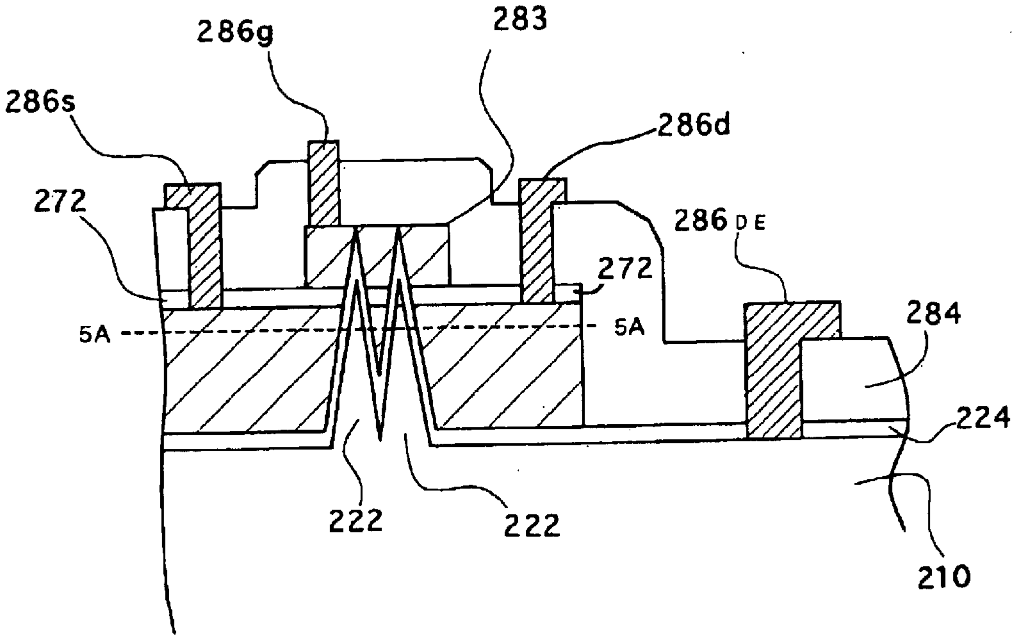
FIGS. 29A and 29B show a structure of the single electron transistor according to Embodiment 7-1 of the present invention.
Figure 29B:
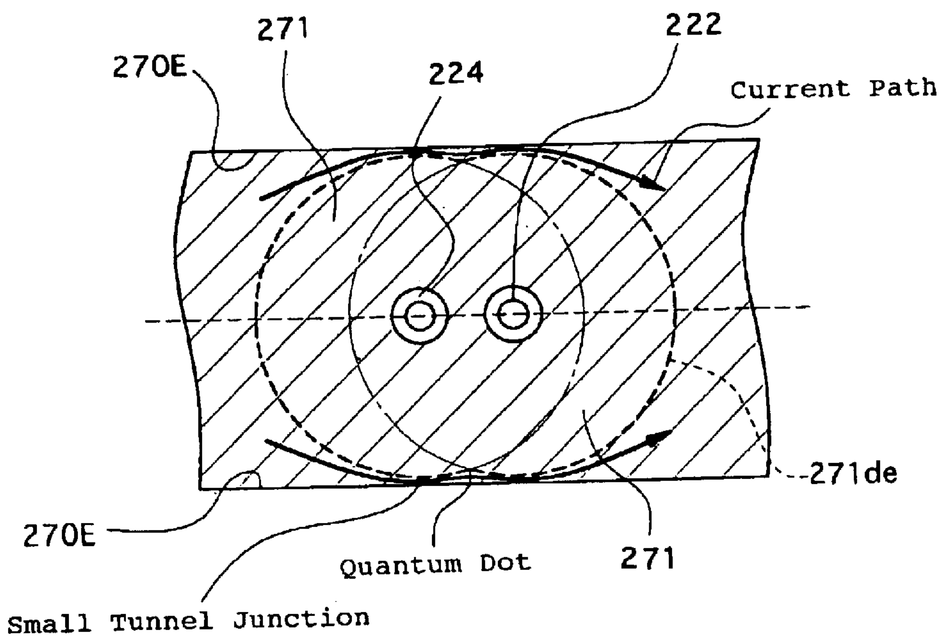

FIGS. 29A and 29B show a structure of the single electron transistor according to Embodiment 7-1. FIG. 29A shows a sectional structure of the single electron transistor, and FIG. 29B shows a planar structure taken along dotted line 5A—5A of FIG. 29A.

The single electron transistor according to Embodiment 7-1 is common to those described in Embodiments 6-3 and 6-4 on the point that two silicon needle conic bodies 222 are arranged in parallel to the direction of the current passage in the conducting material layer 270 but different from them on the point that a voltage is applied to the silicon needle conic bodies 222 formed in multiple numbers and the circumferential region of the silicon needle conic bodies 222 of the conducting material layer 270 is depleted by the electric field effect.

As the conducting material layer 270, polysilicon, for example, may be used in the same way as in Embodiment 6-3. For the silicon substrate 210, an n-type substrate in which at least the region of forming its silicon needle conic bodies 222 indicates n-type conductivity is used. A depletion layer-forming terminal $\mathbf{286}_{DE}$ of aluminum is connected to this n-type silicon substrate 210 through a contact hole, and a voltage is applied from the silicon needle conic body 222 to the surrounding conducting material layer 270 by the depletion layer-forming terminal $\mathbf{286}_{DE}$. The application of a voltage from the silicon needle conic body 222 forms a depletion layer 271 which is a concentric circle with the conic body 222 around the silicon needle conic body 222. Two depletion layers 271 corresponding to the two silicon needle conic bodies 222 are overlapped, and the conducting material layer 270 in the broad position between a depletion layer end 271*de* indicated by a dotted line in FIG. 29B and the end 270E of the conducting material layer 270 functions as the quantum dot. In the conducting material layer 270, the portion where the depletion layer end 271*de* is in contact with the end 270E of the conducting material layer 270 functions as the small tunnel junction.

In the single electron transistor, the depletion layer-forming terminal $\mathbf{286}_{DE}$ is used to apply a voltage from the silicon needle conic body 222 to the conducting material layer 270 to form the depletion layer 271 in the conducting material layer 270, the current passage (electron propagation route) between the source region 270*s* and the drain region 270*d* is restricted to between the depletion layer end 271*de* and the end 270E of the conducting material layer so to form the quantum dot and the small tunnel junction. In the state that the depletion layer 271 is formed, the gate voltage is applied to the conducting material layer 270 by the gate electrode 283 formed above the leading end of the silicon needle conic body 222 to develop the single electron effect at the quantum dot and the small tunnel junction.

The structure of Embodiment 7-1, in contrast with that of Embodiment 6-3, can control the coulomb blockade of electrons between the source region and the drain region by depleting, even when the conducting material layer 270 has a broad pattern width (in the vertical direction in FIG. 29B). Therefore, the device can be easily manufactured. In Embodiment 7-1, it is necessary to deplete the conducting material layer 270, so that a material such as metal having extremely many electrons is not suitable, and a semiconductor such as polysilicon or single-crystal silicon is suitable.

Embodiment 7-2

Figure 30:
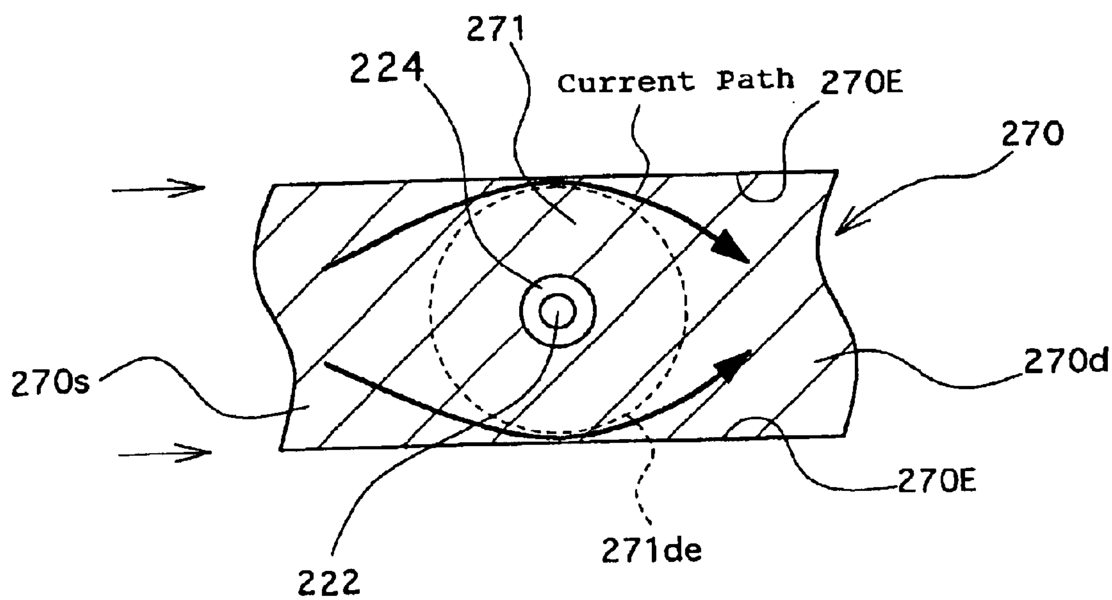
FIG. 30 is a diagram showing a structure of a single electron transistor according to Embodiment 7-2 of the present invention.
Figure 31:
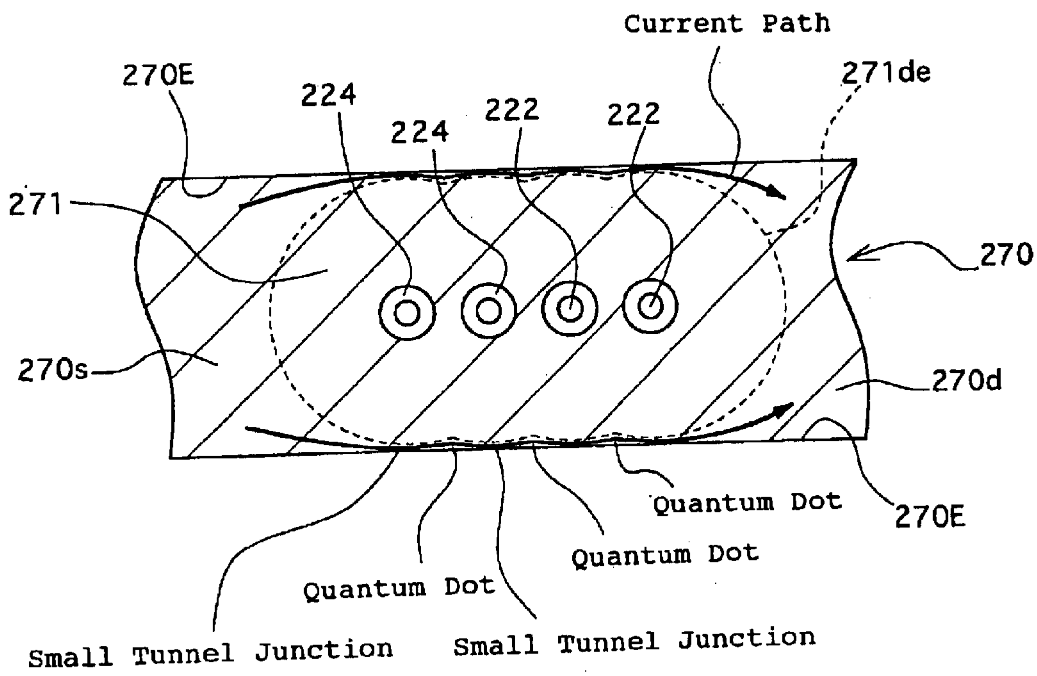
FIG. 31 shows a structure of another single electron transistor according to Embodiment 7-2 of the present invention.

FIGS. 30 and 31 show a structure of the single electron transistor according to Embodiment 7-2, and more specifically FIGS. 30 and 31 show a planar structure of the single electron transistor in the equivalent position taken along dotted line 5A—5A of FIG. 29A of Embodiment 7-1. Embodiment 7-2 is common to Embodiment 7-1 on the point that the quantum dot and the small tunnel junction are formed between the source region 270*s* and the drain region 270*d* by depleting the conducting material layer 270 around the silicon needle conic bodies 222, but the number of the silicon needle conic bodies 222 disposed in the direction of the current passage is different from Embodiment 7-1.

In the single electron transistor with the structure shown in FIG. 30, the single silicon needle conic body 222 is disposed between the source region 270*s* and the drain region 270*d*, and a voltage is applied from the silicon needle conic body 222 to the conducting material layer 270 through the depletion layer-forming terminal $\mathbf{286}_{DE}$ to form the depletion layer 271 in the same way as in Embodiment 7-1. When the distance between the depletion layer end 271*de* and the end 270E of the conducting material layer 270 is of the order of nanometers, this region can be functioned as the quantum wire region, the quantum dot and the small tunnel junction are formed in the quantum wire region, and the quantum effect appears for the electron propagation between the source region 270*s* and the drain region 270*d* depending on the control by the gate voltage applied by the gate electrode 283 from above the silicon needle conic body 222 as shown in FIG. 29A.

Then, in the single electron transistor shown in FIG. 31, the number of two silicon needle conic bodies 222 arranged in the direction of the current passage in Embodiment 7-1 is increased to three or more. In this embodiment, four silicon needle conic bodies 222 are arranged in a row in the same way as in FIG. 28. In FIG. 31, the depletion layer 271 is formed in a concentric circle with each conic body by arranging three or more silicon needle conic bodies 222 along the direction of the current passage and applying a voltage to the respective conic bodies 222 through the depletion layer-forming terminal $\mathbf{286}_{DE}$.

In a plurality of regions where the adjacent depletion layers are mutually overlapped, a space between the depletion layer end 271*de* and the end 270E of the conducting material layer 270 is increased to form the quantum dot, and a plurality of quantum dots are formed between the source region 270*s* and the drain region 270*d*. The depletion layer end 271*de* and the end 270E of the conducting material layer 270 are mutually contacted at a plurality of points to form a plurality of small tunnel junctions. As described in Embodiment 6-4, the electrons propagated between the source region 270*s* and the drain region 270*d* do not fail to conduct a plurality of quantum dots. Therefore, the structure as in Embodiment 6-2 can prevent the co-tunneling which causes a leakage current seen when the quantum dot is one, and the single electron effect becomes more conspicuous than the single electron transistor of Embodiment 6-1. When there are two quantum dots, coordinated tunneling may also occur, so that it is more preferable to arrange four or more silicon needle conic bodies 222 in the direction of the current passage so to have three or more quantum dots.

In the individual embodiments described above, it was described with the conic body determined as a cone, but the invention is not limited to such conic bodies. For example, after forming the micro mask, an elliptic cone and a multi-angular pyramid (poly-hedral cone) can be achieved by setting the etching conditions for the high selectivity anisotropic etching of the substrate and the material layer as desired.

Embodiment 8

Embodiment 8 uses the silicon needle conic body described in Embodiments 1 and 2 for a semiconductor memory of a type which accumulates electric charges in a capacitor of DRAM or the like.

Figure 32:
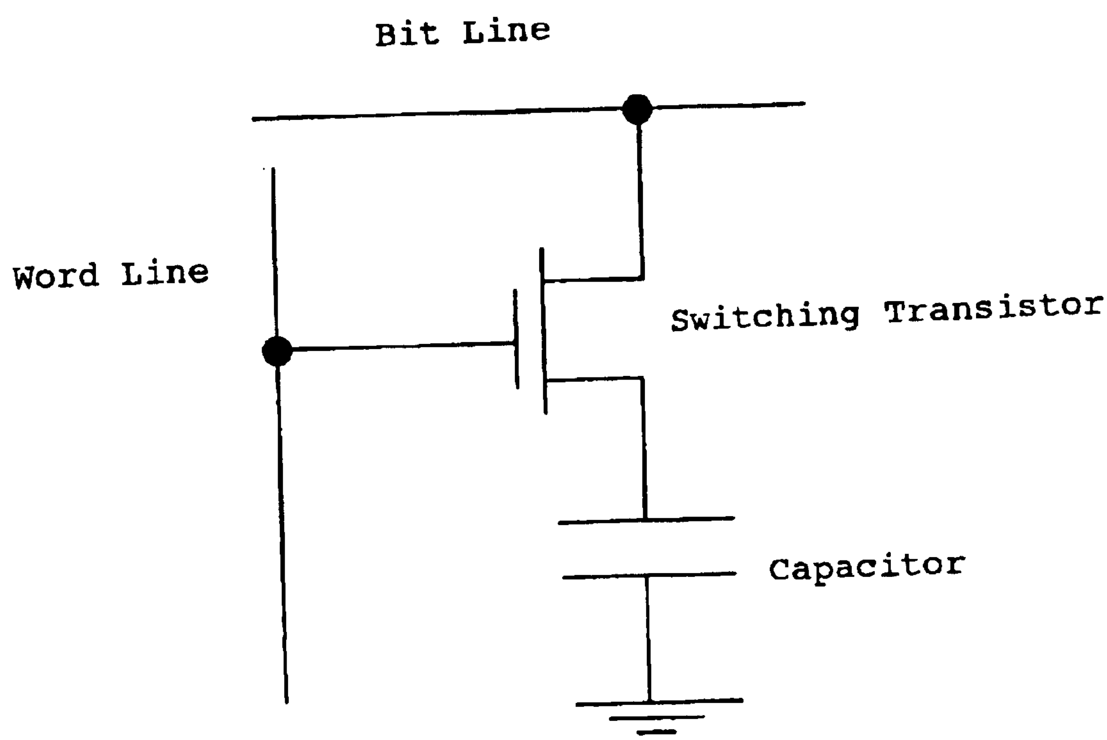
FIG. 32 is a diagram showing a basic structure of a memory cell of DRAM.

DRAM (dynamic random access memory) is a well-known storage device requiring operation of retaining contents. FIG. 32 shows a basic circuit structure of DRAM. DRAM has a capacitor and a switching transistor. The capacitor is grounded, and the switching transistor is connected to a bit line and a word line.

Demand for high integration of storage devices is very high and growing. To achieve the high integration of DRAM, it is necessary to reduce the device occupation area of its capacitor and transistor as small as possible.

The capacitor is required to reduce the occupation area while securing the required capacitance. Generally, the capacitor needs having a capacitance at least one digit larger than the wiring capacitance. When the capacitor has a small capacitance of the same level as the wiring capacitance, the electric charge cannot be retained, and memory operation is disabled. The capacitance of the capacitor of 64-Mbit DRAM being mass-produced now is about 30 fF.

As a capacitor having a small area but a large capacitance, a stacked capacitor and a trench capacitor have been put into practical use. These capacitors have their capacitance increased by not a two-dimensional arrangement but by a three-dimensional arrangement. To earn the execution area of the capacitor, there has been proposed a structure with irregularities formed on the opposite surface of the capacitor electrode (e.g., Japanese Patent Laid-Open Publication No. Hei (JPA) 11-54727). And, the occupation area of the memory cell is about 2 $\mu m^2$ for the present 64-Mbit DRAM.

Attempts to reduce the area occupied by the capacitor have achieved only limited success in realizing high integration as long as the conventional technology is used. For example, reduction of the area of the memory cell to about 0.3 $\mu m^2$ when DRAM of G-bit class is highly desired. However, using conventional technology results in the capacitance of the capacitor being buried in the wiring capacitance (several fF).

Accordingly, the present invention uses the aforesaid silicon crystal needle for the memory chip so to largely decrease the capacitor area of each memory unit so to realize a DRAM of even G-bit class.

Embodiment 8 will be described with reference to the drawings.

Figure 33A:
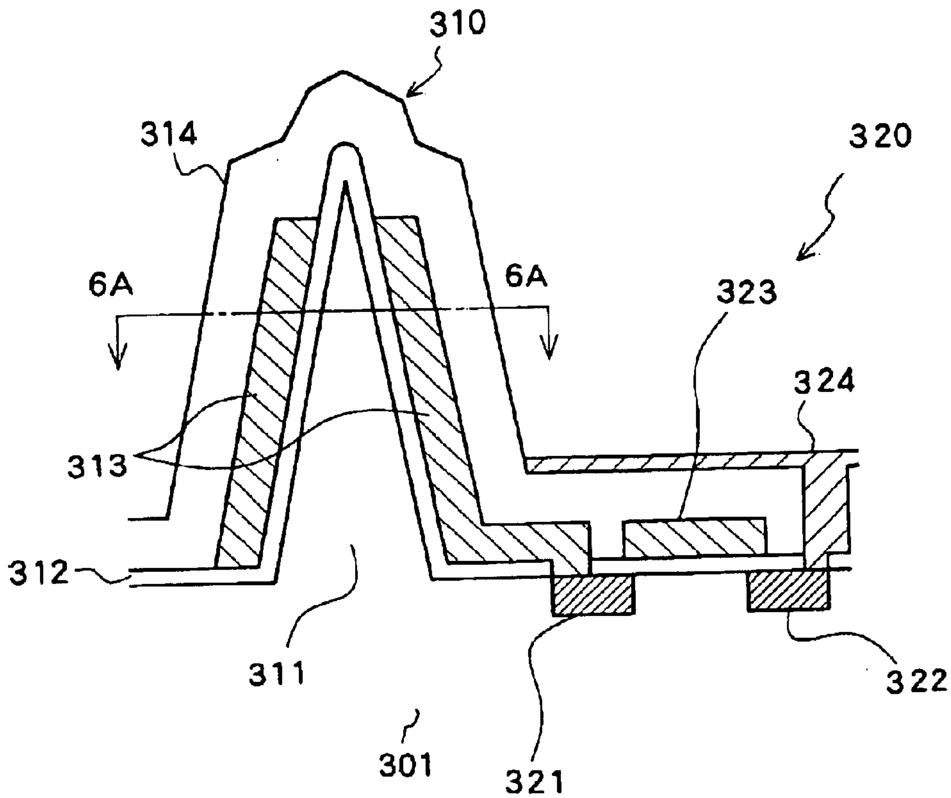
FIGS. 33A and 33B show a structure of a memory cell of DRAM according to Embodiment 8 of the present invention.
Figure 33B:
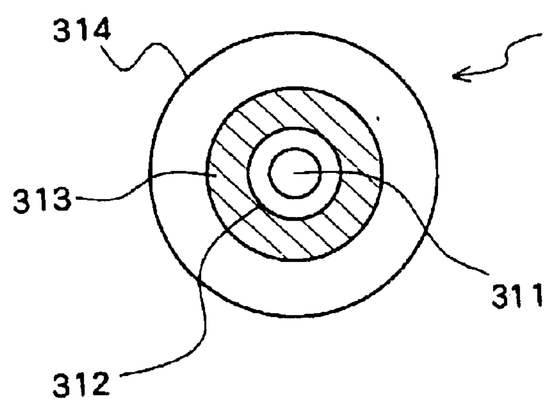

FIGS. 33A and 33B schematically show a memory cell (memory unit) configuring DRAM of Embodiment 8. The drawings show one memory cell, but DRAM is configured by arranging a plurality of same memory cells. As the overall structure of this DRAM and its principle are the same as the conventionally known DRAMs, detailed general description of DRAMS will be omitted.

FIG. 33A is a front sectional diagram of the memory cell, and FIG. 33B is a sectional diagram taken along line 6A—6A of FIG. 33A. As shown in the drawings, the memory cell has a capacitor 310 and a switching MOS transistor 320 which are arranged adjacent to each other and connected mutually.

First, the capacitor 310 will be described. As a feature of the present invention, the capacitor 310 is formed on the side face of a needle projection 311 (corresponding to the needle-shaped body of the present invention) of silicon crystal. The needle projection 311 is a conic type and protruded from a silicon substrate 301. The needle projection 311 functions as one of electrodes of the capacitor, namely as the grounding capacitor electrode. The needle projection 311 is covered with an insulation film 312 of a thermal oxide film. Another electrode of the capacitor, which is a switch-side capacitor electrode 313 (outside electrode), is formed to surround the needle projection 311 through the insulation film 312. The capacitor electrode 313 is suitably formed of polysilicon having conductivity. The capacitor electrode 313 starts from the root of the needle projection 311 and reaches a predetermined height a little below the top of the projection. The outside of the capacitor electrode 313 is covered with an insulation film 314.

The switching MOS transistor 320 is an n-channel MOSFET and formed on the same plan as the bottom of the needle projection 311 and next to the needle projection 311. As shown in the drawings, the flat portion of the silicon substrate 301 is covered with the insulation film 312 in the same manner as the needle projection 311. A source impurity concentration layer 321 and a drain impurity concentration layer 322 are formed with a space therebetween on the underside of the insulation film 312. A word line 323 is formed as the gate electrode above the layers 321, 322 with the insulation film 312 between them. The word line 323 extends in the perpendicular direction with respect to the drawing sheet, and its lower region is a transistor channel. The word line 323 is preferably made of polysilicon, and more preferably formed simultaneously when the capacitor electrode 313 is formed. The word line 323 is also covered with the insulation film 314.

The source impurity concentration layer 321 is connected to the switch side capacitor electrode 313. Namely, a part of the capacitor electrode 313 is separated from the needle projection 311 and extended to the source impurity concentration layer 321. Meanwhile, the drain impurity concentration layer 322 is connected to a bit line 324 disposed on the insulation film 314. The bit line 324 is preferably formed of aluminum.

The memory cell has the structure as described above. Basically, the memory cell operates in the same way as a known memory. When a signal is given to the word line 323, channel under the word line 323 is turned on, and electrons flow from the bit line 324 to the switch-side capacitor electrode 313.

Then, a suitable size of the needle projection 311 of silicon crystal configuring the capacitor 310 includes a diameter of 10 nm or below at the leading end, preferably several nm, and a height of 5 to 10 $\mu m$. For example, when the crystal has a height of 5 $\mu m$, the capacitor has a capacitance value of about 18 fF, which is sufficiently larger than the wiring capacitance. Therefore, it can endure charge retention as the memory cell. At this time, the root of the needle projection 311 has a size of about 0.2 μm. The memory cell configured as shown in FIGS. 33A and 33B can have a device occupation area decreased to the same level as the reference art.

Thus, since the capacitor is formed on the side face of the silicon needle crystal of this embodiment, the capacitor electrode area can be made large though its area is small when the needle is seen from the above. Thus, a desired capacitor capacitance can be secured.

A method of manufacturing a DRAM of this embodiment will be described. According to the present invention, the minute needle projection is a significant component for the memory cell. And, it is an important point how the structure having the needle projection is produced. And, this needle projection, which is not limitative, can be formed on the silicon substrate on the principle shown in FIG. 2. As to its specific shape and size, it is a very slender needle-shaped conic body having a radius of curvature of several nm to ten or more nm in the vicinity of the leading end and an aspect ratio of about 10. The conic body has a very large base angle of, e.g., about 80° or more, and its height can be made to be about several μm. The aspect ratio of the needle-shaped conic body can be 10 or more by controlling a mixing ratio of the mixture gas used for the anisotropic etching (can also be made smaller than 10 as required).

Figure 34:
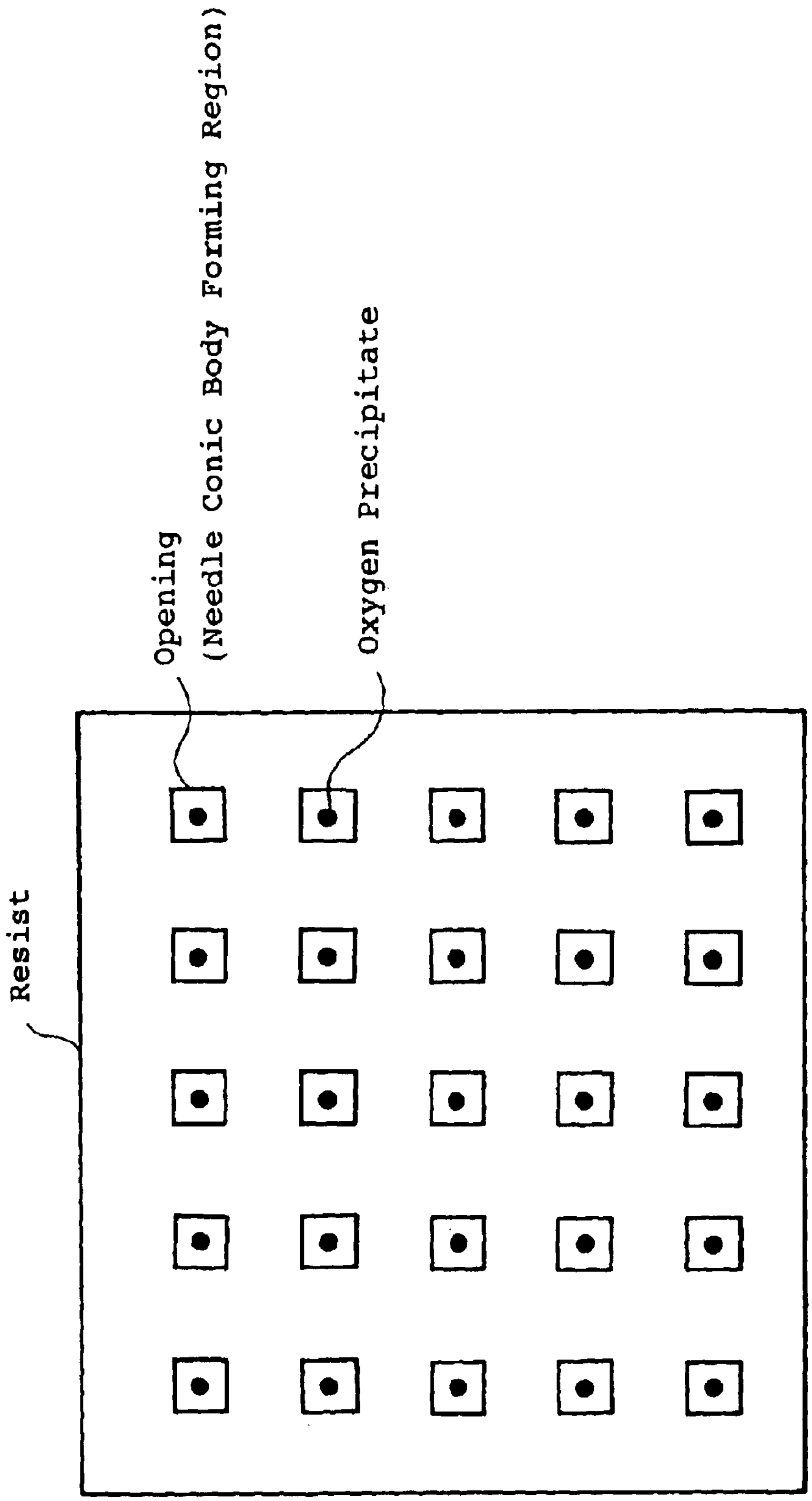
FIG. 34 shows an example of forming silicon needles for a memory cell in an appropriate arrangement.

A plurality of silicon needle conic bodies having the same shape and size can be formed by determining the plan position and depth position of the impurity precipitation region to be formed on the substrate. And, a density of the silicon needle conic bodies is variable depending on the implanted oxygen amount (a dose) when the micro mask is formed. Accordingly, as shown in FIG. 34, photolithography is performed to form holes at regions where the needle conic bodies are desired to be formed, and ion implantation into the substrate is performed so that about one needle-shaped conic body can be formed in each opened region under a desired oxygen dosing condition. Thus, the silicon needle conic bodies are formed in the shape of a grid on the substrate.

Figure 35A:
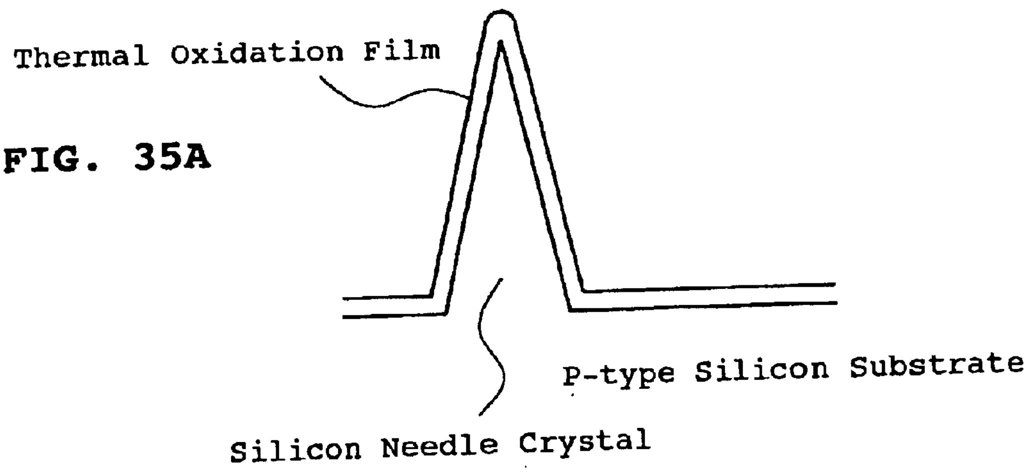
FIGS. 35A, 35B, 35C, 35D, 35E, 35F, 35G and 35H show a process of forming the memory cell of FIGS. 33A and 33B.
Figure 35B:
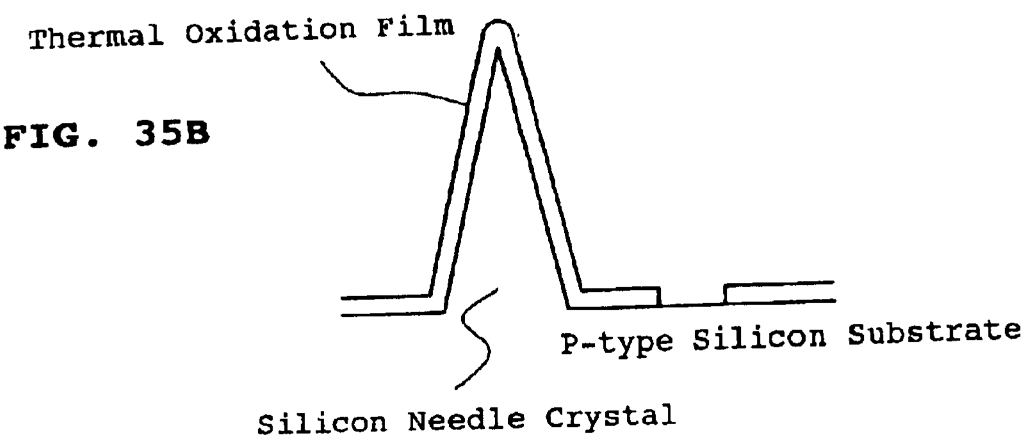
Figure 35C:
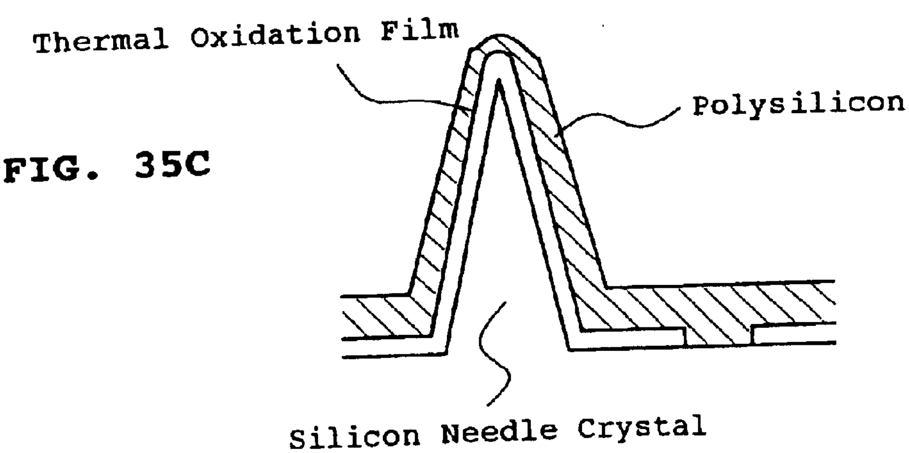

An example method for forming the memory cell of FIGS. 33A and 33B using the needle crystal will be described with reference to FIGS. 35A to 35H. As shown in FIG. 35A, a silicon needle crystal is formed on a p-type silicon substrate and oxidized to form a thermal oxidation film by the method described in Embodiment 1 and the like. The thermal oxidation film fully covers the silicon substrate and the needle crystal. FIG. 35B shows that the thermal oxidation film is partly removed by lithography and dry etching. The removed region is a region where the source impurity concentration region of the switching transistor is connected to the capacitor electrode. FIG. 35C shows that polysilicon is fully deposited by a decomposition CVD method. Then, phosphorus is dispersed in the polysilicon to a high concentration of about $10^{21}$ $cm^{-3}$. Thus, the polysilicon is provided with sufficient conductivity. Later, the polysilicon becomes the capacitor electrode and word line.

Figure 35D:
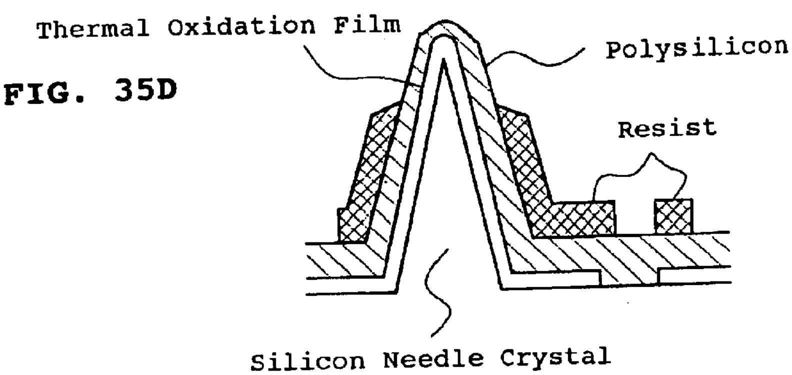
Figure 35E:
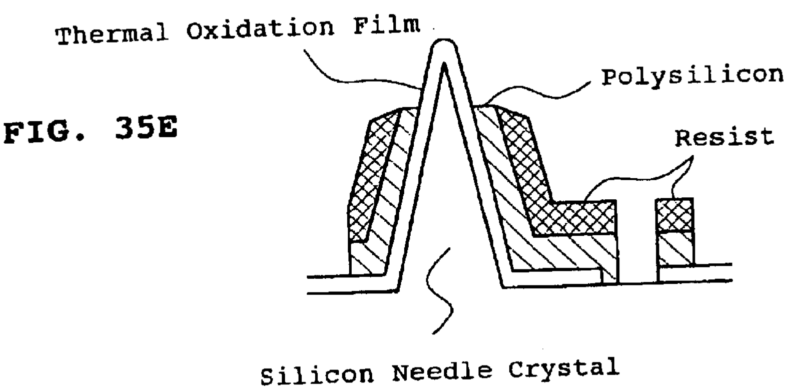
Figure 35F:
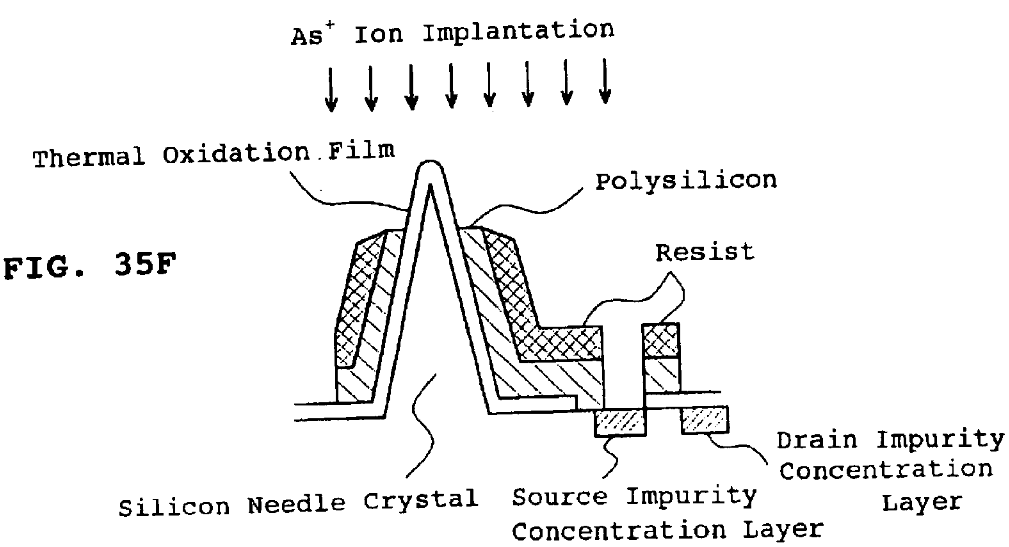

FIG. 35D shows that a resist is applied, and the resist is partly exposed and removed by photolithography. The removed region is where the source and drain impurity concentration layers of the switching transistor are to be formed. The leading end of the needle crystal is not covered with the resist from the beginning because of the action of a viscosity of the resist. FIG. 35E shows that the polysilicon is dry etched. The polysilicon is divided into a capacitor electrode portion and a word line portion. FIG. 35F shows that $As^+$ is implanted, and the source and drain impurity concentration layers of the switching transistor are formed.

Figure 35G:
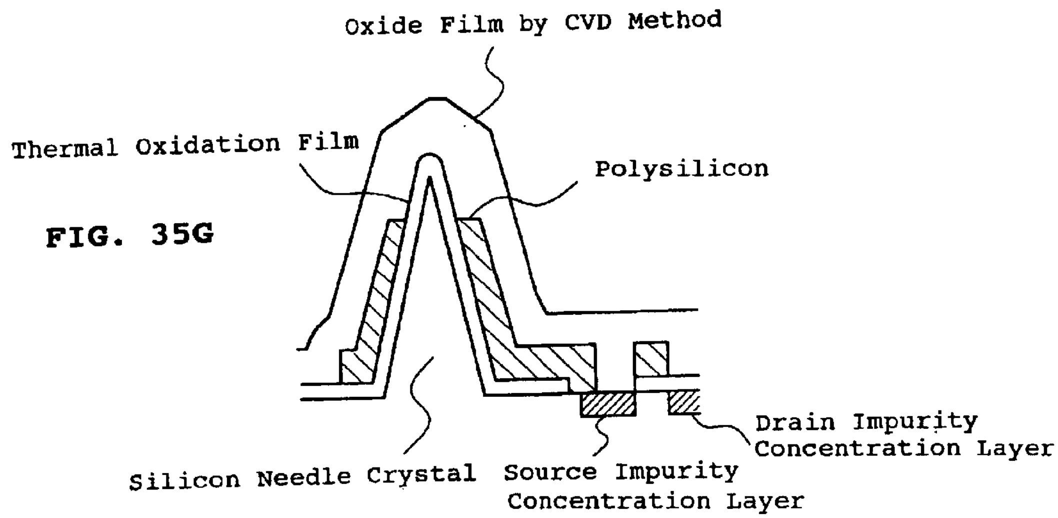
Figure 35H:
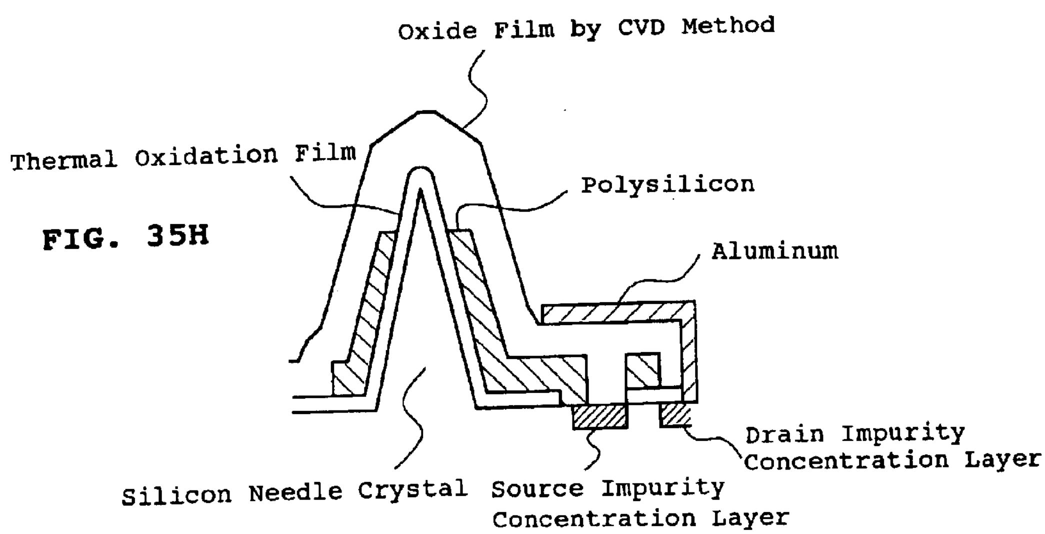

FIG. 35G shows that an oxide film having boron and phosphorus doped is deposited by plasma CVD. The oxide film covers the whole region including the needle crystal and the impurity concentration layer and functions as an insulation film. FIG. 35H shows that a contact hole for taking a signal from each electrode is formed by etching. Then, aluminum is sputtered, and turning is made by photolithography and dry etching. As a result, a bit line is formed of aluminum as shown in the drawing.

As described above, the memory cell of FIGS. 33A and 33B, namely a memory cell which has the capacitor formed on the silicon needle crystal and the transistor connected next to the capacitor, is formed. This embodiment has an advantage that the process is relatively simple.

Embodiment 9

Embodiment 9 of the present invention will be described with reference to FIGS. 36A and 36B. Embodiment 9 features that the capacitor 310 is formed on the side face of the silicon crystal needle, and the switching transistor is additionally formed on a part of the needle. Specifically, both the capacitor and the switching transistor are formed on the silicon needle crystal, so that the memory is further integrated.

Figure 36A:
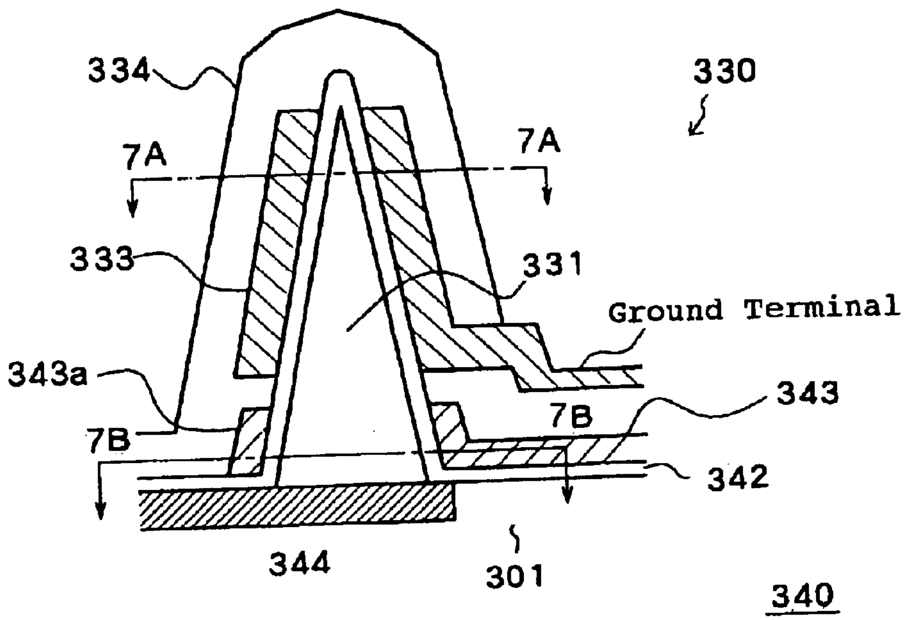
FIGS. 36A, 36B and 36C show a structure of a memory cell according to Embodiment 9 of the present invention.
Figure 36B:
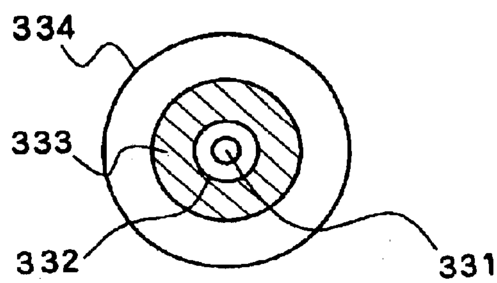
Figure 36C:
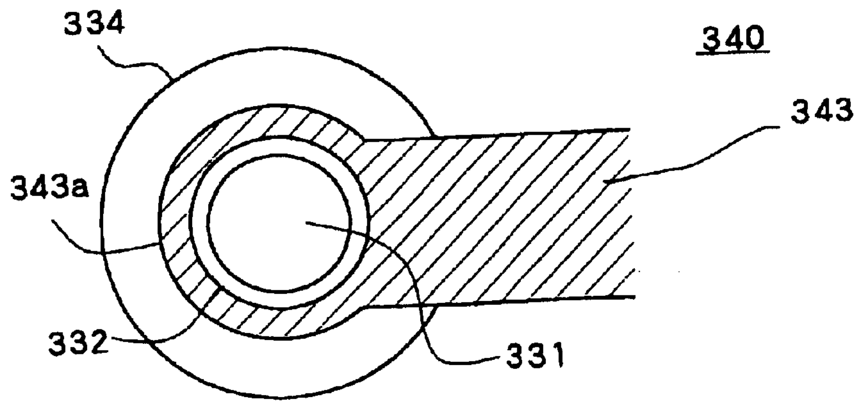

FIG. 36A is a front sectional diagram of the memory cell, FIG. 36B is a sectional diagram taken along line 7A-7A of FIG. 36A, and FIG. 36C is a sectional diagram taken along line 7B-7B of FIG. 36A. As shown in the drawings, the capacitor 330 is formed on the side face of the silicon crystal needle 331. The switching transistor 340 is formed at the base (root, bottom, base end or substrate side end) of the needle 331 so to be adjacent to the capacitor. The capacitor 330 and the transistor 340 are separated by the insulation film 334.

First, a structure of the capacitor 330 will be described. The cone-type needle projection 331 is protruded from the silicon substrate 301 in the same way as in FIGS. 33A and 33B. The needle projection functions as the capacitor electrode on the ground side in FIGS. 33A and 33B, but the needle projection 331 of this embodiment functions as the capacitor electrode on the switch side. The needle projection 331 is covered with the insulation film 332 of the thermal oxidation film, and this insulation film 332 also covers the flat portion of the silicon substrate 301. The ground side capacitor electrode 333 (outside electrode), which is another electrode of the capacitor, covers the needle projection 331 through the electrode insulation film 332. The ground side capacitor electrode 333 is connected to the ground terminal. Preferably, the capacitor electrode 333 is polysilicon having conductivity. The outside of the capacitor electrode 333 is further covered with the insulation film 334.

Different from FIGS. 33A and 33B, the bottom end of the capacitor electrode 333 is positioned at an appropriate height halfway up the needle 331. Namely, the capacitor 330 is formed on the sidewall of the needle 331 at a position higher than its intermediate portion excepting the base (bottom) of the needle 331.

Meanwhile, for the switching transistor 340, a gate electrode 343*a* surrounds the bottom of the needle projection 331. The insulation film 332 is positioned between the gate electrode 343*a* and the needle projection 331. The word line 343 is horizontally extended from the gate electrode 343*a* and formed on the insulation film 332 on the flat portion of the substrate. The gate electrode 343*a* and the word line 343 are integrally formed polysilicon layers having conductivity. The bit line 344 of the transistor 340 is formed on the underside of the needle projection 331. The bit line 344 is an n-type impurity concentration layer formed in the silicon substrate 301 and expanded horizontally along the surface of the substrate.

Thus, the transistor 340 in this embodiment is MOSFET which has as the gate electrode the polysilicon layer formed around the base (bottom) of the silicon needle crystal 331. The channel is formed on the boundary with the thermal oxidation film around the base of the needle crystal. When a signal is given to the word line, the channel is turned on, and electrons flow from the bit line to the needle crystal.

A desired capacitor capacitance is also secured in this embodiment by using the same needle crystal of an appropriate shape as in FIGS. 33A and 33B. Compared with FIGS. 33A and 33B, this embodiment has more manufacturing steps. However, the occupation area of the memory cell can be decreased, and DRAM can be integrated highly because the capacitor and the switching transistor are formed on the silicon needle crystal. The occupation area of the silicon needle crystal corresponds substantially to the occupation area of the memory cell. Therefore, a memory cell having a small size of about 0.3 μm×0.3 μm can be produced. Thus, G-bit class DRAMs can be realized.

It is to be understood that this embodiment can be modified as desired without departing from the scope of the present invention. Specifically, any structure may be adopted if the transistor is formed at the base of the needle crystal and the capacitor is formed at its leading end.

Figure 37A:
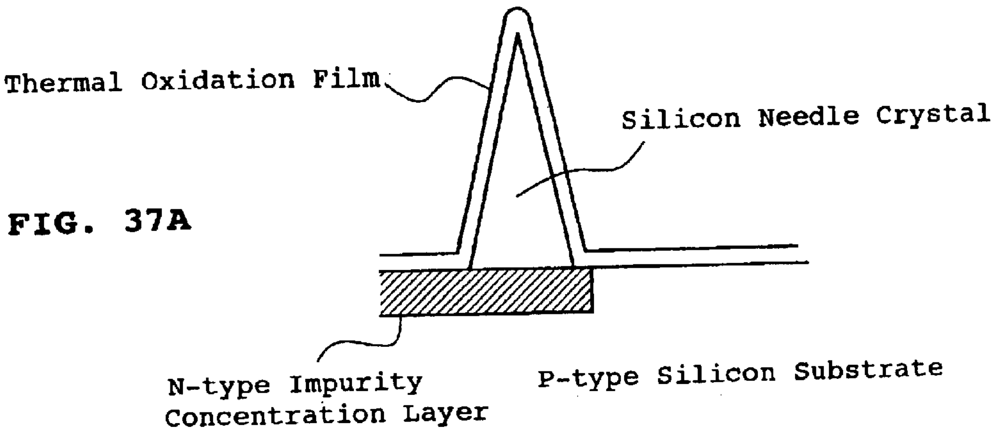
FIGS. 37A, 37B, 37C, 37D, 37E, 37F, 37G, 37H and 37I show a process of forming the memory cell of FIGS. 36A, 36B and 36C.

One example method for manufacturing a DRAM of this embodiment will be described with reference to FIGS. 37A to 37I. First, a cone-shaped silicon needle crystal is formed to protrude from a p-type silicon substrate as shown in FIG. 37A. This needle crystal can be formed on the principle shown in FIG. 2 (see Embodiment 1 and the like). An n-type impurity concentration layer is next formed by implanting phosphorus ions to a depth of the bottom of the needle crystal. The n-type impurity concentration layer starts from the lower part of the silicon needle crystal and extends in the horizontal direction along the surface of the silicon substrate. This portion functions later as the bit line. Furthermore, the thermal oxidation film is formed to fully cover the flat portion of the silicon substrate and the silicon needle crystal.

Figure 37B:
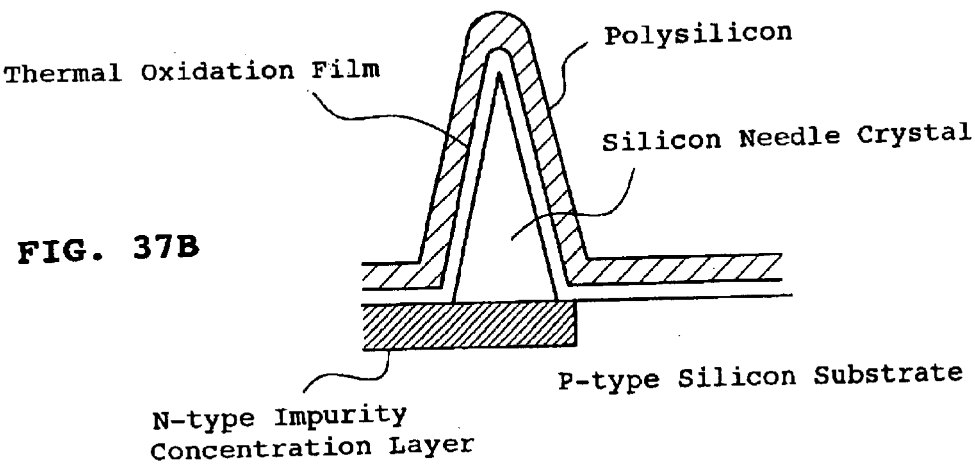
Figure 37C:
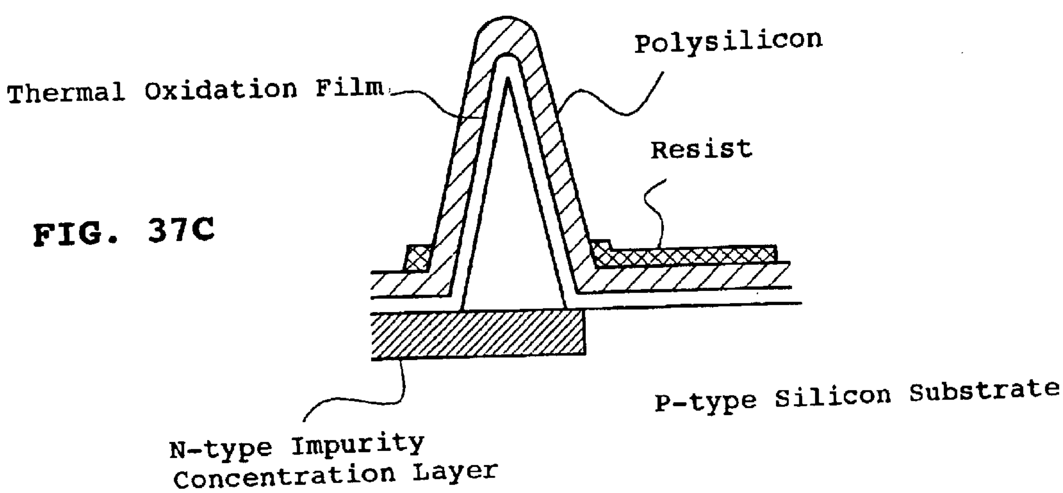

FIG. 37B shows that polysilicon is deposited on the thermal oxidation film by a low pressure CVD method. Next, phosphorous is dispersed into the polysilicon to a high concentration of about $10^{21}$ $cm^{-3}$ so to give sufficient conductivity. FIG. 37C shows that a resist is applied, and the resist is removed by photolithography. Regions where the resist is remained are limited to the gate electrode (the base and its vicinity of the needle crystal) and a region corresponding to the word line extended from the gate electrode.

Figure 37D:
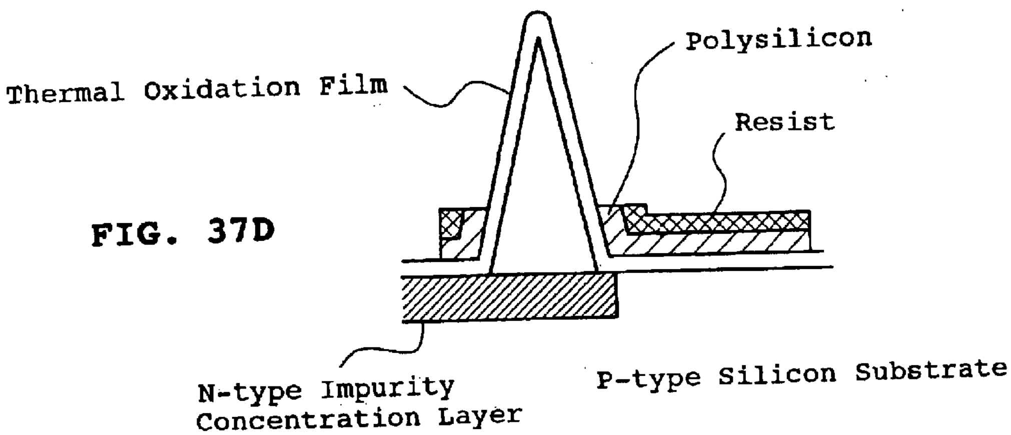
Figure 37E:
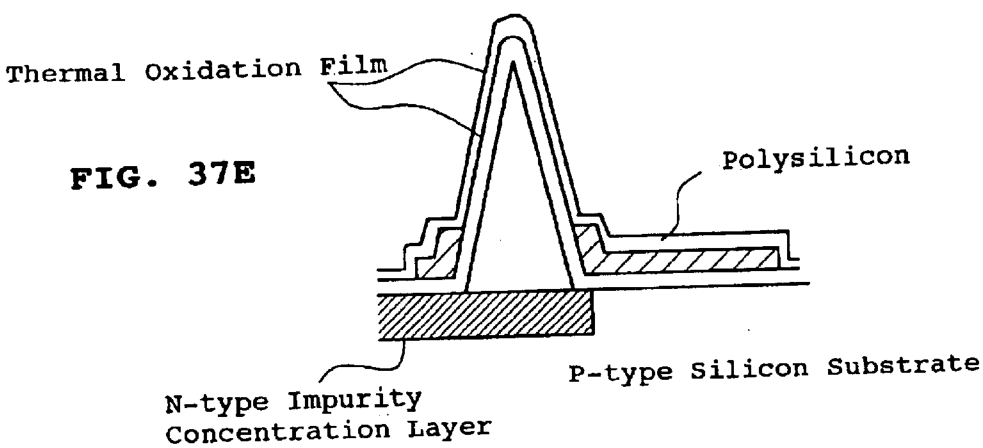
Figure 37F:
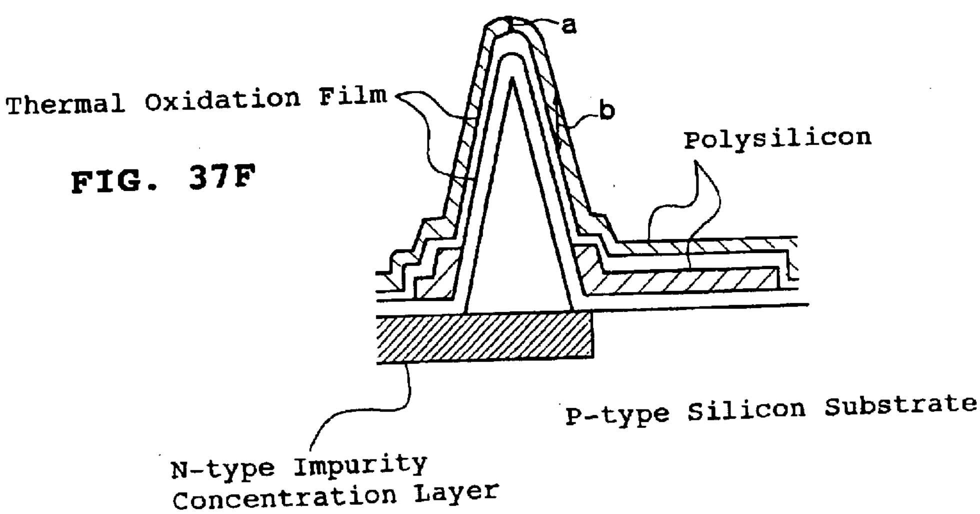

FIG. 37D shows that the polysilicon layer is removed by dry etching. Thus, the word line and the gate electrode of the switching transistor are patterned. FIG. 37E shows that the thermal oxidation film is formed by the thermal oxidation treatment. The thermal oxidation film is formed on the patterned polysilicon and also formed from the center of the needle crystal to the upper portion (portion not covered with the polysilicon film). Then, as shown in FIG. 37F, polysilicon is deposited by a low pressure CVD method. And, phosphorous is dispersed into the polysilicon to a high concentration of about $10^{21}$ $cm^{-3}$, thereby giving sufficient conductivity.

Figure 37G:
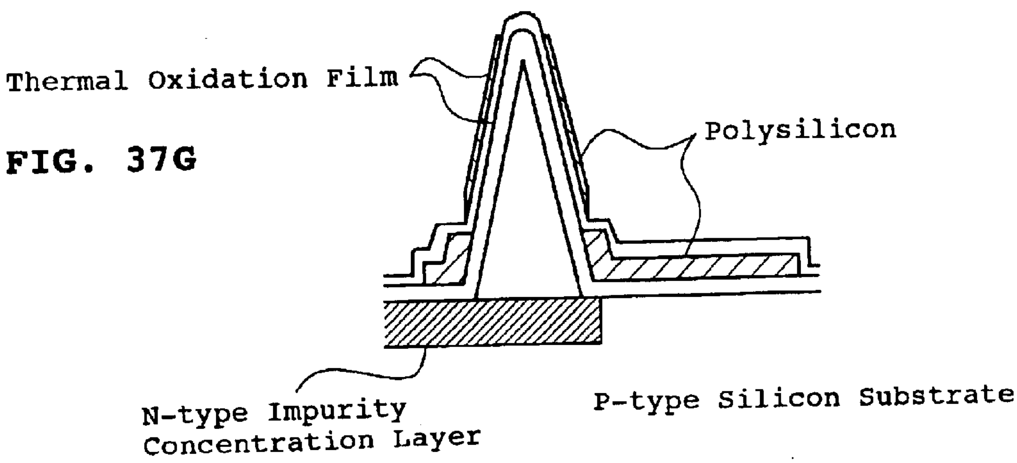

Next, dry etching is performed in the state as shown in FIG. 37F. In this case, a vertical thickness [a] at the leading end of the crystal is sufficiently small as compared with a vertical thickness [b] of the sidewall of the needle crystal. The polysilicon layer surrounding the needle crystal (the flat portion of the substrate) has a sufficiently small vertical thickness. Therefore, by determining an appropriate dry etching condition based on the difference in thickness, the polysilicon can be removed thoroughly while remaining it only on the sidewall of the needle crystal. The result of etching treatment is shown in FIG. 37G, and the remained polysilicon becomes a ground side capacitor electrode.

Figure 37H:
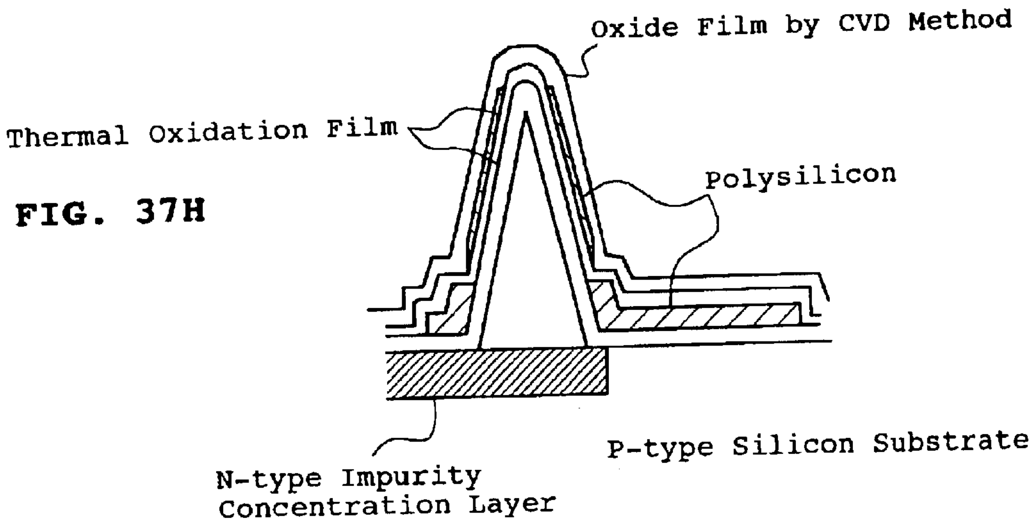
Figure 37I:
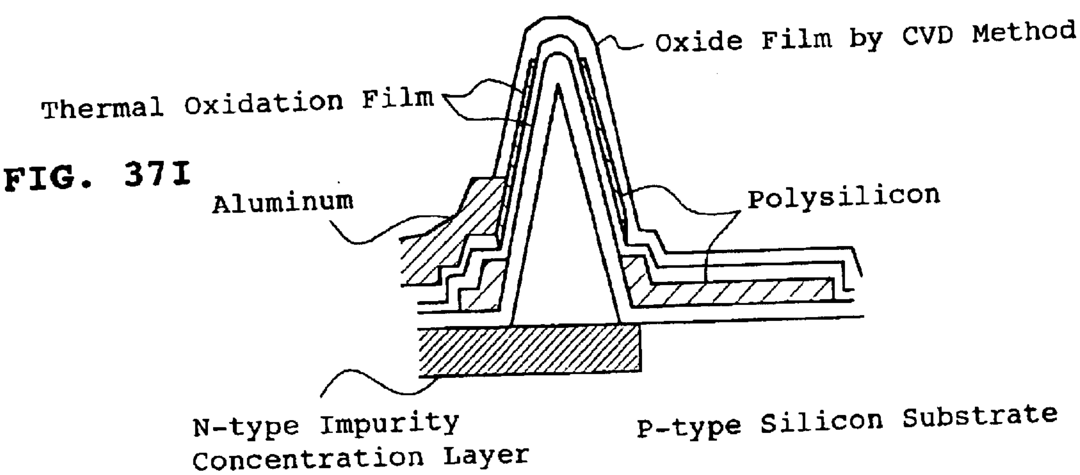

FIG. 37H shows that the oxide film is fully deposited by the CVD method. FIG. 37I shows that the oxide film formed by the CVD method is dry etched to form a contact. The contact is formed to have a depth to reach the bottom end of the polysilicon for the capacitor electrode. Aluminum wiring is formed to be connected to the polysilicon through the contact, and the aluminum wiring is grounded. As a result, wiring for grounding the outside electrode of the capacitor is formed. The arrangement of the grounding aluminum wiring is different between FIG. 37F and FIGS. 36A, 36B and 36C, but this wiring can be modified appropriately.

Thus, the memory cell shown in FIGS. 36A, 36B and 36C, which has the switching transistor formed at the base of the silicon needle crystal and the capacitor formed at its leading end, is formed.

Embodiment 10

Now, Embodiment 10 of the present invention will be described with reference to FIGS. 38A, 38B and 38C. In the same way as in the aforesaid embodiment, both a capacitor 350 and a switching transistor 360 are formed on a silicon crystal needle 351 in this embodiment. However, Embodiment 10 has a feature that the switching transistor 360 is formed at the leading end of the needle crystal 351, and the capacitor 350 is formed on the other portion.

Figure 38A:
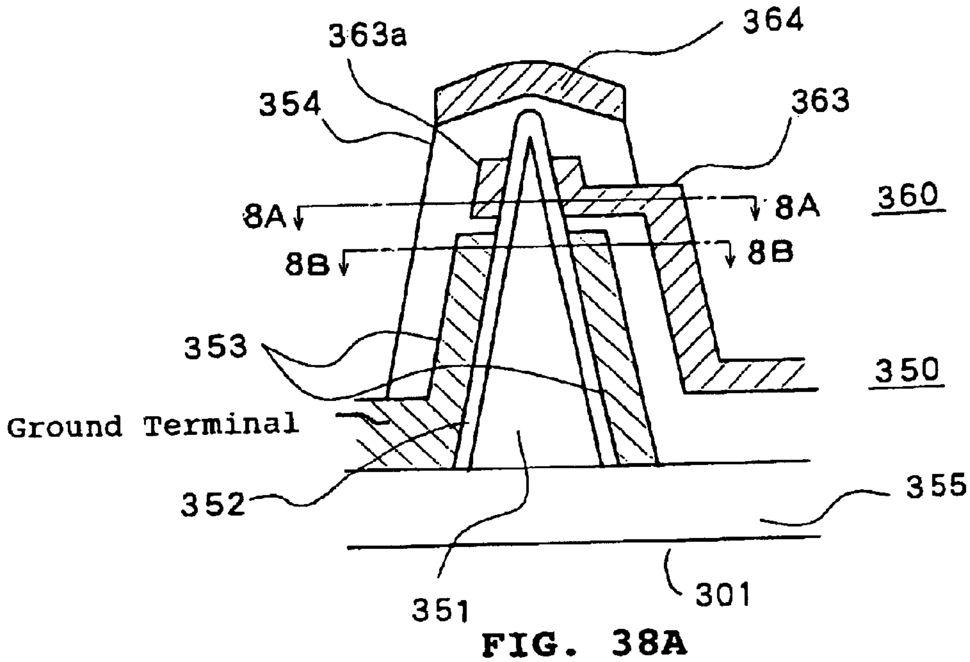
FIGS. 38A, 38B and 38C show a structure of a memory cell of Embodiment 10 of the present invention.
Figure 38B:
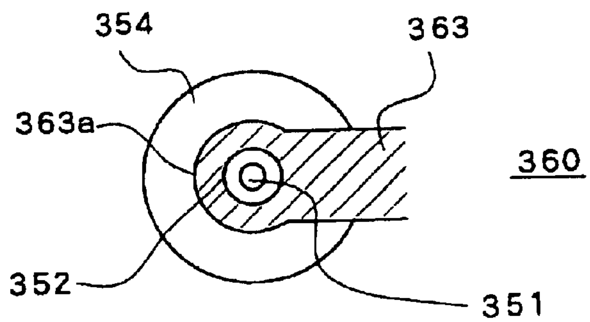
Figure 38C:
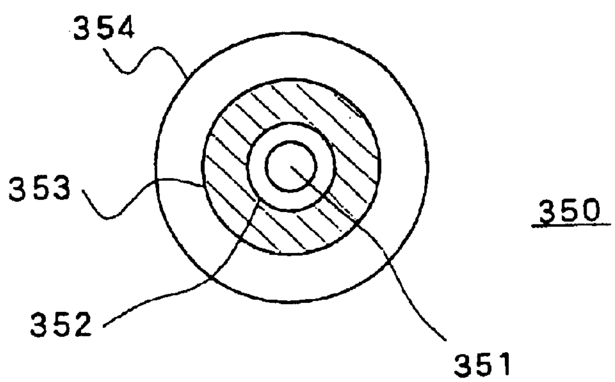

FIG. 38A is a front sectional diagram of the memory cell, FIG. 38B is a sectional diagram taken along line 8A—8A of FIG. 38A, and FIG. 38C is a sectional diagram taken along line 8B—8B of FIG. 38A.

First, a structure of the capacitor 350 will be described. An embedding oxide film 355 is formed on the silicon substrate 301, and the needle 351 of silicon crystal is protruded on the oxide film 555. The needle 351 functions as the switch side capacitor electrode.

The needle 351 is covered with an insulation film 352 made of a thermal oxidation film. And, the needle 351 is covered with a ground side capacitor electrode 353 (outside electrode), which is another electrode of the capacitor, with the insulation film 352 therebetween. The bottom end of the ground side capacitor electrode 353 is horizontally expanded and connected to the ground terminal. Preferably, the capacitor electrode 353 is polysilicon having conductivity. The outside of the capacitor electrode 353 is further covered with an insulation film 354.

In this embodiment, the capacitor 350 is formed on the region excepting the leading end of the needle 351, namely on the sidewall lower than the middle portion of the needle 351. Accordingly, the top end of the range that the ground side capacitor electrode 353 is formed is at an appropriate height slightly lower than the top end of the needle 351, and the bottom end of the electrode is determined to be equal to the bottom end of the needle 351.

Next, a structure of the switching transistor 360 will be described. The vicinity of the leading end of the needle 351 is locally covered with a gate electrode 363*a*. The insulation film 352 is intervened between the gate electrode 363*a* and the needle 351. The gate electrode 363*a* and the capacitor electrode 353 below it are separated by the insulation film 354, and the gate electrode 363*a* reaches slightly below the leading end of the needle. A word line 363 is horizontally expanded from the gate electrode 363*a*. Preferably, the gate electrode 363*a* and the word line 363 are integrally formed polysilicon layers having conductivity.

A bit line 364 of the transistor 360 is formed above the leading end of the needle 351. Since the bit line 364 is formed on the insulation film 354, the insulation film 352 and the insulation film 354 are intervened between the bit line 364 and the leading end of the needle 351. But, the insulation film 354 is formed thin at the pertinent portion as shown in the drawings.

Thus, the gate electrode is formed around the vicinity of the leading end of the needle crystal, and the bit line is formed above the needle crystal. And, they provide the function of the switching transistor 360. The channel of the transistor is formed on the surface with the thermal oxidation film in the vicinity of the leading end of the needle crystal. When a signal is given to the word line, the channel is turned on, and electrons are flown from the bit line to the needle crystal.

Then, the leading end of the needle crystal is very thin having a size of the order of nanometers, so that a high electric field is caused at the leading end, resulting in breaking the thermal oxidation film. The breakage of the oxide film secures the contact between the bit line aluminum and the needle crystal.

The memory cell of this embodiment is as described above. Similar to the aforesaid embodiment, this embodiment forms both the capacitor and the transistor on the silicon needle crystal, so that a DRAM can be highly integrated. The occupation area of the memory cell substantially corresponds to the occupation area of the needle crystal. When the leading end of the needle crystal is made to have a size of several nanometers, the occupation area of the memory cell is about 0.3 μm×0.3 μm, and a G-bit class DRAM can be achieved.

Furthermore, the leading end of the needle crystal in this embodiment is used for the switching transistor and has a very small region of the order of nanometers. Therefore, when the supply bias is reduced, it can be functioned as a single electron transistor which has the leading end of the crystal as a so-called quantum dot. Power consumption can be reduced by having the single electron transistor.

It is to be understood that this embodiment can be modified as desired without departing from the scope of the present invention. Specifically, another structure may be adopted if the transistor is formed at the leading end of the needle crystal and the capacitor is formed below it. For example, separation of a p-n junction, which uses a silicon substrate having a p-type impurity doped (the needle crystal portion is an n-type impurity concentration layer) instead of the embedding oxide film 355 of FIGS. 38A, 38B and 38C, may be adopted.

Figure 39A:
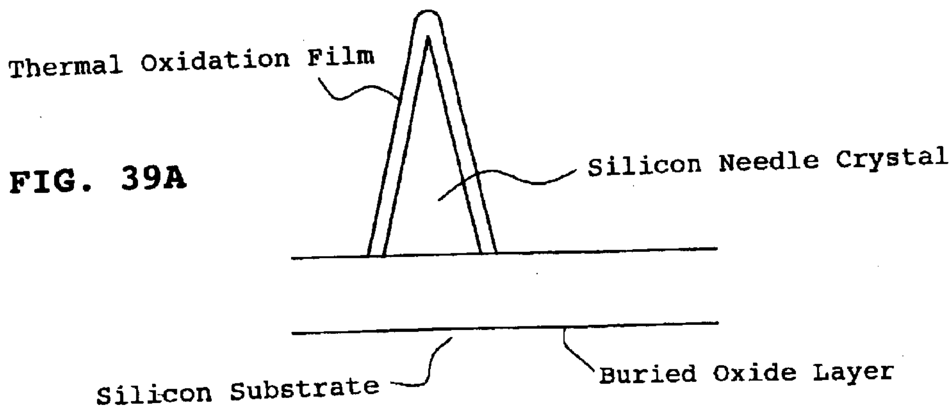
FIGS. 39A, 39B, 39C, 39D, 39E, 39F, 39G, 39H and 39I show a process of forming the memory cell of FIGS. 38A, 38B and 38C.

Next, a method of manufacturing DRAM of Embodiment 10 will be described with reference to FIGS. 39A to 39I. First, SOI (silicon on insulator) is prepared, and a silicon needle crystal is formed in a single crystal layer on a buried layer of the SOI substrate as shown in FIG. 39A. The needle crystal is formed on the principle of FIG. 2 (see Embodiment 1 and the like). Then, the silicon needle crystal is oxidized by thermal oxidation.

Figure 39B:
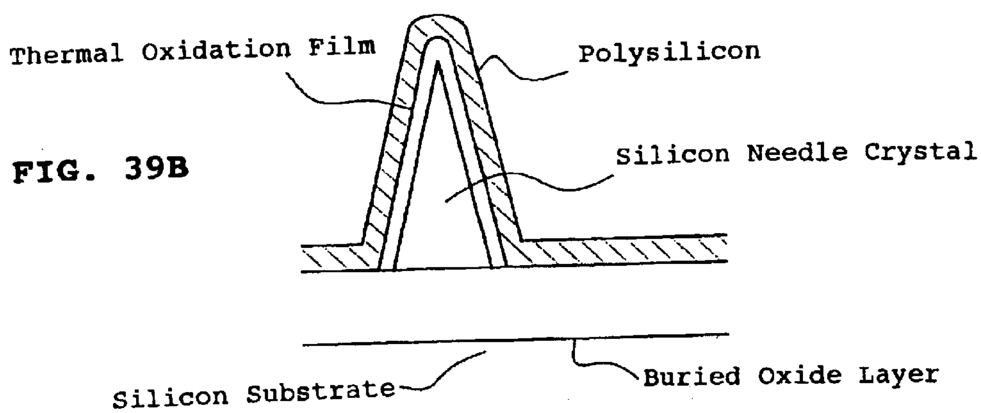
Figure 39C:
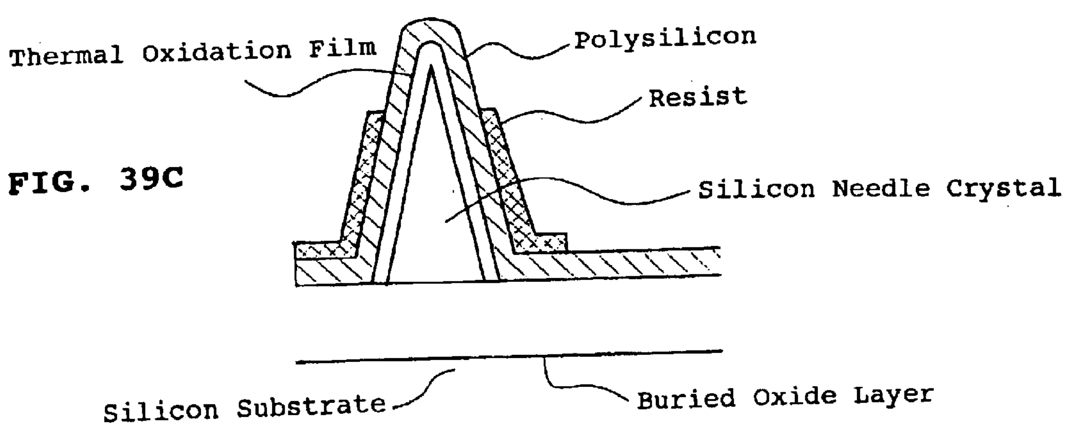

FIG. 39B shows that polysilicon is deposited by a decomposition CVD method, phosphorous is dispersed into the polysilicon to have a high concentration of about $10^{21}$ $cm^{-3}$, thereby providing conductivity. FIG. 39C shows that a resist is applied, and photolithography is performed. Regions where the resist is remained are limited to a region excluding the leading end of the silicon needle crystal and a region corresponding to a grounding line on the flat portion.

Figure 39D:
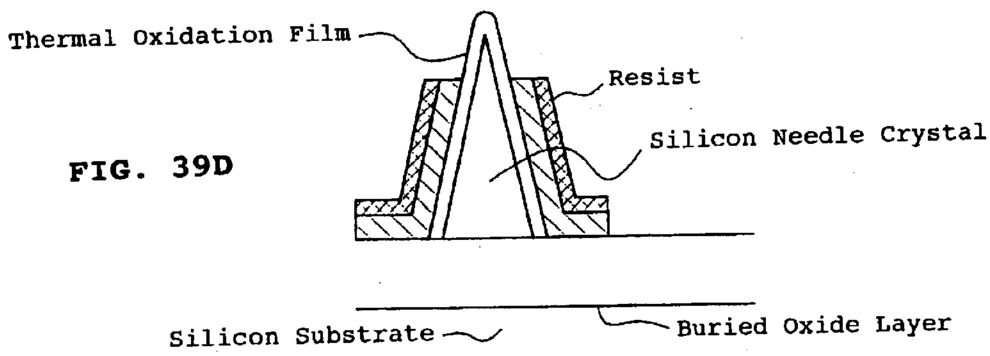
Figure 39E:
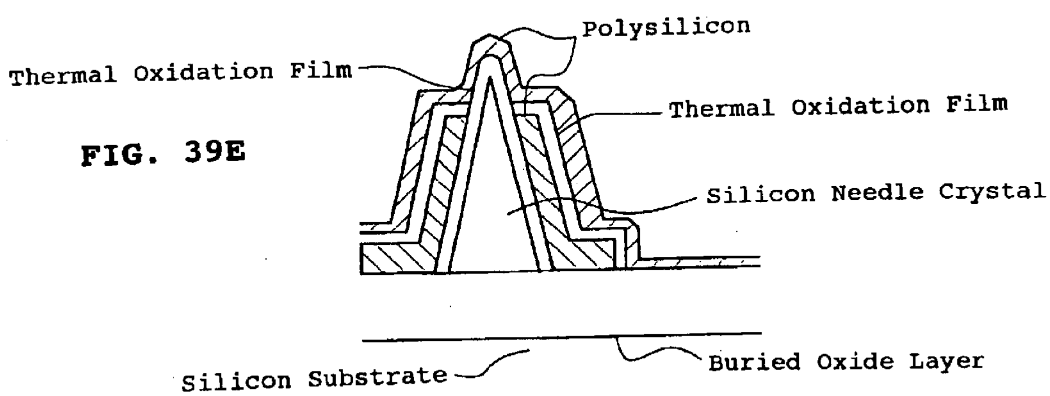

Dry etching is performed from the state shown in FIG. 39C. The conductive polysilicon is remained in a region from the bottom end to an appropriate height of the needle crystal (excepting the leading end) and a horizontally expanded connecting portion as shown in FIG. 39D. Namely, one of the electrode regions of the capacitor is patterned. FIG. 39E shows that thermal oxidation is performed after removing the resist. The thermal oxidation film is formed on the patterned polysilicon. Next, polysilicon is further deposited by a decomposition CVD method, and phosphorous is dispersed into the polysilicon to have a high concentration of about $10^{21}$ $cm^{-3}$, thereby giving conductivity.

Figure 39F:
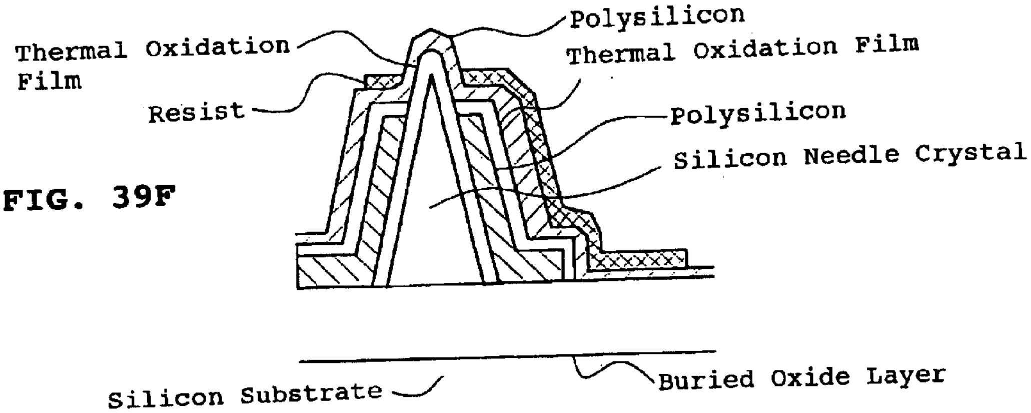
Figure 39G:
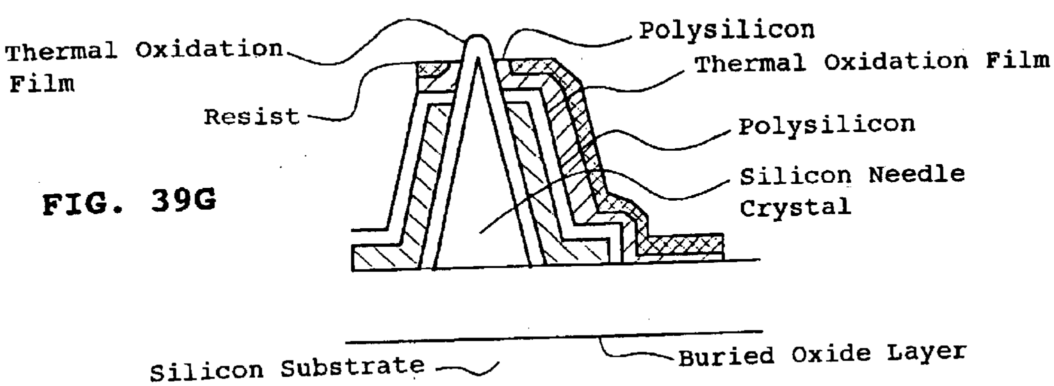

FIGS. 39F and 39G show how a gate electrode and a word line of the switching transistor are next formed. FIG. 39F shows that a resist is applied, and photolithography is performed. The resist is remained at the gate electrode around the leading end of the needle crystal and the word line extended therefrom, after which dry etching is performed to remove the polysilicon excepting the portions of the gate electrode and the word line as shown in FIG. 39G.

Figure 39H:
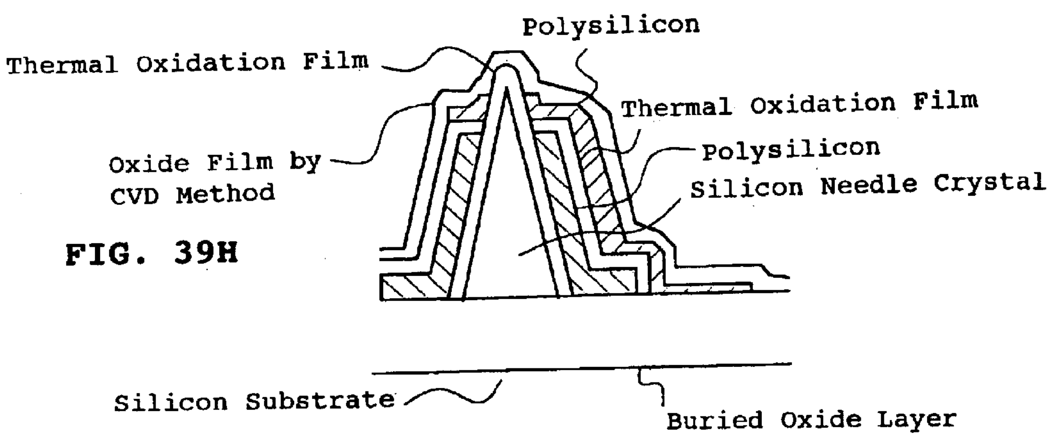
Figure 39I:
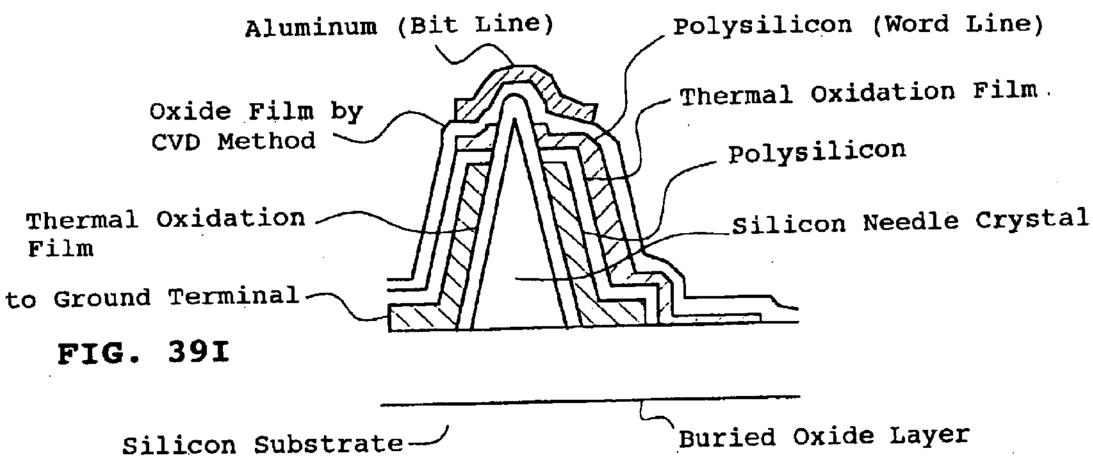

FIG. 39H shows that an oxide film is deposited by CVD method after removing the resist. The oxide film is thoroughly formed and functions as an insulation film. FIG. 39I shows that aluminum wiring is formed at the leading end of the silicon needle crystal This aluminum wiring functions as the bit line as described above.

As described above, the memory cell of FIGS. 38A, 38B and 38C, namely the memory cell having the switching transistor formed at the leading end of the silicon needle crystal and the capacitor formed below it, is formed.

It is to be noted that the manufacturing processes described in Embodiments 8, 9 and 10 are only examples, and another process may be used. Also, the manufacturing process may be changed as required depending on a change in the memory call without departing from the scope of the present invention.

What is claimed is:

1. A method for forming a conic body, comprising:

performing high selectivity anisotropic etching of a substrate or predetermined layer with a mixture gas by using as a micro mask an impurity precipitation defect caused by a first impurity included in the substrate or predetermined layer;

allowing a conic body to be exposed from a surface of the substrate or layer, the conic body being formed with the impurity precipitation defect located at its top; and adjusting the ratio of the mixture gas during the high selectivity anisotropic etching to thereby adjust the aspect ratio of the conic body.

2. A method as defined in claim 1, wherein

The substrate or the predetermined layer is a semiconductor material substrate or a semiconductor material layer.

3. A method as defined in claim 2, wherein the impurity precipitation defect has an etching rate different from that of a main component material of the semiconductor material substrate or layer; and the impurity precipitation defect is a defect formed by precipitation of the first impurity included in the semiconductor material substrate or layer into a crystal of the semiconductor material substrate or layer as a result of a thermal treatment performed during or after manufacturing of the semiconductor material substrate or layer.

4. A method as defined in claim 2, wherein the semiconductor material substrate or layer comprises silicon; and the first impurity is oxygen.

5. A method as defined in claim 2, wherein the conic body is formed in an etching exposure surface of the semiconductor material substrate or layer so as to have a height in accordance with a distance from a location of the impurity precipitation defect to the etching exposure surface.

6. A method as defined in claim 2, wherein when a plurality of impurity precipitation defects are present, the high selectivity anisotropic etching is performed to form, in an etching exposure surface of the semiconductor material substrate or layer, the conic bodies having substantially similar shapes each having the impurity precipitation defect located at the top and having a height in accordance with a distance from a location of the impurity precipitation defect to the etching exposure surface.

7. A method as defined in claim 6, wherein the conic body is formed in an etching exposure surface has a top end size in accordance with a size of the impurity precipitation defect, and an aspect ratio of about 10 or more.

8. A method as defined in claim 1, wherein a diameter of the conic body near its top end is 10 nm to 30 nm.

9. A method for forming a conic body, comprising:

performing high selectivity anisotropic etching of a substrate or predetermined layer by using as a micro mask an impurity precipitation defect caused by a first impurity included in the substrate or predetermined layer; and allowing a conic body to be exposed from a surface of the substrate or layer, the conic body being formed with the impurity precipitation defect located at its top;

wherein the substrate or the predetermined layer is a semiconductor material substrate or a semiconductor material layer; and wherein the semiconductor material substrate or layer further comprises a second impurity which more readily bonds to said first impurity than to a material of the semiconductor material substrate or layer.

10. A method as defined in claim 9, wherein the semiconductor material substrate or layer comprises silicon;

the first impurity is oxygen; and the second impurity is boron.

11. A method for forming a truncated conic body, comprising:

performing high selectivity anisotropic etching of a substrate or predetermined layer by using a micro mask an impurity precipitation defect caused by a first impurity included in the substrate or predetermined layer; and allowing a truncated conic body to be exposed from a surface of the substrate or layer, the truncated conic body being formed with the impurity precipitation defect located at its top.

12. A method as defined in claim 11, wherein the substrate or the predetermined layer is a semiconductor material substrate or a semiconductor material layer.

13. A method as defined in claim 12, wherein the impurity precipitation defect has an etching rate different from that of a main component material of the semiconductor material substrate or layer; and the impurity precipitation defect is a defect formed by precipitation of the fast impurity included in the semiconductor material substrate or layer into crystal of the semiconductor material substrate or layer as a result of a thermal treatment preformed during or after manufacturing of the semiconductor material or layer.

14. A method as defined in claim 12, wherein the semiconductor material substrate or layer comprises silicon; and the first impurity is oxygen.

15. A method as defined in claim 12, wherein the semiconductor material substrate or layer comprises a second impurity which more readily bonds to a first impurity than to a material of the semiconductor material substrate or layer.

16. A method as defined in claim 15, wherein the semiconductor material substrate or layer silicon; the first impurity is oxygen; and the second impurity is boron.

17. A method as defined in claim 12, wherein the truncated conic body is formed in an etching exposure surface of the semiconductor material substrate or layer so as to have a height in accordance with a distance from a location of the impurity precipitation defect to the etching exposure surface.

18. A method as defined in claim 12, wherein when a plurality of impurity precipitation defects are present, the high selectivity anisotropic etching is performed to form, in an etching exposure surface of the semiconductor material substrate or layer, the truncated conic bodies having substantially similar shapes each having the impurity precipitation defect located at its top and having a height in accordance with a distance from a location of the impurity precipitation defect to the etching exposure surface.

19. A method as defined in claim 12, wherein after forming the truncated conic body in the substance or predetermined layer by using a micro mask the impurity precipitation defect, the high selectivity anisotropic etching is continued to remove the impurity precipitation defect and to etch a top end of the truncated conic body in a shape of a mortar from the top toward the bottom of the truncated conic body, thereby forming an annuluar shape at the top end.

20. A method as defined in claim 19, wherein the truncated conic body formed in the etching exposure surface has a top end diameter in accordance with a size of the impurity precipitation defect, and an aspect ratio of about 10 or more; and the top annular portion has a thickness of 1 nm to 2 nm.

21. A method as defined in claim 19, wherein the mortar shape formed at the top of the truncated conic body is substantially similar to the shape of the truncated conic body.

* * * * *

UNITED STATES PATENT AND TRADEMARK OFFICE

CERTIFICATE OF CORRECTION

PATENT NO. : 6,936,484 B2
DATED : August 30, 2005
INVENTOR(S) : Masakazu Kanechika et al.

It is certified that error appears in the above-identified patent and that said Letters Patent is hereby corrected as shown below:

Column 46,
Line 20, Claim 16 should read:
-- A method as defined in claim 15, wherein the semiconductor material substrate or layer comprises silicon; the first impurity is oxygen; and the second impurity is boron. --.

Signed and Sealed this

Third Day of January, 2006

JON W. DUDAS
*Director of the United States Patent and Trademark Office*